US012119353B2

(12) United States Patent
Yamazaki et al.

(10) Patent No.: US 12,119,353 B2
(45) Date of Patent: Oct. 15, 2024

(54) SEMICONDUCTOR DEVICE, ELECTRONIC COMPONENT, AND ELECTRONIC DEVICE

(71) Applicant: Semiconductor Energy Laboratory Co., Ltd., Atsugi (JP)

(72) Inventors: Shunpei Yamazaki, Setagaya (JP); Kiyoshi Kato, Atsugi (JP); Tomoaki Atsumi, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/519,294

(22) Filed: Nov. 27, 2023

(65) Prior Publication Data

US 2024/0088162 A1 Mar. 14, 2024

Related U.S. Application Data

(63) Continuation of application No. 17/400,264, filed on Aug. 12, 2021, now abandoned, which is a
(Continued)

(30) Foreign Application Priority Data

Jun. 2, 2017 (JP) ................................ 2017-110472
Jun. 23, 2017 (JP) ................................ 2017-123211
(Continued)

(51) Int. Cl.
*H01L 27/12* (2006.01)
*H01L 29/786* (2006.01)
*H10B 12/00* (2023.01)

(52) U.S. Cl.
CPC ...... *H01L 27/1225* (2013.01); *H01L 27/1255* (2013.01); *H01L 29/7869* (2013.01); *H10B 12/20* (2023.02)

(58) Field of Classification Search
CPC ........ H10B 12/00–488; H01L 29/7869–78693
See application file for complete search history.

(56) References Cited

U.S. PATENT DOCUMENTS 5,528,032 A 6/1996 Uchiyama
6,727,544 B2 4/2004 Endoh et al.
(Continued)

FOREIGN PATENT DOCUMENTS

CN 102214660 A 10/2011
DE 112018002779 4/2020
(Continued)

OTHER PUBLICATIONS

International Search Report (Application No. PCT/IB2018/053722) Dated Aug. 21, 2018.
(Continued)

*Primary Examiner* — Amar Movva
(74) *Attorney, Agent, or Firm* — Eric J. Robinson; Robinson Intellectual Property Law Office, P.C.

(57) ABSTRACT

A novel semiconductor device formed with single-polarity circuits using OS transistors is provided. Thus, connection between different layers in a memory circuit is unnecessary. This can reduce the number of connection portions and improve the flexibility of circuit layout and the reliability of the OS transistors. In particular, many memory cells are provided; thus, the memory cells are formed with single-polarity circuits, whereby the number of connection portions can be significantly reduced. Further, by providing a driver circuit in the same layer as the cell array, many wirings for connecting the driver circuit and the cell array can be prevented from being provided between layers, and the number of connection portions can be further reduced. An interposer provided with a plurality of integrated circuits can function as one electronic component.

5 Claims, 33 Drawing Sheets

Related U.S. Application Data continuation of application No. 16/616,707, filed as application No. PCT/IB2018/053722 on May 25, 2018, now Pat. No. 11,114,470.

(30) Foreign Application Priority Data

Nov. 17, 2017 (JP) ................................ 2017-221517
Feb. 20, 2018 (JP) ................................ 2018-027614
Feb. 20, 2018 (JP) ................................ 2018-027730

(56) References Cited

U.S. PATENT DOCUMENTS 8,187,936 B2 5/2012 Alsmeier et al.
8,193,054 B2 6/2012 Alsmeier
8,198,672 B2 6/2012 Alsmeier
8,222,092 B2 7/2012 Yamazaki et al.
8,238,152 B2 8/2012 Asami et al.
8,283,228 B2 10/2012 Alsmeier
8,319,267 B2 11/2012 Kato et al.
8,330,208 B2 12/2012 Alsmeier et al.
8,349,681 B2 1/2013 Alsmeier et al.
8,372,720 B2 2/2013 Fukuzumi et al.
8,409,977 B2 4/2013 Shim et al.
8,421,068 B2 4/2013 Yamazaki et al.
8,421,069 B2 4/2013 Yamazaki et al.
8,450,791 B2 5/2013 Alsmeier
8,461,000 B2 6/2013 Alsmeier et al.
8,461,641 B2 6/2013 Alsmeier et al.
8,580,639 B2 11/2013 Alsmeier et al.
8,614,916 B2 12/2013 Nagatsuka et al.
8,709,889 B2 4/2014 Saito
8,729,624 B2 5/2014 Fukuzumi. et al.
8,765,543 B2 7/2014 Alsmeier et al.
8,803,142 B2 8/2014 Yamazaki et al.
8,809,927 B2 8/2014 Takemura
8,829,591 B2 9/2014 Alsmeier
8,860,108 B2 10/2014 Yamazaki et al.
8,896,049 B2 11/2014 Isobe et al.
8,901,553 B2 12/2014 Inoue et al.
8,902,663 B1 12/2014 Or-Bach et al.
8,928,061 B2 1/2015 Chien et al.
8,946,810 B2 2/2015 Alsmeier
9,007,093 B2 4/2015 Kurokawa et al.
9,029,929 B2 5/2015 Saito
9,035,374 B2 5/2015 Fukuzumi et al.
9,117,749 B1 8/2015 Or-Bach et al.
9,117,923 B2 8/2015 Shim et al.
9,136,390 B2 9/2015 Yamazaki et al.
9,159,739 B2 10/2015 Makala et al.
9,165,940 B2 10/2015 Chien et al.
9,230,976 B2 1/2016 Alsmeier
9,257,082 B2 2/2016 Kimura et al.
9,349,844 B2 5/2016 Inoue et al.
9,356,042 B2 5/2016 Fukuzumi. et al.
9,356,601 B2 5/2016 Kurokawa et al.
9,362,302 B1 6/2016 Lai
9,406,694 B1 8/2016 Ikeno et al.
9,455,280 B2 9/2016 Yamazaki et al.
9,634,097 B2 4/2017 Rabkin et al.
9,680,476 B2 6/2017 Kurokawa et al.
9,711,651 B2 7/2017 Yamazaki et al.
9,773,820 B2 9/2017 Okazaki et al.
9,793,124 B2 10/2017 Hopkins
9,806,099 B2 10/2017 Yamazaki et al.
9,817,032 B2 11/2017 Takahashi et al.
9,887,212 B2 2/2018 Kimura et al.
10,090,318 B2 10/2018 Zhu et al.
10,236,305 B2 3/2019 Yamazaki et al.
10,304,864 B2 5/2019 Okazaki et al.
10,424,671 B2 9/2019 Yamazaki et al.
10,446,584 B2 10/2019 Yamazaki et al.
10,644,039 B2 5/2020 Okazaki et al.
10,700,099 B2 6/2020 Yamazaki et al.
11,114,470 B2 9/2021 Yamazaki et al.
11,211,408 B2 12/2021 Okazaki et al.
11,616,085 B2 3/2023 Okazaki et al.
11,901,372 B2 2/2024 Okazaki et al.
2007/0133358 A1 6/2007 Kubo et al.
2008/0149913 A1 6/2008 Tanaka et al.
2008/0239799 A1 10/2008 Watanabe
2009/0027955 A1 1/2009 Koh et al.
2009/0034123 A1 2/2009 Aoki et al.
2010/0052042 A1 3/2010 Tanaka et al.
2010/0142091 A1 6/2010 Tsukamoto et al.
2010/0142261 A1 6/2010 Kubo et al.
2010/0142262 A1 6/2010 Tsukamoto et al.
2010/0182828 A1 7/2010 Shima et al.
2010/0259960 A1 10/2010 Samachisa
2010/0296338 A1 11/2010 Park et al.
2011/0006277 A1 1/2011 Kubo et al.
2011/0026294 A1 2/2011 Tsukamoto et al.
2011/0031467 A1 2/2011 Kubo et al.
2011/0065270 A1 3/2011 Shim et al.
2011/0068319 A1 3/2011 Tsukamoto et al.
2011/0089417 A1 4/2011 Yamazaki et al.
2011/0090204 A1 4/2011 Yamazaki et al.
2011/0101332 A1 5/2011 Yamazaki et al.
2011/0101351 A1 5/2011 Yamazaki
2011/0122676 A1 5/2011 Murooka et al.
2011/0140070 A1 6/2011 Kim
2011/0210328 A1 9/2011 Yamazaki et al.
2011/0212571 A1 9/2011 Yamazaki et al.
2011/0215318 A1 9/2011 Yamazaki et al.
2011/0216575 A1 9/2011 Yamaguchi et al.
2011/0216582 A1 9/2011 Tsukamoto et al.
2011/0233648 A1 9/2011 Seol et al.
2011/0235408 A1 9/2011 Minemura et al.
2011/0273927 A1 11/2011 Hanzawa et al.
2012/0001243 A1 1/2012 Kato
2012/0008369 A1 1/2012 Shimuta et al.
2012/0087178 A1 4/2012 Watanabe et al.
2012/0119287 A1 5/2012 Park et al.
2012/0188814 A1 7/2012 Yamazaki et al.
2012/0193697 A1 8/2012 Takemura
2012/0213000 A1 8/2012 Takemura
2012/0261722 A1 10/2012 Tang et al.
2012/0268980 A1 10/2012 Awaya et al.
2012/0287697 A1 11/2012 Hanzawa et al.
2012/0319114 A1 12/2012 Yamazaki et al.
2013/0075684 A1 3/2013 Kinoshita et al.
2013/0128651 A1 5/2013 Kubo
2013/0141968 A1 6/2013 Sasago et al.
2013/0221356 A1 8/2013 Yamazaki et al.
2013/0228739 A1 9/2013 Sasago et al.
2013/0258752 A1 10/2013 Park
2013/0334593 A1 12/2013 Seol et al.
2013/0341618 A1 12/2013 Koyama
2014/0027762 A1 1/2014 Tsurume et al.
2014/0038400 A1 2/2014 Park et al.
2014/0097484 A1 4/2014 Seol et al.
2014/0187029 A1 7/2014 Seol et al.
2014/0225181 A1 8/2014 Makala et al.
2014/0268996 A1 9/2014 Park
2014/0301128 A1 10/2014 Park
2014/0321193 A1 10/2014 Park
2015/0054058 A1 2/2015 Seol et al.
2015/0179662 A1 6/2015 Makala et al.
2015/0255485 A1 9/2015 Kameoka et al.
2015/0263047 A1 9/2015 Kimura et al.
2015/0311301 A1 10/2015 Seol et al.
2015/0325586 A1 11/2015 Seol et al.
2016/0071879 A1 3/2016 Seol et al.
2016/0086958 A1 3/2016 Kozuma et al.
2016/0104720 A1 4/2016 Alsmeier
2016/0104721 A1 4/2016 Seol et al.
2016/0190330 A1 6/2016 Yamazaki
2016/0240625 A1 8/2016 Inoue et al.
2016/0247818 A1 8/2016 Seol et al.
2016/0247927 A1 8/2016 Nomura et al.
2016/0343434 A1 11/2016 Lee et al.
2016/0351243 A1 12/2016 Ishizu et al.
2017/0033111 A1 2/2017 Yamazaki et al.
2017/0040416 A1 2/2017 Ota et al.

(56) References Cited

U.S. PATENT DOCUMENTS

| | | | |
|---|---|---|---|
| 2017/0104090 | A1 | 4/2017 | Koezuka et al. |
| 2017/0236872 | A1 | 8/2017 | Kanemura et al. |
| 2017/0317215 | A1 | 11/2017 | Yamazaki et al. |
| 2019/0027493 | A1 | 1/2019 | Kimura et al. |
| 2020/0185530 | A1 | 6/2020 | Yamazaki et al. |
| 2020/0321362 | A1 | 10/2020 | Yamazaki et al. |
| 2021/0336060 | A1 | 10/2021 | Yamazaki et al. |

FOREIGN PATENT DOCUMENTS

| | | | |
|---|---|---|---|
| JP | 2012-178555 | A | 9/2012 |
| JP | 2012-248582 | A | 12/2012 |
| JP | 2012-256400 | A | 12/2012 |
| JP | 2012-256877 | A | 12/2012 |
| JP | 2014-002133 | A | 1/2014 |
| JP | 2014-007737 | A | 1/2014 |
| JP | 2014-042013 | A | 3/2014 |
| JP | 2014-199406 | A | 10/2014 |
| JP | 2015-187904 | A | 10/2015 |
| JP | 2016-072633 | A | 5/2016 |
| JP | 2016-167590 | A | 9/2016 |
| JP | 2017-034249 | A | 2/2017 |
| JP | 2017-076788 | A | 4/2017 |
| KR | 2012-0089588 | A | 8/2012 |
| KR | 2015-0107642 | A | 9/2015 |
| TW | 201234535 | | 8/2012 |
| WO | WO-2014/042102 | | 3/2014 |

OTHER PUBLICATIONS

Written Opinion (Application No. PCT/IB2018/053722) Dated Aug. 21, 2018.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10, The Japan Society of Applied Physics.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7, The Japan Society of Applied Physics.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

German Office Action (Application No. 112018002779.1) Dated Oct. 19, 2022.

Chinese Office Action (Application No. 201880034637.9) Dated Mar. 15, 2023.

German Office Action (Application No. 112018002779.1) Dated Mar. 29, 2023.

FIG. 1A1
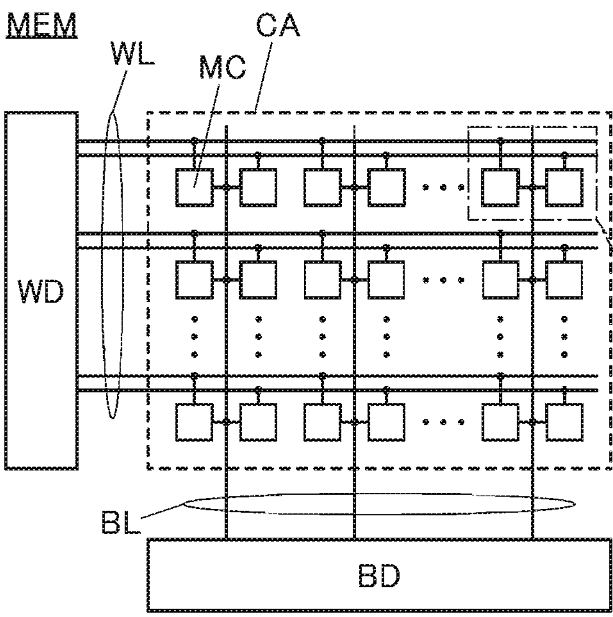
FIG. 1A2
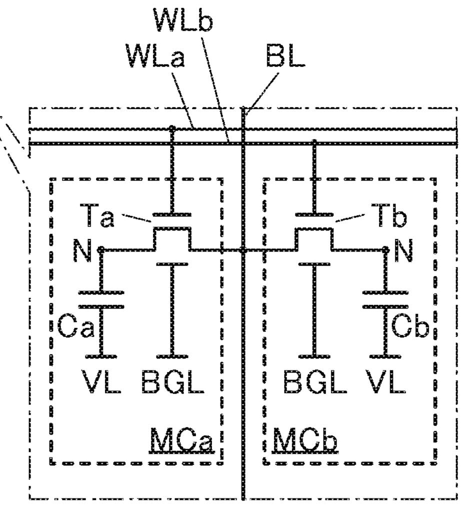
FIG. 1B
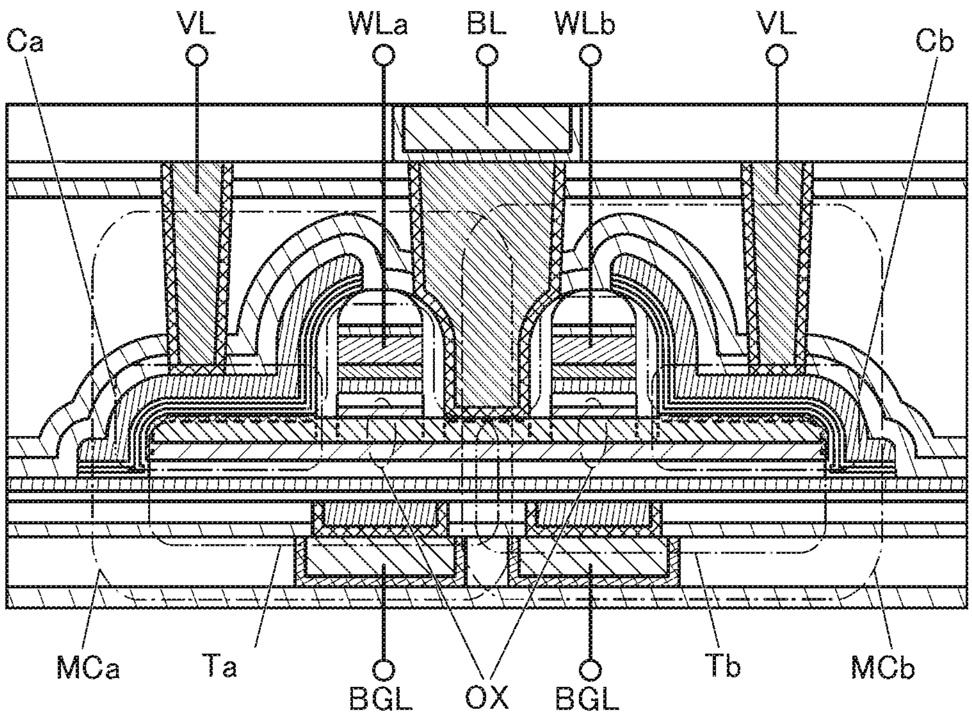

SEMICONDUCTOR DEVICE, ELECTRONIC COMPONENT, AND ELECTRONIC DEVICE

TECHNICAL FIELD

One embodiment of the present invention relates to a semiconductor device and an electronic device.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

The semiconductor device in this specification and the like means every device which can function by utilizing semiconductor characteristics. A transistor, a semiconductor circuit, an arithmetic device, a memory device, and the like are each an embodiment of the semiconductor device. In addition, a display device, an imaging device, an electro-optical device, a power generation device (including a thin film solar cell, an organic thin film solar cell, and the like), and an electronic device may include a semiconductor device.

BACKGROUND ART

Patent Document 1 describes a memory device formed with a transistor using an oxide semiconductor and a transistor using single crystal silicon. In addition, it is described that the transistor using an oxide semiconductor has an extremely low off-state current.

As oxide semiconductors, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Patent Document

[Patent Document 1] Japanese Published Patent Application No. 2012-256400

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a novel semiconductor device. Another object of one embodiment of the present invention is to provide a semiconductor device with low power consumption. Another object of one embodiment of the present invention is to provide a highly reliable semiconductor device. Another object of one embodiment of the present invention is to provide a semiconductor device having high layout flexibility. Another object of one embodiment of the present invention is to provide a semiconductor device that can be miniaturized or highly integrated. Another object of one embodiment of the present invention is to provide a novel electronic component. Another object of one embodiment of the present invention is to provide a novel electronic device.

One embodiment of the present invention does not have to achieve all the above objects and only needs to achieve at least one of the objects. The descriptions of the above objects do not preclude the existence of other objects. Objects other than these objects will be apparent from and can be derived from the descriptions of the specification, the claims, the drawings, and the like.

Means for Solving the Problems

A semiconductor device of one embodiment of the present invention is a semiconductor device including a cell array, a first driver circuit, and a second driver circuit; the cell array includes a first memory cell and a second memory cell; the first driver circuit has a function of supplying a selection signal; the second driver circuit has a function of writing or reading out data; the first memory cell includes a first transistor and a first capacitor; the second memory cell includes a second transistor and a second capacitor; one of a source and a drain of the first transistor is electrically connected to the first capacitor; one of a source and a drain of the second transistor is electrically connected to the second capacitor; the first driver circuit includes a third transistor; the second driver circuit includes a fourth transistor; the first transistor, the second transistor, the third transistor, and the fourth transistor each include a metal oxide in a channel formation region; the first transistor, the second transistor, the third transistor, and the fourth transistor have the same polarity; and the channel formation region of the first transistor and the channel formation region of the second transistor are formed in the same semiconductor layer.

The semiconductor device of one embodiment of the present invention includes a control circuit, the control circuit has a function of controlling operations of the first driver circuit and the second driver circuit, the control circuit includes a fifth transistor, the fifth transistor includes a metal oxide in a channel formation region, and the fifth transistor may have the same polarity as the first transistor, the second transistor, the third transistor, and the fourth transistor.

In the semiconductor device of one embodiment of the present invention, the first transistor includes a first gate electrode and a first insulating layer, the second transistor includes a second gate electrode and a second insulating layer, the first insulating layer includes a region in contact with a side surface of the first gate electrode, the second insulating layer includes a region in contact with a side surface of the second gate electrode, and the semiconductor layer may be electrically connected to a conductive layer including a region in contact with a side surface of the first insulating layer or the second insulating layer.

In the semiconductor device of one embodiment of the present invention, the first transistor and the second transistor each include a back gate, and the back gate of the first transistor and the back gate of the second transistor may be formed of the same conductive layer.

In the semiconductor device of one embodiment of the present invention, the semiconductor layer includes a layer containing a metal in a surface, the layer containing the metal is formed in a region that does not overlap with the first gate electrode, the second gate electrode, the first insulating layer, and the second insulating layer, and the metal may be different from a main component of the semiconductor layer.

In the semiconductor device of one embodiment of the present invention, the metal may be aluminum, ruthenium, titanium, tantalum, tungsten, or chromium.

One embodiment of the present invention is an electronic component including a package substrate, an interposer, an integrated circuit, and the above semiconductor device; the integrated circuit and the semiconductor device are provided over the interposer; the integrated circuit is electrically connected to the semiconductor device through a wiring provided over the interposer; and at least one of the integrated circuit and the semiconductor device is electrically connected to the package substrate through the interposer.

An electronic device of one embodiment of the present invention is an electronic device including the above electronic component, and a microphone, a speaker, or a camera.

Effect of the Invention

One embodiment of the present invention can provide a novel semiconductor device. Another embodiment of the present invention can provide a semiconductor device with low power consumption. Another embodiment of the present invention can provide a highly reliable semiconductor device. Another embodiment of the present invention can provide a semiconductor device having high layout flexibility. Another embodiment of the present invention can provide a semiconductor device that can be miniaturized or highly integrated. Another embodiment of the present invention can provide a novel electronic component. Another embodiment of the present invention can provide a novel electronic device.

Note that the descriptions of the effects do not disturb the existence of other effects. One embodiment of the present invention does not have to have all of these effects. Effects other than these will be apparent from and can be derived from the descriptions of the specification, the claims, the drawings, and the like.

BRIEF DESCRIPTION OF THE DRAWINGS

FIGS. 1A1-1B Diagrams illustrating a configuration example of a memory circuit.

FIGS. 33A-33B2 Diagrams illustrating structure examples of an electronic device.

MODE FOR CARRYING OUT THE INVENTION

Figure 2:
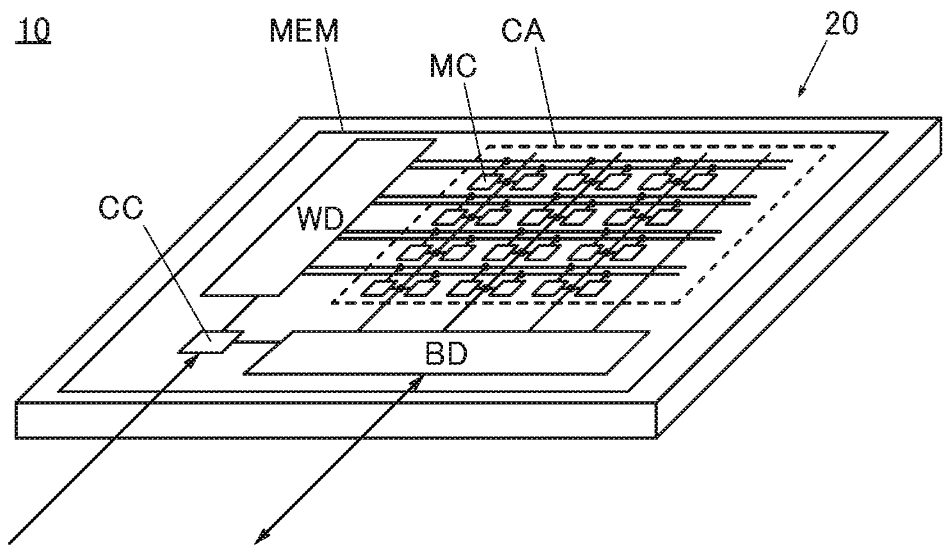
FIG. 2 A diagram illustrating a configuration example of a semiconductor device.

Embodiments of the present invention will be described in detail below with reference to the drawings. Note that the present invention is not limited to the descriptions in the following embodiments and it is easily understood by those skilled in the art that the modes and details can be variously changed without departing from the scope and spirit of the present invention. Therefore, the present invention should not be interpreted as being limited to the descriptions of the embodiments below.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, in the case where a metal oxide is used in a channel formation region of a transistor, the metal oxide is called an oxide semiconductor in some cases. That is to say, in the case where a metal oxide has at least one of an amplifying function, a rectifying function, and a switching function, the metal oxide can be called a metal oxide semiconductor, or OS for short. A transistor including a metal oxide in a channel formation region is also referred to as an OS transistor below.

In this specification and the like, metal oxides containing nitrogen are also collectively referred to as a metal oxide in some cases. A metal oxide containing nitrogen may be referred to as a metal oxynitride. The details of a metal oxide will be described later.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relation shown in drawings or texts, a connection relationship other than one shown in drawings or texts is described in the drawings or the texts. Here, X and Y each denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y Note that a switch has a function of being controlled to be turned on or off. That is, a switch has a function of being turned on or off to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y Note that even if another circuit is sandwiched between X and Y, for example, X and Y are regarded as being functionally connected when a signal output from X is transmitted to Y Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Even when a diagram shows that independent components are electrically connected to each other, one component has functions of a plurality of components in some cases. For example, when part of a wiring also functions as an electrode, one conductive film has a function of the wiring and a function of the electrode. Thus, electrical connection in this specification includes in its category such a case where one conductive film has functions of a plurality of components.

In the drawings, the size, the layer thickness, or the region is exaggerated for clarity in some cases. Therefore, the size, the layer thickness, or the region is not limited to the scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which is not illustrated in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like may be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relationship between components is changed as appropriate in accordance with a direction in which each component is described. Thus, the description not limited to terms described in this specification can be changed appropriately depending on the situation.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

Note that a silicon oxynitride film in this specification and the like has a composition in which the oxygen content is higher than the nitrogen content. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film has a composition in which the nitrogen content is higher than the oxygen content. A silicon nitride oxide film preferably contains, for example, nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Embodiment 1

In this embodiment, a semiconductor device of one embodiment of the present invention will be described. The semiconductor device of one embodiment of the present invention includes a memory circuit formed using an OS transistor.

<Configuration Example of Memory Circuit>

First, a configuration example of a memory circuit included in the semiconductor device of one embodiment of the present invention will be described. FIG. 1(A-1) illustrates a configuration example of a memory circuit MEM.

The memory circuit MEM includes a cell array CA, a driver circuit WD, and a driver circuit BD. The cell array CA is composed of a plurality of memory cells MC arranged in a matrix.

The memory cells MC have a function of storing data. The memory cells MC may have a function of storing binary (high-level and low-level) data or a function of storing multilevel data with four or more levels. The memory cells MC may have a function of storing analog data.

The memory cells MC are connected to wirings WL and wirings BL. Note that FIG. 1(A-1) illustrates a configuration example in which one wiring BL is shared by adjacent two memory cells MC that belong to the same row.

The driver circuit WD has a function of selecting the memory cell MC. Specifically, the driver circuit WD has a function of supplying a signal for selecting the memory cell MC to/from which data is written or read out (hereinafter also referred to as a selection signal) to the wiring WL.

The driver circuit BD has a function of writing data to the memory cell MC and a function of reading out data stored in the memory cell MC. Specifically, the driver circuit BD has a function of supplying a potential (hereinafter also referred to as a writing potential) corresponding to data stored in the memory cell MC to the wiring BL connected to the memory cell MC to which data is to be written. The driver circuit BD also has a function of reading out a potential (hereinafter also referred to as a reading potential)

corresponding to data stored in the memory cell MC and outputting the potential to the outside.

The memory cells MC, the driver circuit WD, and the driver circuit BD are formed with OS transistors. An oxide semiconductor has a band gap of 3.0 eV or larger; thus, the leakage current of an OS transistor due to thermal excitation is low and its off-state current is extremely low. Note that an off-state current refers to a current that flows between a source and a drain when a transistor is off. An oxide semiconductor used in a channel formation region of a transistor is preferably an oxide semiconductor containing at least one of indium (In) and zinc (Zn). A typical example of such an oxide semiconductor is an In-M-Zn oxide (an element M is Al, Ga, Y, or Sn, for example). Reducing the amount of impurities such as moisture and hydrogen serving as electron donors (donors) and the amount of oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 3.

An OS transistor has an extremely low off-state current and thus is particularly preferred as a transistor used in the memory cell MC. The off-state current per channel width of 1 μm of an OS transistor can be 100 zA/μm or lower, 10 zA/μm or lower, 1 zA/μm or lower, or 10 yA/μm or lower, for example. The use of an OS transistor in the memory cell MC allows data stored in the memory cell MC to be retained for an extremely long period.

FIG. 1(A-2) illustrates a configuration example of the memory cells MC using OS transistors. Here, two adjacent memory cells MC are illustrated, and one of the memory cells is also referred to as a memory cell MCa and the other memory cell is also referred to as a memory cell MCb. The memory cell MCa and the memory cell MCb share one wiring BL.

The memory cells MC each include a transistor T and a capacitor C. The transistor T and the capacitor C included in the memory cell MCa are also referred to as a transistor Ta and a capacitor Ca, respectively, and the transistor T and the capacitor C included in the memory cell MCb are also referred to as a transistor Tb and a capacitor Cb, respectively. Furthermore, the wirings WL connected to the memory cells MCa and MCb are also referred to as wirings WLa and WLb, respectively. Note that the transistor T is an n-channel OS transistor.

A gate of the transistor T is connected to the wiring WL, one of a source and a drain of the transistor T is connected to one electrode of the capacitor C, and the other of the source and the drain of the transistor T is connected to the wiring BL. The other electrode of the capacitor C is connected to a wiring VL supplied with a constant potential (e.g., aground potential). Anode that is connected to the one of the source and the drain of the transistor T and the one electrode of the capacitor C is referred to as a node N.

When data is written to the memory cell MC, a writing potential is supplied to the wiring BL. Then, a selection signal (high-level potential) is supplied to the wiring WL to turn on the transistor T. Thus, the writing potential is supplied to the node N. After that, a low-level potential is supplied to the wiring WL to turn off the transistor T. Thus, the node N is brought into a floating state, and the writing potential is held.

When data stored in the memory cell MC is read out, the potential of the wiring BL is a reading potential. A selection signal (high-level potential) is supplied to the wiring WL to turn on the transistor T. Accordingly, the potential of the wiring BL is determined in accordance with the potential of the node N, and data stored in the memory cell MC is read out.

Since an OS transistor is used as the transistor T, the potential of the node N is held for an extremely long period while the transistor T is off. Thus, the frequency of refreshing data can be reduced, so that power consumption can be reduced.

Data in the memory cell MC is rewritten by charge and discharge of the capacitor C; therefore, the memory cell MC has no limitation on the number of times of rewriting in principle and data can be written and read out with low energy. In addition, the memory cell MC has a simple circuit configuration, and thus the capacity of the memory circuit MEM can be easily increased.

FIG. 1(B) illustrates a structure example of the memory cells MC. Here, a cross-sectional view of the memory cell MCa and the memory cell MCb in FIG. 1(A-2) is particularly shown.

The memory cell MCa includes the transistor Ta and the capacitor Ca, and the memory cell MCb includes the transistor Tb and the capacitor Cb. A conductive layer having a function of a gate of the transistor Ta is connected to the wiring WLa, and a conductive layer having a function of a gate of the transistor Tb is connected to the wiring WLb. A conductive layer having a function of an electrode of the capacitor Ca is connected to the wiring VL. A conductive layer having a function of an electrode of the capacitor Cb is connected to the wiring VL.

The transistor Ta and the transistor Tb may each include a pair of gates. Note that when a transistor includes a pair of gates, one gate may be referred to as a first gate, a front gate, or simply a gate, and the other gate may be referred to as a second gate or a back gate.

FIG. 1(A-2) illustrates a configuration example in which the transistor Ta and the transistor Tb each include a back gate. The back gates of the transistor Ta and the transistor Tb are connected to wirings BGL. The supply of predetermined potentials to the back gates of the transistor Ta and the transistor Tb from the wirings BGL allows the control of the threshold voltages of the transistor Ta and the transistor Tb. For example, the threshold voltages of the transistor Ta and the transistor Tb can be set to higher than 0 V. Thus, the off-state current can be reduced. Note that the back gates of the transistor Ta and the transistor Tb may be formed of the same conductive layer.

The transistor Ta and the transistor Tb are formed using the same oxide OX. The oxide OX has a function of semiconductor layers of the transistor Ta and the transistor Tb and a function of the electrodes of the capacitor Ca and the capacitor Cb. In other words, a channel formation region of the transistor Ta and a channel formation region of the transistor Tb are formed in the same semiconductor layer. The oxide OX is connected to a conductive layer connected to the wiring BL. The conductive layer connected to the wiring BL has a function of a source or a drain of the transistor Ta and a function of a source or a drain of the transistor Tb.

As illustrated in FIG. 1(B), the transistor Ta and the transistor Tb share the wiring BL, whereby the area of the cell array CA can be reduced. Specific structures of the memory cell MCa and the memory cell MCb illustrated in FIG. 1(B) will be described in Embodiment 3.

When the memory cells MC included in the cell array CA have the above structure, the cell array CA can be formed using n-channel OS transistors. A circuit formed with transistors having the same polarity is hereinafter also referred to as a single-polarity circuit.

Like the cell array CA, the driver circuit WD and the driver circuit BD can also be formed with single-polarity circuits using OS transistors. Thus, the transistors included in the cell array CA, the driver circuit WD, and the driver circuit BD can have the same polarity, and the memory circuit MEM can be formed with single-polarity circuits using OS transistors. In that case, the transistors included in the cell array CA, the driver circuit WD, and the driver circuit BD can be formed concurrently in the same step.

Note that single-polarity circuits using OS transistors can be stacked over a semiconductor substrate. Thus, the memory circuit MEM formed with single-polarity circuits can be stacked over a circuit formed over a semiconductor substrate, enabling a reduction in the area of the semiconductor device.

<Configuration Example 1 of Semiconductor Device>

FIG. 2 illustrates a configuration example of a semiconductor device 10. The semiconductor device 10 includes a layer 20 provided with single-polarity circuits formed using OS transistors. The layer 20 can be provided with the memory circuit MEM illustrated in FIG. 1(A-1).

Data to be written to the cell array CA is input to the driver circuit BD from the outside. Data read out from the cell array CA is output to the outside from the driver circuit BD.

The cell array CA, the driver circuit WD, and the driver circuit BD included in the memory circuit MEM are each composed of a single-polarity circuit using OS transistors. Thus, the memory circuit MEM can be formed in the same layer 20.

For example, in the case where the memory circuit MEM is formed using an n-channel OS transistor formed in the layer 20 and a transistor (e.g., a transistor formed over a semiconductor substrate) formed in another layer, many connection portions (contact holes and wirings) for connecting these transistors are necessary. Particularly in the case where a plurality of memory cells MC are formed using OS transistors and transistors formed in another layer, connection between two layers is necessary in each memory cell MC, resulting in a more significant increase in the number of connection portions. The increase in the number of connection portions causes a reduction in circuit layout flexibility.

Moreover, entry of impurities (such as hydrogen) into an oxide semiconductor included in the OS transistor causes deterioration of the OS transistor. Here, the connection portions serve as paths for impurities, and the impurities can enter the layer 20 through the connection portion. Thus, when the number of connection portions between two layers is increased, the amount of impurities that enter the oxide semiconductor is increased, leading to deterioration of the OS transistor formed in the layer 20.

In one embodiment of the present invention, the memory circuit MEM is composed of a single-polarity circuit using OS transistors. Therefore, connection between different layers in the memory circuit MEM is not necessary. This can reduce the number of connection portions and improve circuit layout flexibility and the reliability of the OS transistors.

In particular, since many memory cells MC are provided, forming the memory cells MC using a single-polarity circuit can noticeably reduce the number of connection portions. When the driver circuit WD and the driver circuit BD are provided in the same layer as the cell array CA, many wirings WL for connecting the driver circuit WD and the cell array CA and many wirings BL for connecting the driver circuit BD and the cell array CA can be avoided from being provided between layers, resulting in a further reduction in the number of connection portions.

Note that the memory circuit MEM can be used as a cache memory, a main memory device, or an auxiliary memory device of a computer, for example.

The layer 20 may include a control circuit CC. The control circuit CC has a function of controlling the operations of the driver circuit WD and the driver circuit BD. Specifically, the control circuit CC has a function of generating various signals for controlling the operations of the driver circuit WD and the driver circuit BD in accordance with a control signal (e.g., an address signal, a clock signal, or a chip enable signal) input from the outside.

The driver circuit WD generates a selection signal in accordance with a signal (e.g., an address signal or a control signal) supplied from the control circuit CC and supplies the selection signal to the cell array CA. The driver circuit BD generates a writing potential corresponding to data input from the outside, in accordance with a signal (e.g., an address signal or a control signal) supplied from the control circuit CC and outputs the writing potential to the cell array CA. In addition, the driver circuit BD outputs data read out from the cell array CA to the outside, in accordance with a signal (e.g., an address signal or a control signal) supplied from the control circuit CC.

The control circuit CC is composed of a single-polarity circuit using OS transistors. Therefore, the control circuit CC can be provided in the layer 20, so that the operation of the memory circuit MEM can be controlled by the control circuit CC provided in the same layer. Thus, the connection portions between the control circuit CC and the driver circuit WD and between the control circuit CC and the driver circuit BD can be omitted.

Another circuit can also be provided in the layer 20. For example, the layer 20 may include a processor and a peripheral circuit. In that case, the processor and the peripheral circuit are composed of single-polarity circuits using OS transistors.

As the processor, a CPU (Central Processor Unit), an MPU (MicroProcessor Unit), a GPU (Graphics Processing Unit), or the like can be used. As the peripheral circuit, a memory circuit, an input/output circuit, a power management unit, a timer, a counter, a converter circuit (e.g., an A/D converter circuit or a D/A converter circuit), or the like can be used. Note that a plurality of peripheral circuits may be provided.

The control circuit CC may be connected to the processor and the peripheral circuit via buses. Thus, data or signals can be transmitted and received between the control circuit CC, the processor, and the peripheral circuit via the buses. For example, processing in which data output from the cell array CA to the control circuit CC is used for processing in the processor or the peripheral circuit can be performed.

Figure 3:
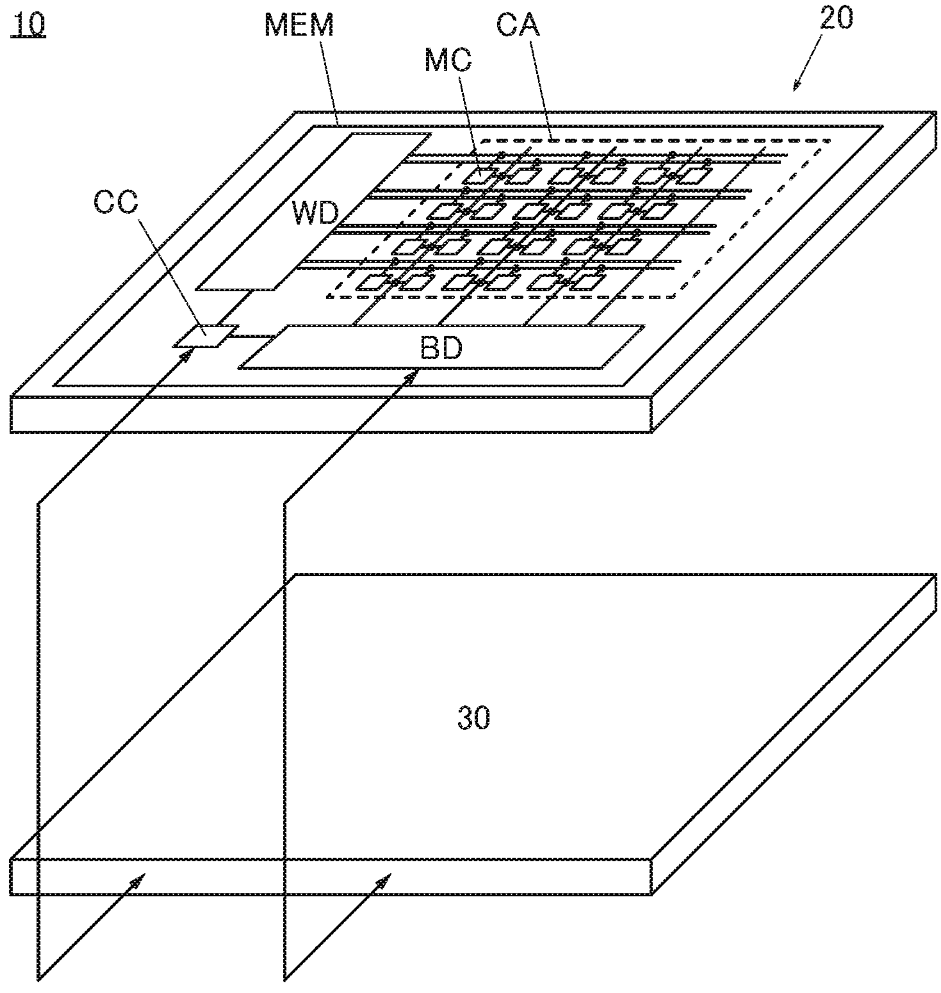
FIG. 3 A diagram illustrating a configuration example of a semiconductor device.

Note that the layer 20 can be stacked over a semiconductor substrate, and a signal input to the layer 20 can be supplied from a circuit formed over the semiconductor substrate. FIG. 3 illustrates a configuration example in which the layer 20 is stacked over a layer 30. The layer 30 includes a circuit formed with transistors formed over a semiconductor substrate. The circuit may have a function of outputting a control signal to the control circuit CC or a function of outputting data to the driver circuit BD. Data output from the driver circuit BD may be input to the circuit included in the layer 30.

In the case where data or a signal is transmitted and received between the layer 20 and the layer 30, the layer 20 and the layer 30 are connected to each other via a wiring provided therebetween.

As described above, in one embodiment of the present invention, the memory circuit MEM is composed of a single-polarity circuit using OS transistors; accordingly, the number of connection portions between the layer 20 and the layer 30 can be reduced. Note that the semiconductor device 10 can be used as a memory device, an arithmetic device, or the like.

Although the configuration in which OS transistors are used in the circuit provided in the layer 20 is described above, a transistor whose channel formation region is formed in a film containing a semiconductor material other than an oxide semiconductor may be used. Examples of such a transistor include a transistor using an amorphous silicon film, a microcrystalline silicon film, a polycrystalline silicon film, a single crystal silicon film, an amorphous germanium film, a microcrystalline germanium film, a polycrystalline germanium film, or a single crystal germanium film for a semiconductor layer.

Although the configuration in which the control circuit CC is provided in the layer 20 is described above, the control circuit CC may be provided in the layer 30 illustrated in FIG. 3. In that case, the control circuit CC is formed with transistors formed over a semiconductor substrate. The control circuit CC is connected to the driver circuit WD and the driver circuit BD through connection portions formed between the layer 20 and the layer 30.

Although the configuration in which the processor and the peripheral circuit are provided is described above, the processor and the peripheral circuit may be provided in the layer 30. In that case, the processor and the peripheral circuit are formed with transistors formed over a semiconductor substrate.

<Configuration Example 2 of Semiconductor Device>

Figure 4:
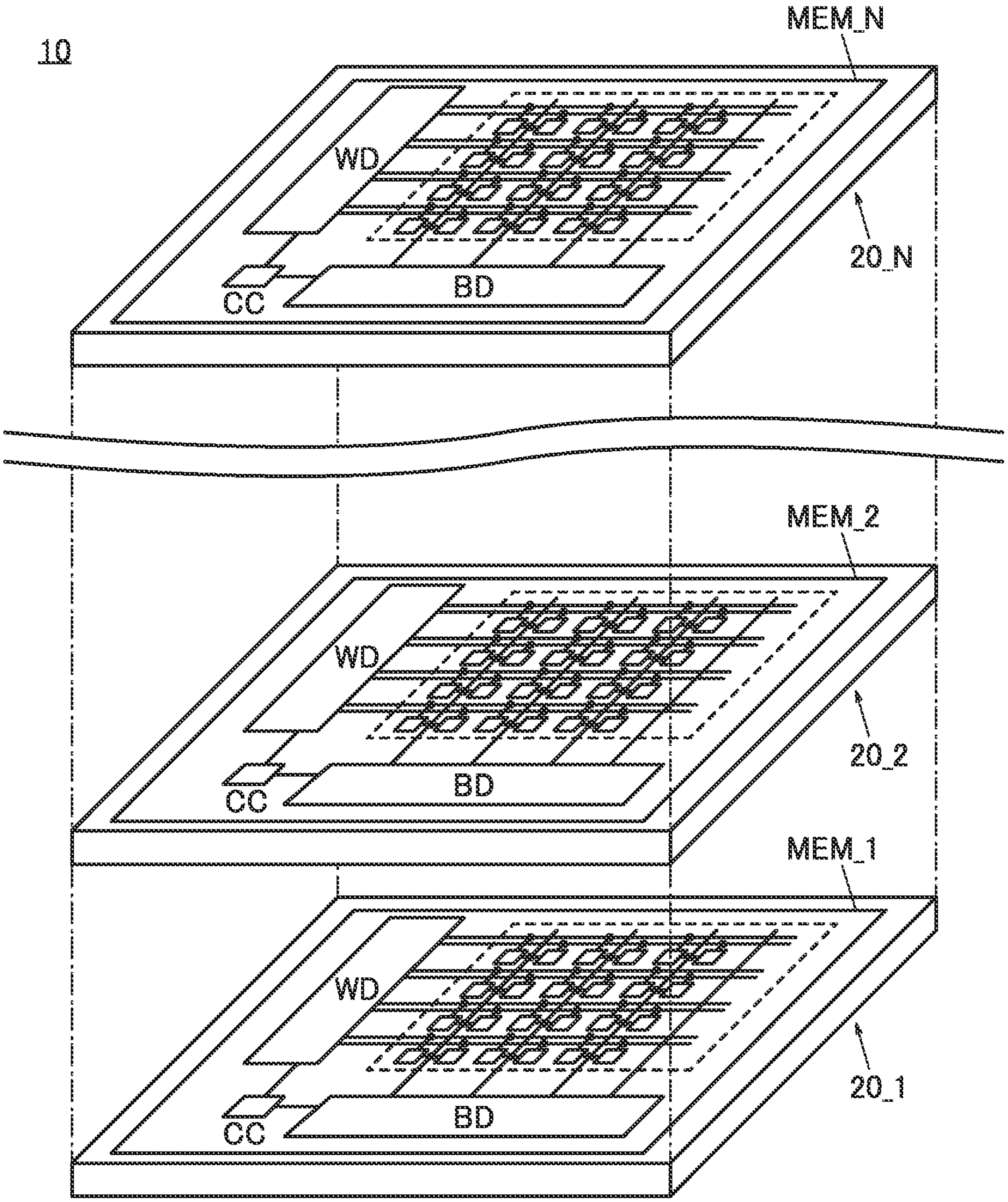
FIG. 4 A diagram illustrating a configuration example of a semiconductor device.

Although FIG. 2 illustrates the configuration example of the semiconductor device 10 provided with one layer 20 including the memory circuit MEM, two or more layers 20 may be stacked. FIG. 4 illustrates a configuration in which N layers 20 (layers 20_1 to 20_N) (N is an integer of 2 or more) are stacked. The layers 20_1 to 20_N each include memory circuits MEM_1 to MEM_N. Note that the configuration and function of the memory circuits MEM_1 to MEM_N are the same as those of the memory circuit MEM in FIG. 2.

The memory circuits MEM are stacked in this manner, whereby the data storage amount in the semiconductor device 10 can be increased.

<Configuration Example 3 of Semiconductor Device>

Figure 5:
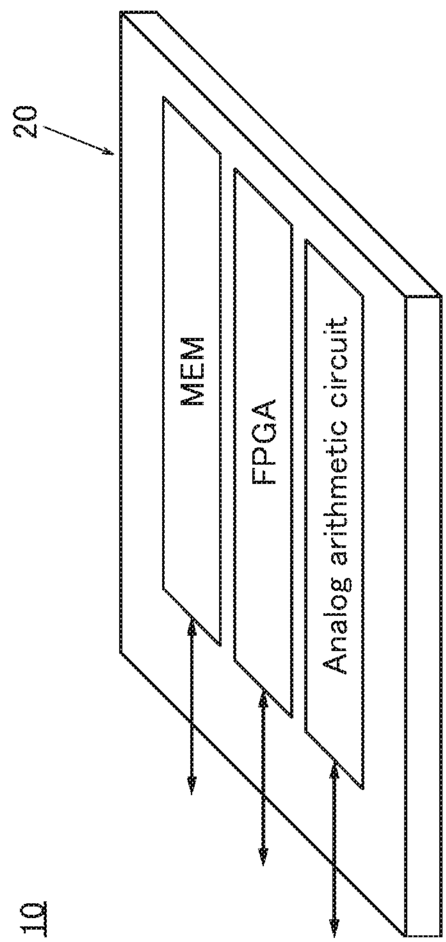
FIG. 5 A diagram illustrating a configuration example of a semiconductor device.

Although FIG. 2 illustrates the configuration example in which the memory circuit MEM is provided in the layer 20, a circuit provided in the layer 20 is not limited to the memory circuit MEM. The layer 20 may be provided with a plurality of circuits having different functions. FIG. 5 illustrates a configuration example in which the layer 20 includes the memory circuit MEM, FPGA, and an analog arithmetic circuit.

FPGA is a device whose circuit configuration can be changed arbitrarily by a user. The circuit configuration of FPGA is changed by changing data (configuration data) stored in a configuration memory provided in a logic element and a switch between wirings of the FPGA. The configuration memory can be composed of a single-polarity circuit using OS transistors.

The analog arithmetic circuit has a function of performing an arithmetic operation using analog data. This analog data is stored in an analog memory provided in the analog arithmetic circuit. The analog arithmetic circuit can be used for an arithmetic operation of AI (Artificial Intelligence), for example. Specifically, a product-sum operation of a neural network can be performed by the analog arithmetic circuit provided in the layer 20. When the product-sum operation is performed by the analog arithmetic circuit, the circuit scale can be reduced and the power consumption can be improved. The analog memory provided in the analog arithmetic circuit can be formed with a single-polarity circuit using OS transistors.

Although FIG. 5 illustrates the configuration example in which the memory circuit MEM, the FPGA, and the analog arithmetic circuit are provided in the same layer 20, these circuits may be provided in different layers 20.

<Configuration Example 4 of Semiconductor Device>

Figure 6:
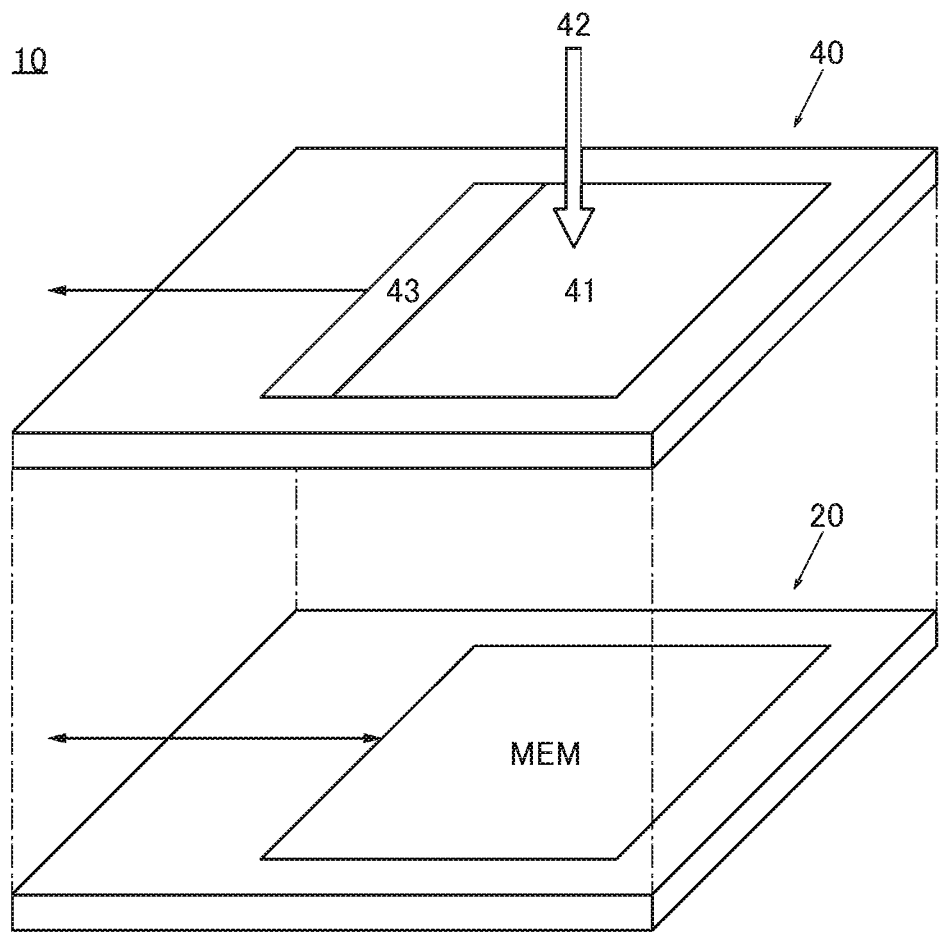
FIG. 6 A diagram illustrating a configuration example of a semiconductor device.

The semiconductor device 10 may have a function of an imaging device. FIG. 6 illustrates a configuration example of the semiconductor device 10 having a function of an imaging device. The semiconductor device 10 illustrated in FIG. 6 has a configuration in which a layer 40 is stacked over the layer 20 provided with the memory circuit MEM (see FIG. 2).

The layer 40 includes a light-receiving portion 41 formed with a plurality of light-receiving elements. The light-receiving portion 41 has a function of converting emitted light 42 into an electric signal and outputting the electric signal as imaging data.

As the light-receiving element, for example, a pn-junction photodiode using a selenium-based material for a photoelectric conversion layer, or the like can be used. A photoelectric conversion element using a selenium-based material has high external quantum efficiency with respect to visible light; thus, an optical sensor with high sensitivity can be obtained.

A selenium-based material can be used as a p-type semiconductor. Examples of a selenium-based material include crystalline selenium such as single crystal selenium and polycrystalline selenium, amorphous selenium, a compound of copper, indium, and selenium (CIS), and a compound of copper, indium, gallium, and selenium (CIGS).

An n-type semiconductor of the pn-junction photodiode is preferably formed with a material having a wide band gap and a visible-light-transmitting property. For example, zinc oxide, gallium oxide, indium oxide, tin oxide, or an oxide of a mixture thereof can be used.

As the light-receiving element included in the layer 40, a pn-junction photodiode using a p-type silicon semiconductor and an n-type silicon semiconductor may be used. The light-receiving element may be a pin-junction photodiode in which an i-type silicon semiconductor layer is provided between a p-type silicon semiconductor and an n-type silicon semiconductor.

The photodiode using silicon can also be formed using single crystal silicon, amorphous silicon, microcrystalline silicon, polycrystalline silicon, or the like.

The layer 40 may include a driver circuit 43 connected to the light-receiving portion 41. Imaging data obtained by the light-receiving portion 41 is read out by the driver circuit 43 and output to the outside. Note that the driver circuit 43 can be composed of a single-polarity circuit using OS transistors.

The semiconductor device 10 illustrated in FIG. 6 can be used as a sensor incorporated in a camera or the like.

This embodiment can be combined with the descriptions of the other embodiments as appropriate.

Embodiment 2

In this embodiment, a specific configuration example of the memory circuit described in the above embodiment will be described.

Figure 7:
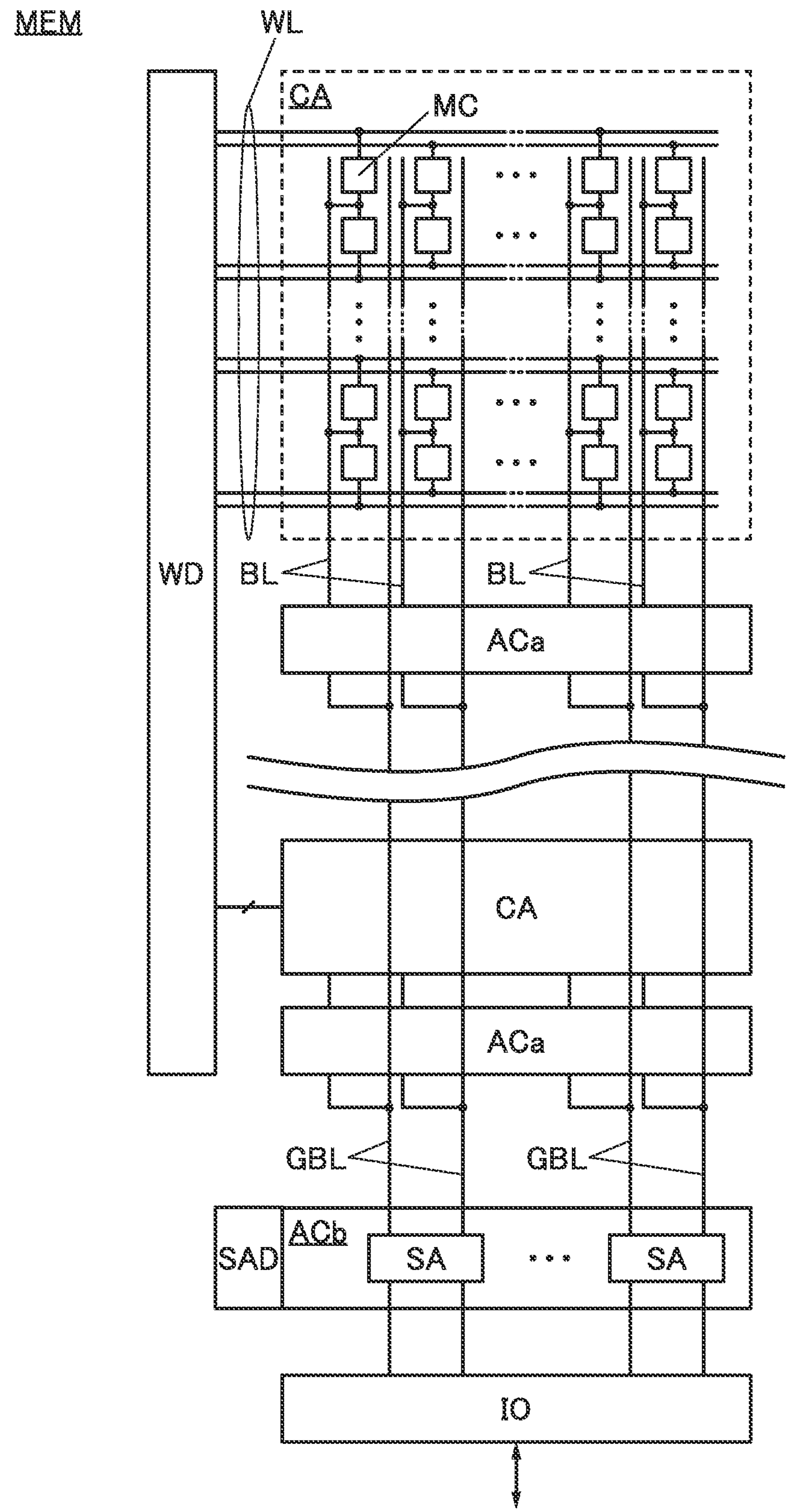
FIG. 7 A diagram illustrating a configuration example of a memory circuit.

FIG. 7 illustrates a specific configuration example of the memory circuit MEM. The memory circuit MEM illustrated in FIG. 7 includes one or more cell arrays CA and amplifier circuits ACa whose number is the same as that of the cell arrays CA. The memory circuit MEM includes an amplifier circuit ACb provided with a plurality of sense amplifiers SA, a driver circuit SAD, and an input/output circuit IO. The driver circuit BD in FIG. 1 includes the amplifier circuit ACa, the amplifier circuit ACb, the driver circuit SAD, and the input/output circuit IO.

The amplifier circuit ACa has a function of amplifying the potential of the wiring BL. Specifically, a potential (reading potential) supplied from the cell array CA to the wiring BL is amplified by the amplifier circuit ACa and output to the wiring GBL. Note that the amplifier circuit ACa may have a function of determining whether the potential of the wiring BL is output to the wiring GBL. The potential output to the wiring GBL is input to the amplifier circuit ACb.

The amplifier circuit ACb has a function of amplifying the potential of the wiring GBL. Specifically, the amplifier circuit ACb has a function of amplifying the reading potential output from the cell array CA via the amplifier circuit ACa and outputting the amplified reading potential to the input/output circuit IO. The amplifier circuit ACb also has a function of amplifying a writing potential input from the input/output circuit IO and outputting the amplified writing potential to the wiring GBL. The plurality of sense amplifiers SA are used for amplification of a potential by the amplifier circuit ACb.

The sense amplifiers SA have a function of amplifying the potential difference between the two wirings GBL. Specifically, the sense amplifier SA is connected to the two wirings GBL and has a function of amplifying the difference between the potential of one of the wirings GBL, which is regarded as a reference potential, and the potential of the other wiring GBL. The sense amplifier SA also has a function of holding the potential difference between the two wirings GBL.

Note that the operation of the sense amplifiers SA can be controlled by the driver circuit SAD. The driver circuit SAD has a function of receiving a control signal for controlling the operation of the sense amplifiers SA, an address signal, or the like and controlling the sense amplifiers SA, for example. The driver circuit SAD selects the sense amplifier SA that outputs a signal to the input/output circuit IO and selects the sense amplifier SA that receives a signal output from the input/output circuit IO, for example. Note that the driver circuit SAD may be connected to the control circuit 21 in FIG. 2.

The input/output circuit IO has a function of outputting data read out from the cell array CA via the sense amplifiers SA to the outside. The input/output circuit IO also has a function of outputting data input from the outside to the cell array CA via the sense amplifiers SA.

Note that another amplifier circuit may be provided between the amplifier circuit ACb and the input/output circuit IO. The amplifier circuit has a function of amplifying the output from an amplifier circuit ACb and supplying the amplified output to the input/output circuit IO and a function of amplifying the output from the input/output circuit IO and supplying the amplified output to the amplifier circuit ACb.

The amplifier circuit ACa, the amplifier circuit ACb, the driver circuit SAD, and the input/output circuit IO can be composed of single-polarity circuits using OS transistors. Thus, the driver circuit BD can be composed of single-polarity circuits and provided in the layer 20 illustrated in FIG. 2.

Figure 8:
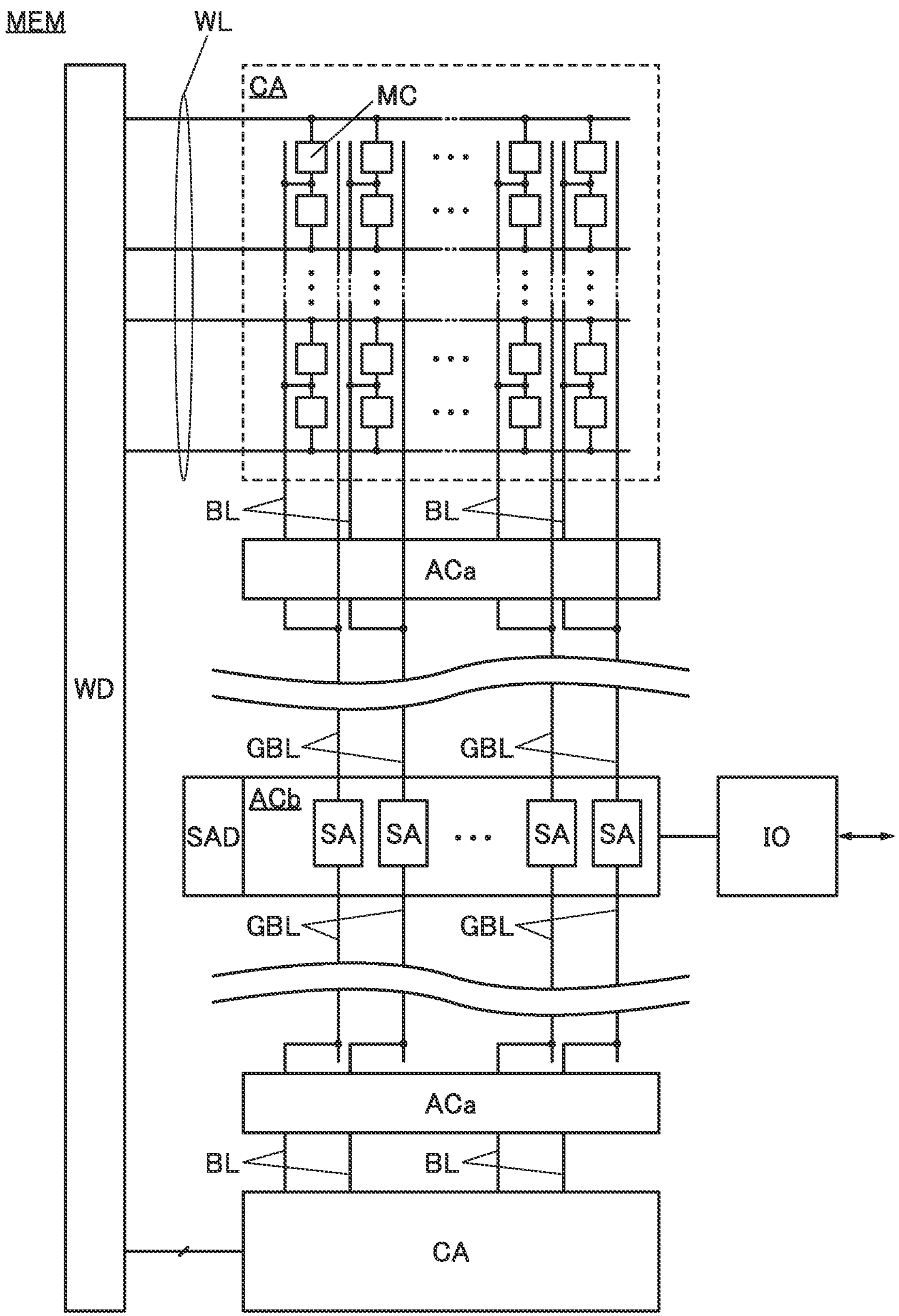
FIG. 8 A diagram illustrating a configuration example of a memory circuit.

Note that the circuits included in the memory circuit MEM can be arranged as illustrated in FIG. 8. In FIG. 8, a plurality of cell arrays CA and amplifier circuits ACa are arranged to face a plurality of cell arrays CA and amplifier circuits ACa with the amplifier circuit ACb therebetween in the vertical direction of paper. The sense amplifier SA is connected to the wiring GBL connected to the upper cell array CA and the wiring GBL connected to the lower cell array CA and amplifies the potential difference between these wirings GBL.

Note that the layouts of the memory circuit MEM illustrated in FIG. 7 and FIG. 8 can be referred to as a folded type and an open type, respectively.

This embodiment can be combined with the descriptions of the other embodiments as appropriate.

Embodiment 3

In this embodiment, specific structure examples of the semiconductor device described in the above embodiment will be described with reference to FIG. 9 to FIG. 27.

<Structure Example of Semiconductor Device>

FIG. 9 to FIG. 14 are a top view and cross-sectional views of semiconductor devices of embodiments of the present invention each of which includes a transistor 700, a memory cell 600*a*, and a memory cell 600*b*. Note that the memory cell 600*a* and the memory cell 600*b* may be hereinafter collectively referred to as a memory cell 600.

Figure 9:
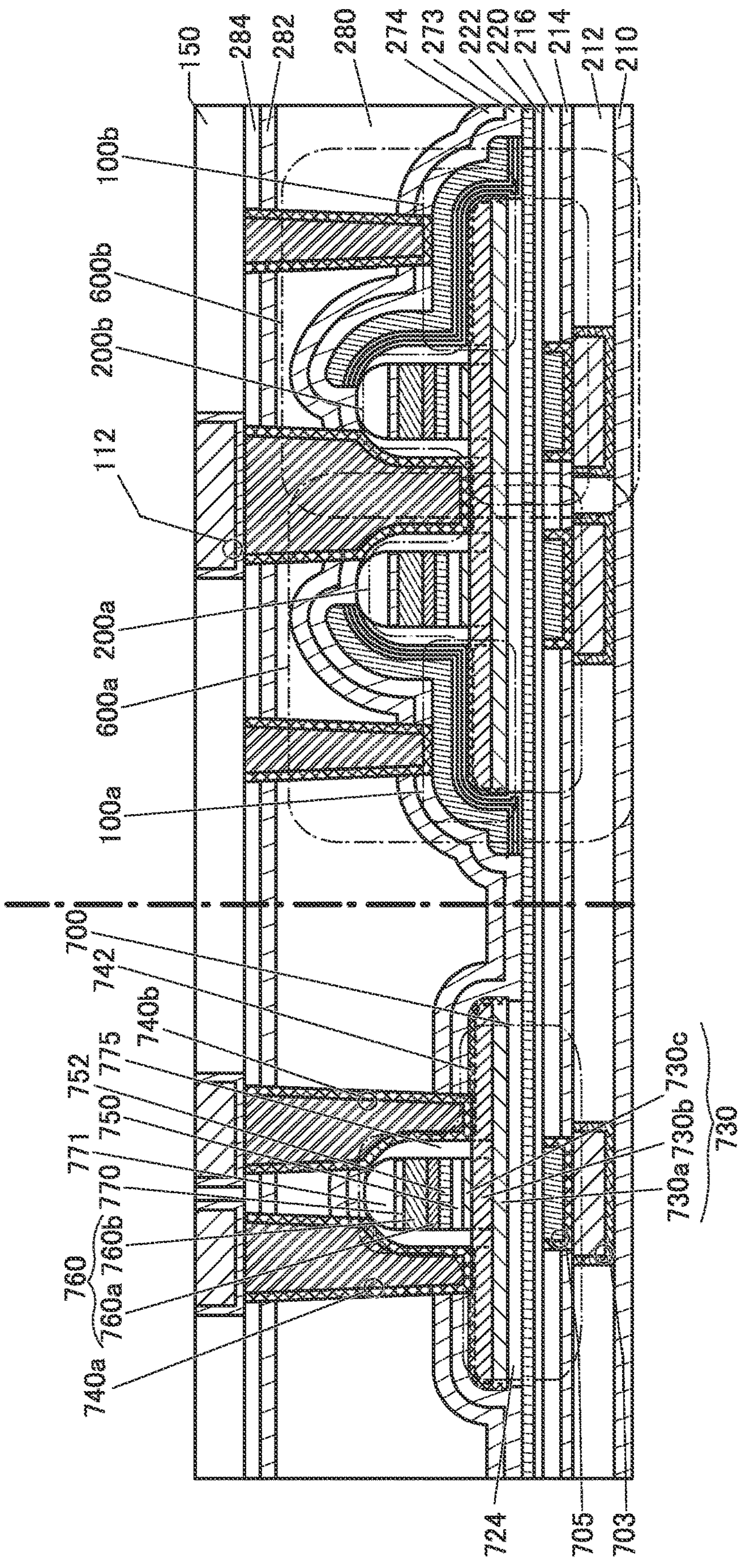
FIG. 9 A cross-sectional view illustrating a structure example of a semiconductor device.
Figure 10:
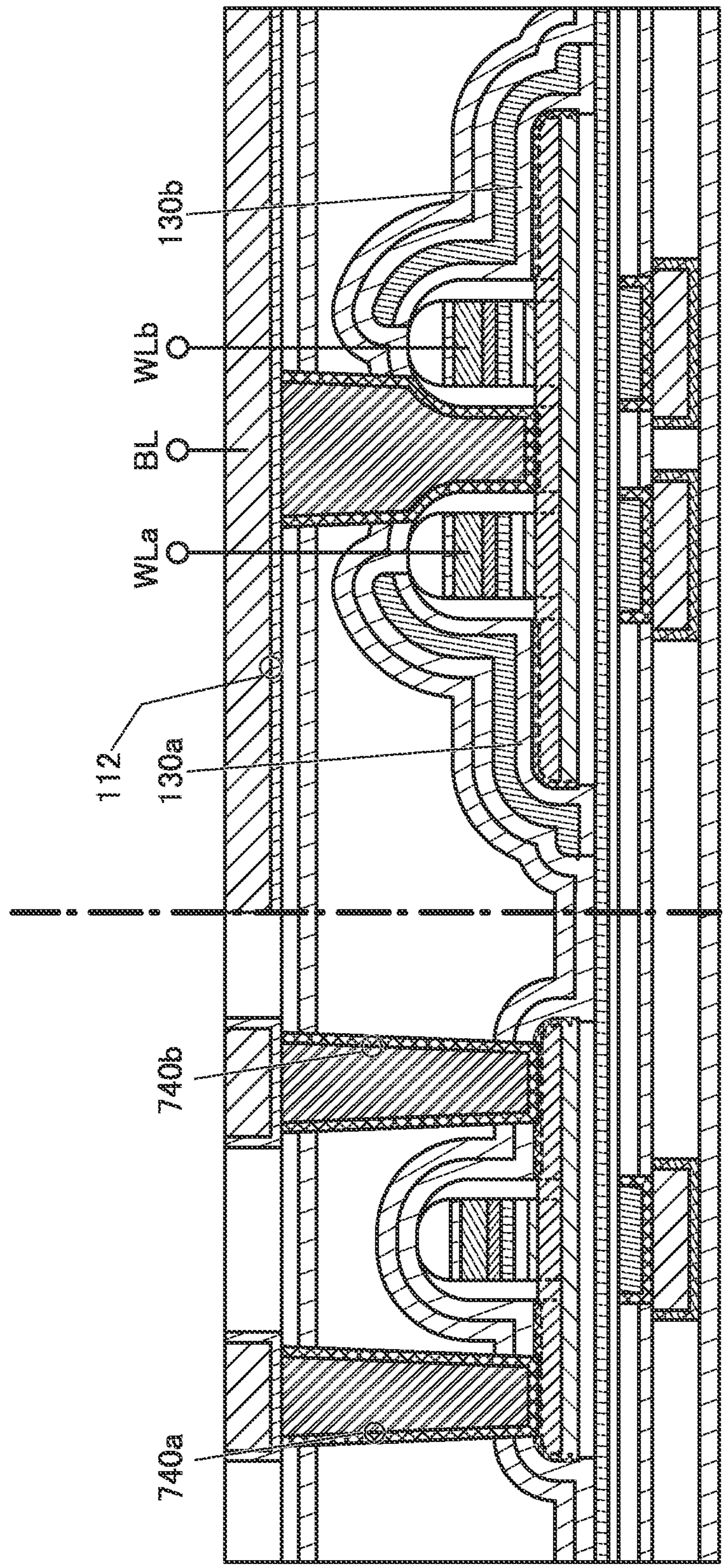
FIG. 10 A cross-sectional view illustrating a structure example of a semiconductor device.
Figure 11:
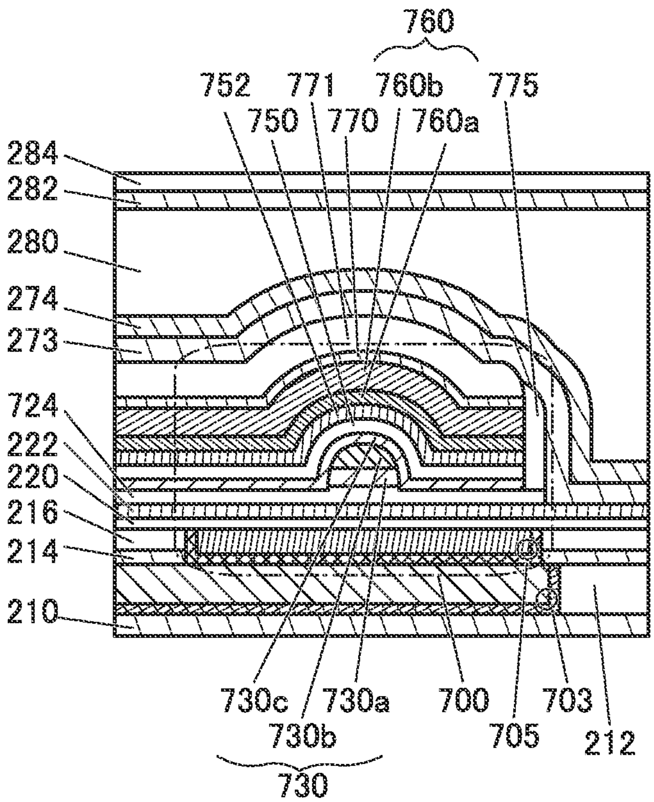
FIG. 11 A cross-sectional view illustrating a structure example of a semiconductor device.
Figure 12A:
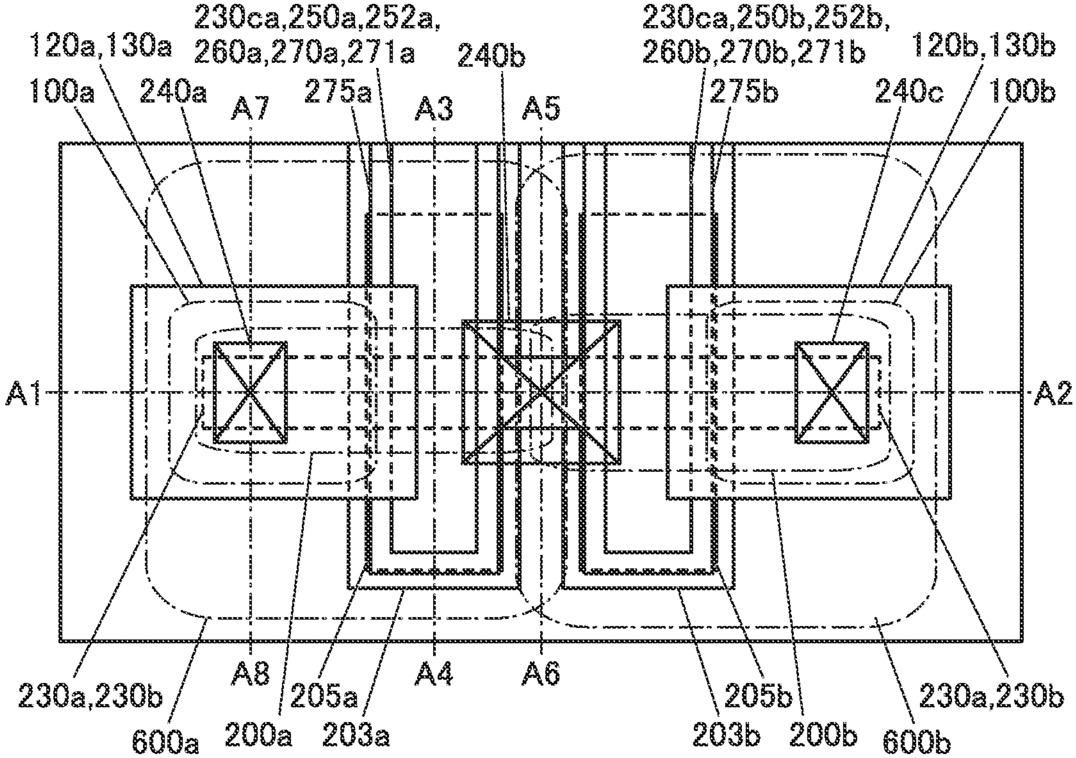
FIGS. 12A-12B A top view and a cross-sectional view illustrating a structure example of a semiconductor device.
Figure 12B:
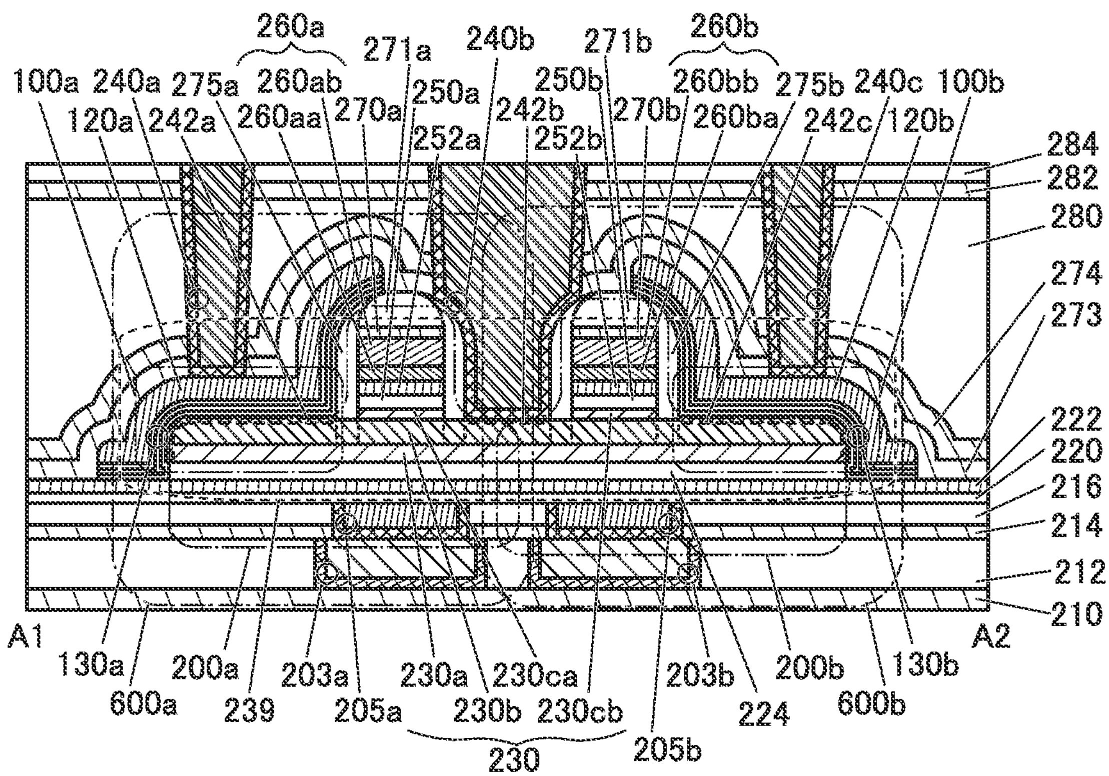
Figure 13A:
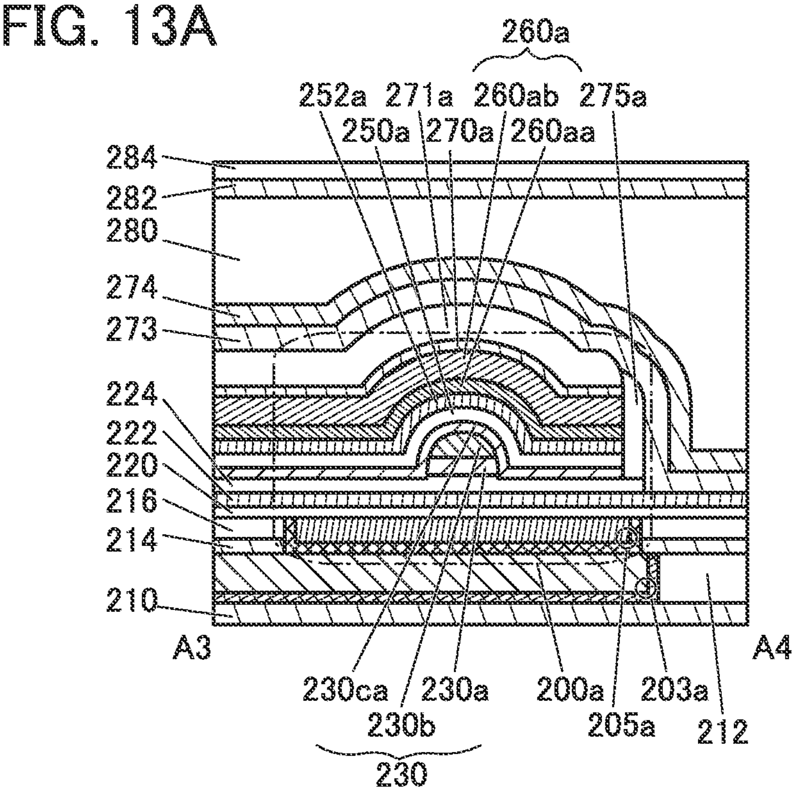
FIGS. 13A-13B Cross-sectional views illustrating a structure example of a semiconductor device.
Figure 13B:
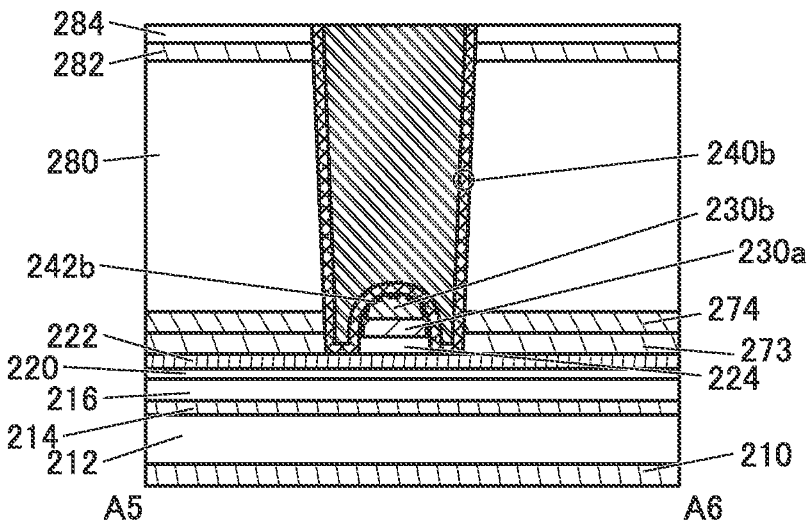
Figure 14:
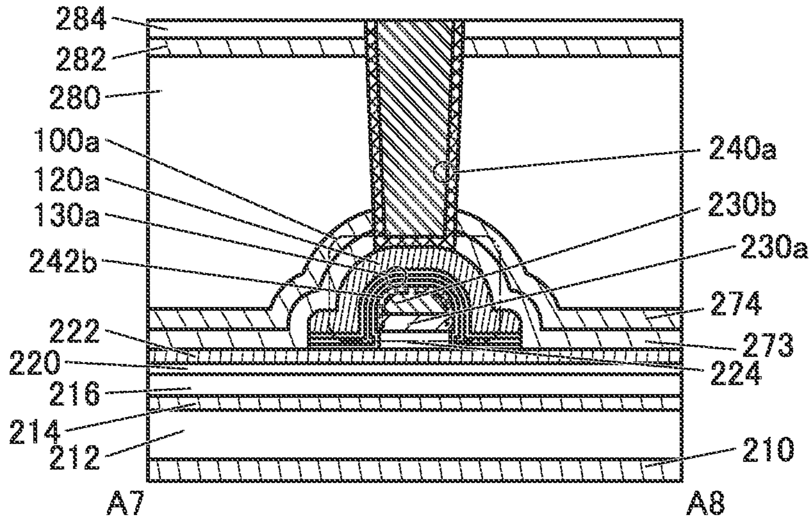
FIG. 14 A cross-sectional view illustrating a structure example of a semiconductor device.

FIG. 9 is a cross-sectional view of the semiconductor device of one embodiment of the present invention, which corresponds to the layer 20 described in the above embodiment. FIG. 10 is a cross-sectional view of the semiconductor device of one embodiment of the present invention different from that in FIG. 9. FIG. 11 is a cross-sectional view in the channel width direction of the transistor 700 whose channel length direction is shown in FIG. 9. FIG. 12(A) is a top view of the memory cell 600*a* and the memory cell 600*b*. FIG. 12(B), FIG. 13(A), and FIG. 13(B) are cross-sectional views of the memory cell 600*a* and the memory cell 600*b*. FIG. 12(B) is a cross-sectional view of a portion indicated by a dashed-dotted line A1-A2 in FIG. 12(A) and also is a cross-sectional view of a transistor 200*a* and a transistor 200*b* in the channel length direction. FIG. 13(A) is a cross-sectional view of a portion indicated by a dashed-dotted line A3-A4 in FIG. 12(A) and also is a cross-sectional view of the transistor 200*a* in the channel width direction. A cross-sectional view of the transistor 200*b* in the channel width direction is the same as the cross-sectional view of the transistor 200*a* in the channel width direction illustrated in FIG. 13(A). FIG. 13(B) is a cross-sectional view of a portion indicated by a dashed-dotted line A5-A6 in FIG. 12(A). FIG. 14 is a cross-sectional view of a portion indicated by a dashed-dotted line A7-A8 in FIG. 12(A). Note that for simplicity of the drawing, some components are not illustrated in the top view of FIG. 12(A).

Here, the transistor 700 corresponds to a transistor provided in the driver circuit WD, the driver circuit BD, or the control circuit CC. The memory cell 600*a* corresponds to the memory cell MCa, the transistor 200*a* corresponds to the transistor Ta, and a capacitor 100*a* corresponds to the capacitor Ca. The memory cell 600*b* corresponds to the memory cell MCb, the transistor 200*b* corresponds to the transistor Tb, and a capacitor 100*b* corresponds to the capacitor Cb. Note that the transistor 200*a* and the transistor 200*b* may be hereinafter collectively referred to as a transistor 200. The capacitor 100*a* and the capacitor 100*b* may be hereinafter collectively referred to as a capacitor 100.

The layer, which corresponds to the layer 20, of the semiconductor device described in this embodiment includes the transistor 200*a*, the transistor 200*b*, the capacitor 100*a*, the capacitor 100*b*, the transistor 700, an insulator 210, an insulator 212, an insulator 273, an insulator 274, an insulator 280, an insulator 282, and an insulator 284, which function as interlayer films. A conductor 203*a* that is electrically connected to the transistor 200*a* and functions as a wiring, a conductor 203*b* that is electrically connected to the transistor 200*b* and functions as a wiring, and a conductor 240*a*, a conductor 240*b*, and a conductor 240*c* that function as plugs are also included. A conductor 703 that is electrically connected to the transistor 700 and functions as a wiring, and a conductor 740*a* and a conductor 740*b* functioning as plugs are also included. A conductor 112 that is connected to a conductor 240 or a conductor 740 and functions as a wiring layer, and an insulator 150 may be provided over the insulator 284.

The conductor 203*a* and the conductor 203*b* may be hereinafter collectively referred to as a conductor 203. The conductor 240*a*, the conductor 240*b*, and the conductor 240*c* may be hereinafter collectively referred to as the conductor 240. The conductor 740*a* and the conductor 740*b* may be hereinafter collectively referred to as the conductor 740. Here, the conductor 703 is formed in the same layer and has the same structure as the conductor 203, and the conductor 740 is formed in the same layer and has the same structure as the conductor 240. Therefore, the descriptions of the conductor 203 and the conductor 240 can be referred to for the conductor 703 and the conductor 740, respectively.

Note that in the conductor 203, a first conductor is formed in contact with an inner wall of an opening in the insulator 212, and a second conductor is formed more inward than the first conductor. The top surfaces of the conductor 203 and the insulator 212 can be substantially level with each other. Although the structure in which the first conductor and the second conductor of the conductor 203 are stacked is described in this embodiment, the present invention is not limited thereto. The conductor 203 may be provided to have a single-layer structure or a stacked-layer structure of three or more layers, for example. In the case where a structure body has a stacked-layer structure, the layers may be distinguished by ordinal numbers given according to the formation order. Note that the conductor 703 has the same structure as the conductor 203.

The insulator 273 is positioned over the transistor 200*a*, the transistor 200*b*, the transistor 700, and the capacitor 100. The insulator 274 is positioned over the insulator 273. The insulator 280 is positioned over the insulator 274. The insulator 282 is positioned over the insulator 280. The insulator 284 is positioned over the insulator 282.

The conductor 240 is formed in contact with inner walls of openings in the insulator 273, the insulator 274, the insulator 280, the insulator 282, and the insulator 284. The top surfaces of the conductor 240 and the insulator 284 can be substantially level with each other. Although the structure in which the conductor 240 has a stacked-layer structure of two layers is described in this embodiment, the present invention is not limited thereto. The conductor 240 may be a single layer or have a stacked-layer structure of three or more layers. Note that the conductor 740 has the same structure as the conductor 240.

As illustrated in FIG. 12 and FIG. 13(A), the transistor 200*a* and the transistor 200*b* include an insulator 214 and an insulator 216 positioned over a substrate (not illustrated), a conductor 205*a* and a conductor 205*b* positioned so as to be embedded in the insulator 214 and the insulator 216, an insulator 220 positioned over the insulator 216, the conductor 205*a*, and the conductor 205*b*, an insulator 222 positioned over the insulator 220, an insulator 224 positioned over the insulator 222, an oxide 230*a* positioned over the insulator 224, an oxide 230*b* positioned over the oxide 230*a*, an oxide 230*ca* and an oxide 230*cb* positioned over the oxide 230*b*, an insulator 250*a* positioned over the oxide 230*ca*, an insulator 250*b* positioned over the oxide 230*cb*, a metal oxide 252*a* positioned over the insulator 250*a*, a metal oxide 252*b* positioned over the insulator 250*b*, a conductor 260*a* (a conductor 260*aa* and a conductor 260*ab*) positioned over the metal oxide 252*a*, a conductor 260*b* (a conductor 260*ba* and a conductor 260*bb*) positioned over the metal oxide 252*b*, an insulator 270*a* positioned over the conductor 260*a*, an insulator 270*b* positioned over the conductor 260*b*, an insulator 271*a* positioned over the insulator 270*a*, an insulator 271*b* positioned over the insulator 270*b*, an insulator 275*a* positioned in contact with at least side surfaces of the oxide 230*ca*, the insulator 250*a*, the metal oxide 252*a*, and the conductor 260*a*, an insulator 275*b* positioned in contact with at least side surfaces of the oxide 230*cb*, the insulator 250*b*, the metal oxide 252*b*, and the conductor 260*b*, and a layer 242 formed over the oxide 230*a* and the oxide 230*b*. In the layer 242, a portion located between the conductor 260*a* and the conductor 260*b* is referred to as a layer 242*b*, a portion located opposite to the layer 242*b* with the conductor 260*a* therebetween is referred to as a layer 242*a*, and a portion located opposite to the layer 242*b* with the conductor 260*b* therebetween is referred to as a layer 242*c*, in some cases. The conductor 240*b* is positioned in contact with the layer 242*b*.

In the transistor 200*a*, the layer 242*a* functions as one of a source and a drain, the layer 242*b* functions as the other of the source and the drain, the conductor 260*a* functions as a front gate, the insulator 250*a* functions as a gate insulating layer for the front gate, the conductor 205*a* functions as a back gate, and the insulator 220, the insulator 222, and the insulator 224 function as gate insulating layers for the back gate. In the transistor 200*b*, the layer 242*b* functions as one of a source and a drain, the layer 242*c* functions as the other of the source and the drain, the conductor 260*b* functions as a front gate, the insulator 250*b* functions as a gate insulating layer for the front gate, the conductor 205*b* functions as a back gate, and the insulator 220, the insulator 222, and the insulator 224 function as gate insulating layers for the back gate. The conductor 240*b* is electrically connected to a conductor corresponding to the wiring BL. The conductor 260*a* is electrically connected to a conductor functioning as the wiring WLa or corresponding to the wiring WLa. The conductor 260*b* is electrically connected to a conductor functioning as the wiring WLb or corresponding to the wiring WLb. The conductor 203*a* and the conductor 203*b* function as the wirings BGL.

Hereinafter, the oxide 230*a*, the oxide 230*b*, the oxide 230*ca*, and the oxide 230*cb* may be collectively referred to as an oxide 230. The oxide 230*ca* and the oxide 230*cb* may be hereinafter collectively referred to as an oxide 230*c*. The conductor 205*a* and the conductor 205*b* may be hereinafter collectively referred to as a conductor 205. The insulator

250*a* and the insulator 250*b* may be hereinafter collectively referred to as an insulator 250. The metal oxide 252*a* and the metal oxide 252*b* may be hereinafter collectively referred to as a metal oxide 252. The conductor 260*a* and the conductor 260*b* may be hereinafter collectively referred to as a conductor 260. The conductor 260*aa* and the conductor 260*ab* may be collectively referred to as the conductor 260*a*. The conductor 260*ba* and the conductor 260*bb* may be collectively referred to as a conductor 260*b*. The insulator 270*a* and the insulator 270*b* may be hereinafter collectively referred to as an insulator 270. The insulator 271*a* and the insulator 271*b* may be hereinafter collectively referred to as an insulator 271. The insulator 275*a* and the insulator 275*b* may be hereinafter collectively referred to as an insulator 275. The transistor 200*b* is formed in the same layer and has the same structure as the transistor 200*a*. Therefore, in the following description, for the structure of the transistor 200*b*, the description of the structure of the transistor 200*a* can be referred to, unless otherwise specified.

As illustrated in FIG. 9 and FIG. 11, the transistor 700 includes the insulator 214 and the insulator 216 positioned over a substrate (not illustrated), a conductor 705 positioned so as to be embedded in the insulator 214 and the insulator 216, the insulator 220 positioned over the insulator 216 and the conductor 705, the insulator 222 positioned over the insulator 220, an insulator 724 positioned over the insulator 222, an oxide 730 (an oxide 730*a*, an oxide 730*b*, and an oxide 730*c*) positioned over the insulator 724, an insulator 750 positioned over the oxide 730, a metal oxide 752 positioned over the insulator 750, a conductor 760 (a conductor 760*a* and a conductor 760*b*) positioned over the metal oxide 752, an insulator 770 positioned over the conductor 760, an insulator 771 positioned over the insulator 770, an insulator 775 positioned in contact with at least side surfaces of the oxide 730*c*, the insulator 750, the metal oxide 752, and the conductor 760, and layers 742 formed over the oxide 730. The conductor 740*a* is positioned in contact with one of the layers 742, and the conductor 740*b* is positioned in contact with the other of the layers 742.

In the transistor 700, the one of the layers 742 functions as one of a source and a drain, the other of the layers 742 functions as the other of the source and the drain, the conductor 760 functions as a front gate, and the conductor 705 functions as a back gate.

Here, the transistor 700 is formed in the same layer and has the same structure as the transistor 200. Thus, the oxide 730 has the same structure as the oxide 230, and the description of the oxide 230 can be referred to for the oxide 730. The conductor 705 has the same structure as the conductor 205, and the description of the conductor 205 can be referred to for the conductor 705. The insulator 724 has the same structure as the insulator 224, and the description of the insulator 224 can be referred to for the insulator 724. The insulator 750 has the same structure as the insulator 250, and the description of the insulator 250 can be referred to for the insulator 750. The metal oxide 752 has the same structure as the metal oxide 252, and the description of the metal oxide 252 can be referred to for the metal oxide 752. The conductor 760 has the same structure as the conductor 260, and the description of the conductor 260 can be referred to for the conductor 760. The insulator 770 has the same structure as the insulator 270, and the description of the insulator 270 can be referred to for the insulator 770. The insulator 771 has the same structure as the insulator 271, and the description of the insulator 271 can be referred to for the insulator 771. The insulator 775 has the same structure as the insulator 275, and the description of the insulator 275 can be referred to for the insulator 775. In the following description, for the structure of the transistor 700, the description of the structure of the transistor 200 can be referred to, unless otherwise specified.

Although the transistor 200 with a structure in which three layers of the oxide 230*a*, the oxide 230*b*, and the oxide 230*c* are stacked is described, the present invention is not limited thereto. For example, a structure may be employed in which a single-layer structure of the oxide 230*b*, a two-layer structure of the oxide 230*b* and the oxide 230*a*, a two-layer structure of the oxide 230*b* and the oxide 230*c*, or a stacked-layer structure of four or more layers is provided. The same applies to the oxide 730 of the transistor 700. Although the transistor 200 with a structure in which the conductor 260*a* and the conductor 260*b* are stacked is described, the present invention is not limited thereto. The same applies to the conductor 760 of the transistor 700.

The capacitor 100*a* includes the layer 242*a* (a region of the oxide 230 that functions as one of the source and the drain of the transistor 200*a*), an insulator 130*a* over the layer 242*a*, and a conductor 120*a* over the insulator 130*a*. At least part of the conductor 120*a* is preferably positioned so as to overlap with the layer 242*a* with the insulator 130*a* therebetween. The conductor 240*a* is positioned over and in contact with the conductor 120*a*. The capacitor 100*b* includes the layer 242*c* (a region of the oxide 230 that functions as the one of the source and the drain of the transistor 200*b*), the insulator 130*b* over the layer 242*c*, and the conductor 120*b* over the insulator 130*b*. The conductor 120*b* is preferably positioned such that at least part of the conductor 120*b* overlaps with the layer 242*b* with the insulator 130*b* therebetween. The conductor 240*c* is positioned over and in contact with the conductor 120*b*. The insulator 130*a* and the insulator 130*b* may be hereinafter collectively referred to as an insulator 130. The conductor 120*a* and the conductor 120*b* may be hereinafter collectively referred to as a conductor 120.

In the capacitor 100*a*, the layer 242*a* functions as one electrode and the conductor 120*a* functions as the other electrode. The insulator 130*a* functions as a dielectric of the capacitor 100*a*. Here, the layer 242*a* has a function of the one of the source and the drain of the transistor 200*a* and one electrode of the capacitor 100*a*, and functions as the node N. The conductor 240*a* is electrically connected to a conductor that corresponds to the wiring VL.

In the capacitor 100*b*, the layer 242*c* functions as one electrode and the conductor 120*b* functions as the other electrode. The insulator 130*b* functions as a dielectric of the capacitor 100*b*. Here, the layer 242*c* functions as the one of the source and the drain of the transistor 200*b* and one electrode of the capacitor 100*b*, and functions as the node N. The conductor 240*c* is electrically connected to a conductor that corresponds to the wiring VL.

Although the insulator 130*a* and the insulator 130*b* are illustrated as having a multilayer structure in FIG. 9 and the like, the insulator 130*a* and the insulator 130*b* may have a single-layer structure as illustrated in FIG. 10. In the structure illustrated in FIG. 9, the conductors 740*a* and 740*b* are positioned close to each other; however, the conductors 740*a* and 740*b* may be provided so as to be apart from each other as illustrated in FIG. 10. The conductor 240*a* and the conductor 240*c* electrically connected to the wiring VL embedded in the insulator 280 and the like can be omitted as illustrated in FIG. 10 when the one electrode of the capacitor 100*a* and the one electrode of the capacitor 100*b* also function as the conductor 240*a* and the conductor 240*c*. FIG.

10 illustrates a structure in which the wiring BL is positioned perpendicular to the wirings WLa and WLb.

Figure 16A:
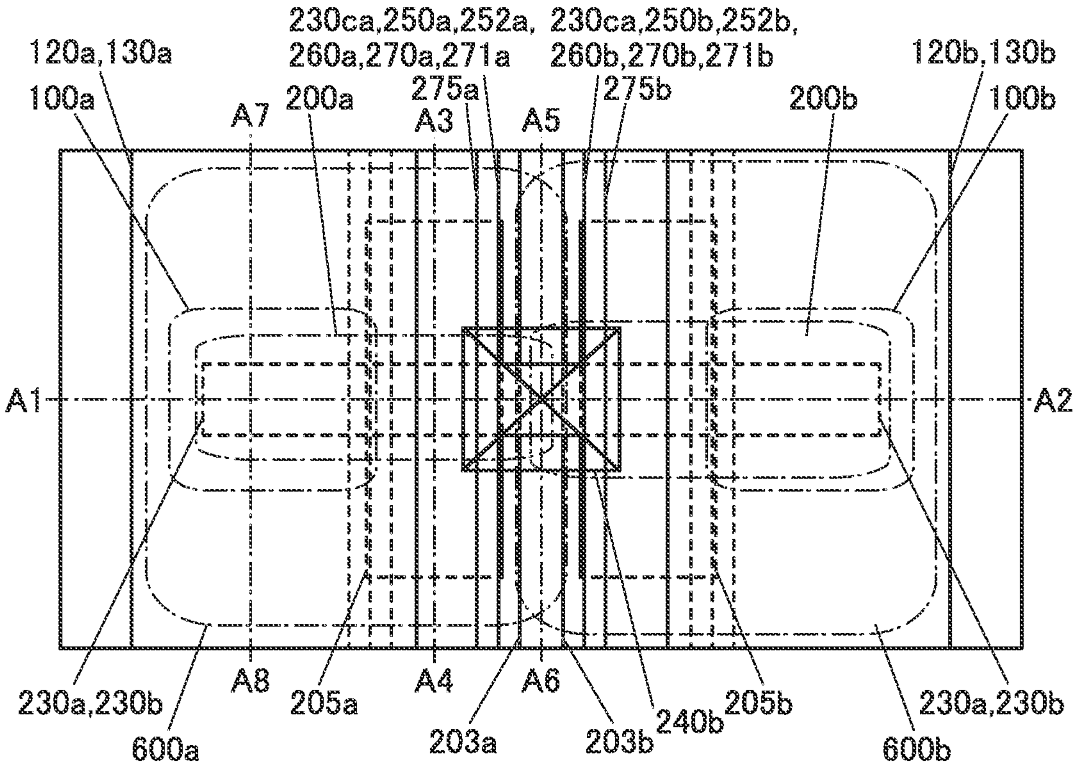
FIGS. 16A-16B A top view and a cross-sectional view illustrating a structure example of a semiconductor device.
Figure 16B:
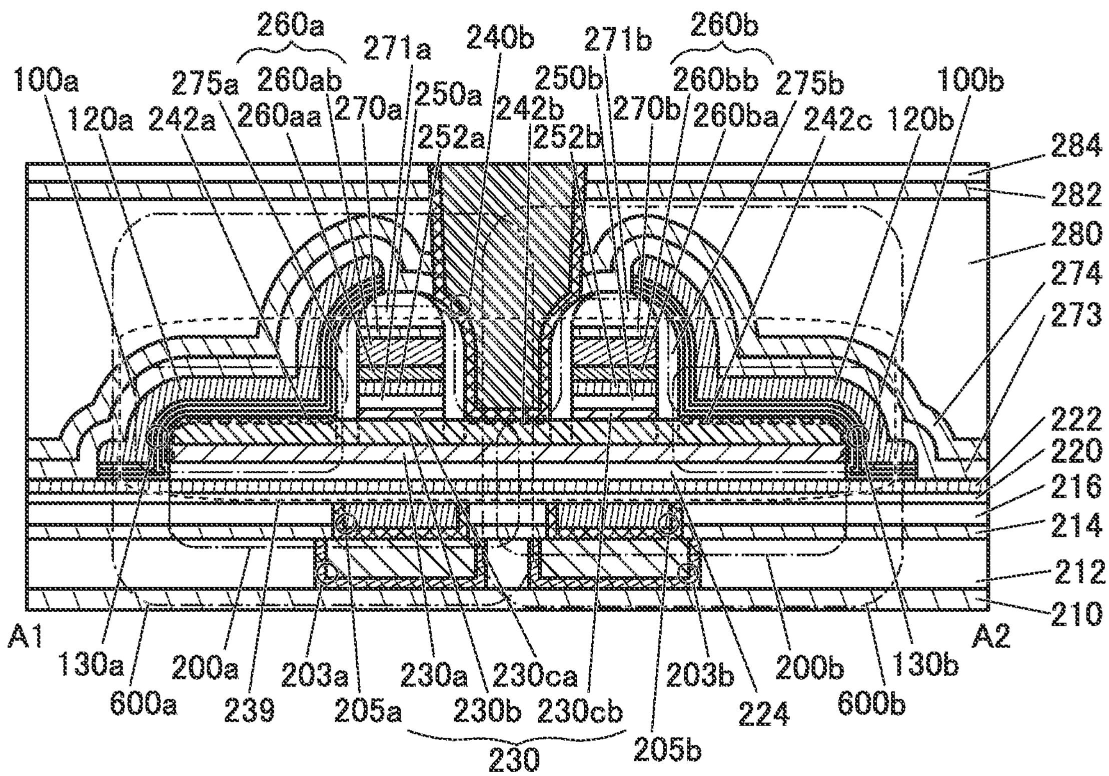

Although the conductor 240*a*, the conductor 240*b*, and the conductor 240*c* are positioned on a straight line in FIG. 12 and the like, the semiconductor device described in this embodiment is not limited thereto, and the conductor 240*a*, the conductor 240*b*, and the conductor 240*c* may be positioned as appropriate in accordance with the circuit arrangement and driving method of a memory cell array. The conductor 240*a* and the conductor 240*c* do not have to be provided. For example, as illustrated in FIG. 16, in the case where the conductor 120*a* and the conductor 120*b* are extended to also function as wirings, the conductor 240*a* and the conductor 240*c* do not have to be provided. Like the conductor 120*a* and the conductor 120*b*, the conductor 260*a*, the conductor 260*b*, the conductor 203*a*, and the conductor 203*b* may also function as wirings, and in that case, the conductor 260*a*, the conductor 260*b*, the conductor 203*a*, and the conductor 203*b* may be extended in the channel width direction of the transistor 200*a* or the transistor 200*b*. Although the conductor 120*a*, the conductor 120*b*, the conductor 203*a*, and the conductor 203*b*, which function as wirings, are extended in the same direction as the conductor 260*a* and the conductor 260*b* in FIG. 16, the semiconductor device described in this embodiment is not limited thereto, and the conductor 120*a*, the conductor 120*b*, the conductor 203*a*, and the conductor 203*b* may be positioned as appropriate in accordance with the circuit arrangement and driving method of a memory cell array.

Figure 17:
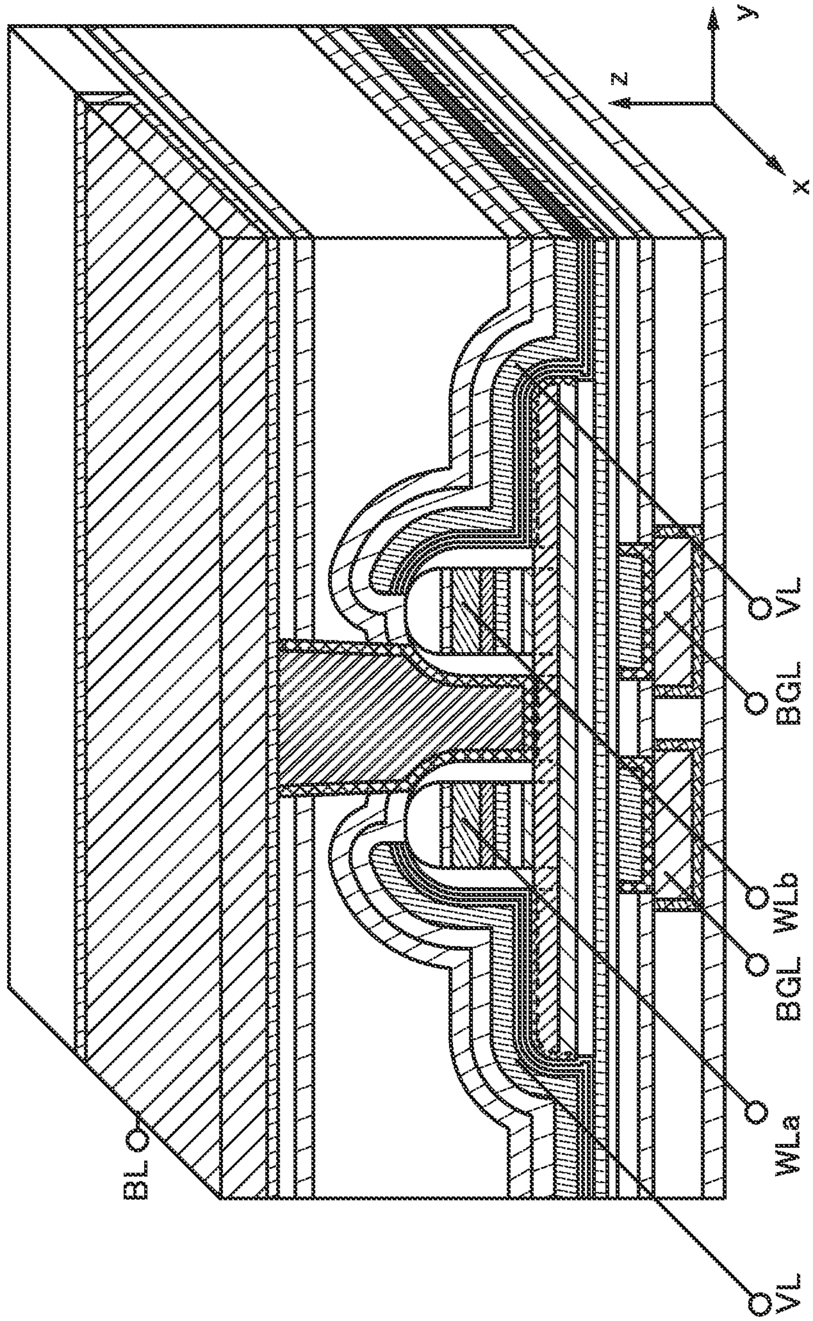
FIG. 17 A cross-sectional view illustrating a structure example of a semiconductor device.

The memory cell 600*a* and the memory cell 600*b* illustrated in FIG. 16 can have a structure in which the wiring WLa and the wiring WLb are perpendicular to the wiring BL (the x direction and the y direction in the drawing) as illustrated in FIG. 17. The wiring VL can have a structure of being provided in the direction in which the wiring WLa and the wiring WLb extend (the x direction in the drawing).

Figure 18:
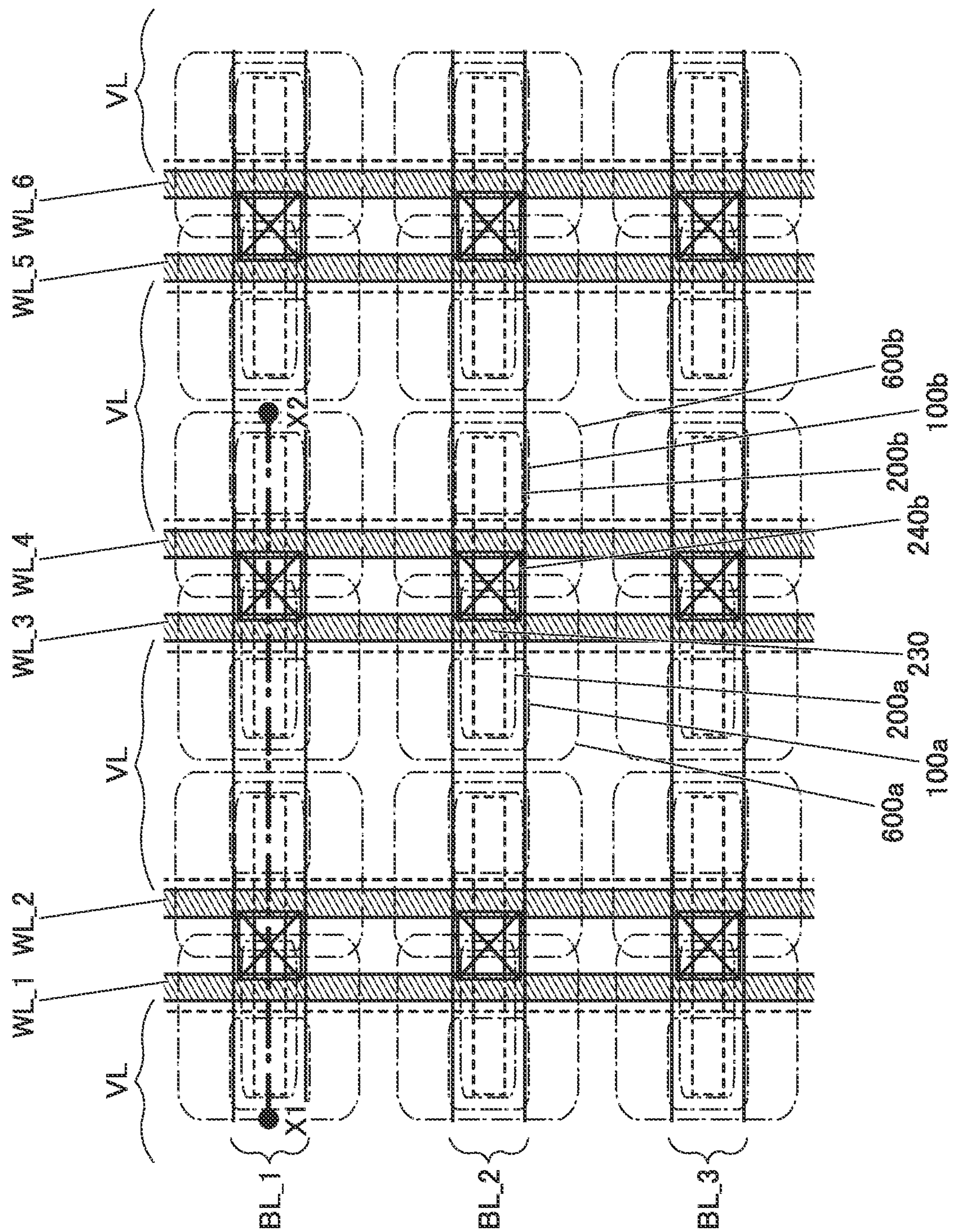
FIG. 18 A top view illustrating a structure example of a semiconductor device.

The memory cells 600*a* and the memory cells 600*b* illustrated in FIG. 16 are arranged in a matrix of three rows and three columns as in a top view illustrated in FIG. 18. The wirings obtained by extending the conductor 260 serve as the wiring WL_1 to the wiring WL_6, and the wiring obtained by extending the conductor 120 serves as the wiring VL. The wiring BL_1 to the wiring BL_3 are provided in contact with the top surface of the conductor 240*b*. The extending direction of the wiring WL_1 to the wiring WL_6 and the extending direction of the wiring BL_1 to the wiring BL_3 are substantially perpendicular to each other. The wiring VL may be provided so as to extend in the direction substantially perpendicular to the extending direction of the wiring BL_1 to the wiring BL_3. As illustrated in FIG. 18, the memory cell 600*a* and the memory cell 600*b* are arranged in a matrix, whereby the cell array illustrated in FIG. 1 and the like can be formed. Note that although FIG. 18 illustrates an example in which the memory cells 600*a* and the memory cells 600*b* are arranged in a 3×3 matrix, this embodiment is not limited thereto and the number and arrangement of the memory cells, the wirings, or the like included in the cell array are set as appropriate. Note that for simplicity of the drawing, some components illustrated in FIG. 16 are not illustrated in the top view of FIG. 18.

Figure 19:
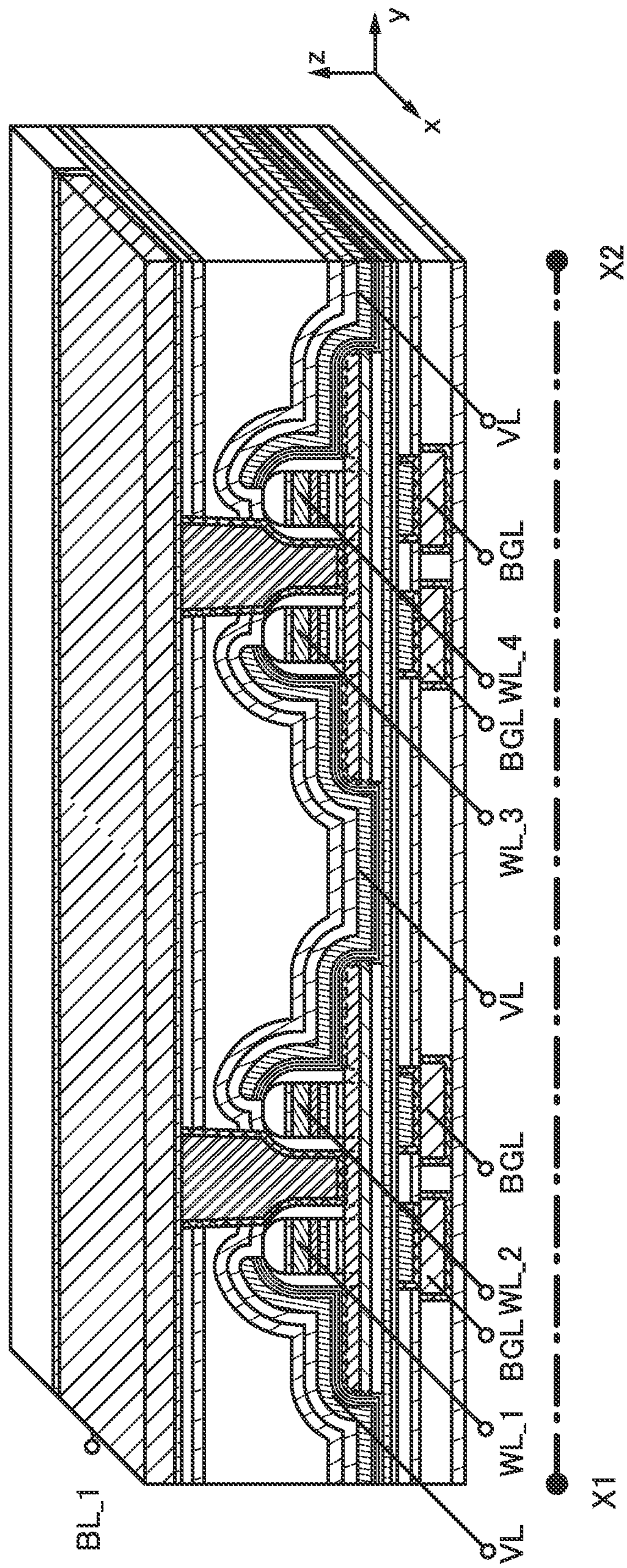
FIG. 19 A cross-sectional view illustrating a structure example of a semiconductor device.

FIG. 19 is a cross-sectional view corresponding to a portion shown by a dashed-dotted line X1-X2 in FIG. 18. As illustrated in FIG. 19, the wiring BL_1 is perpendicular to the wirings WL_1 to WL_4. In addition, as illustrated in FIG. 19, the wiring BL_1 and the wiring VL are perpendicular to each other. The wiring VL is provided to be shared between the adjacent memory cells.

Figure 20:
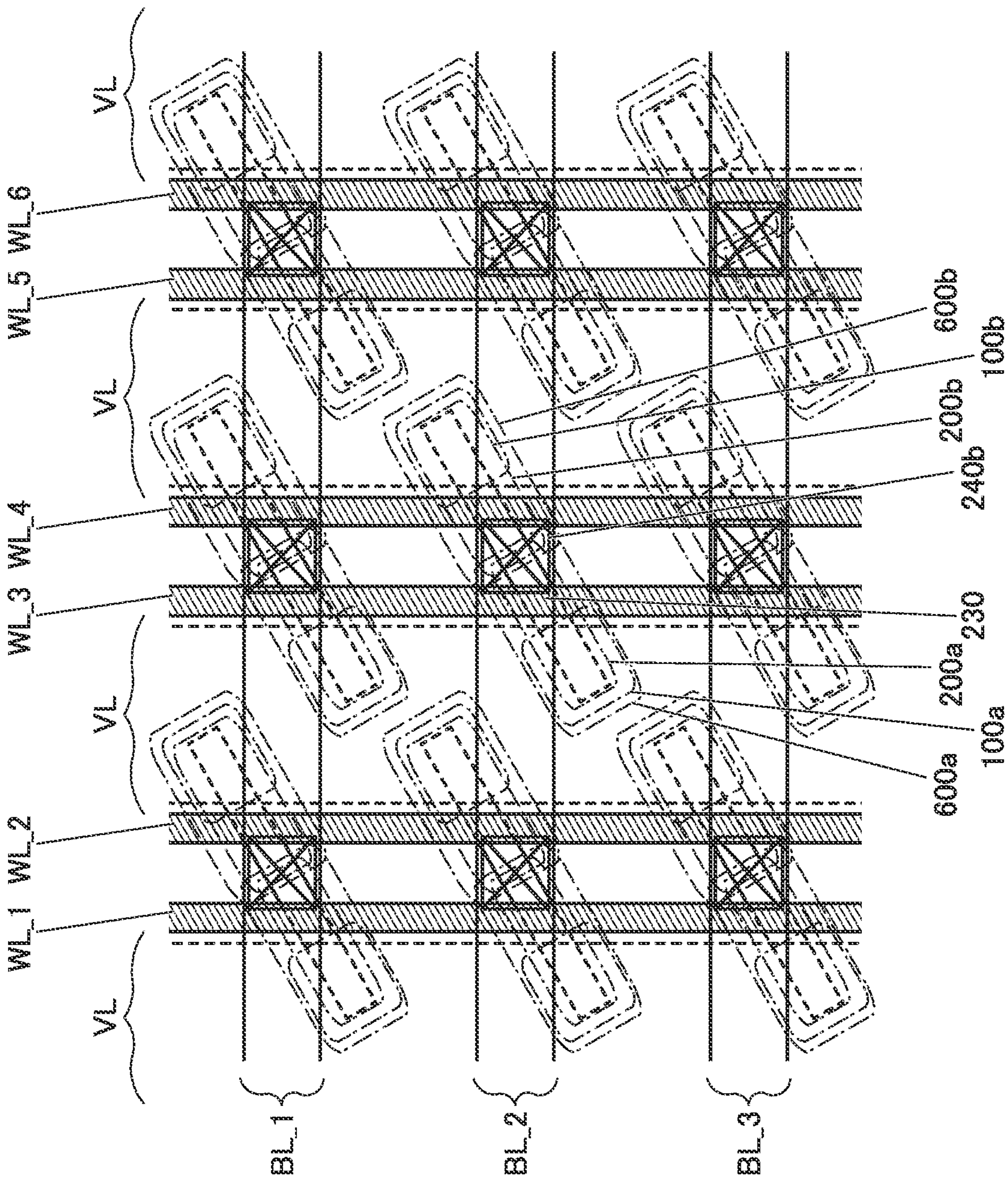
FIG. 20 A top view illustrating a structure example of a semiconductor device.

The oxides 230 and the wirings WL are provided such that, without being limited thereto, the long sides of the oxides 230 are substantially perpendicular to the extending direction of the wirings WL in FIG. 18. For example, a layout may be employed in which the long sides of the oxides 230 are positioned not perpendicular to the extending direction of the wirings WL but so as to be inclined with respect to the extending direction of the wirings WL as illustrated in FIG. 20. For example, the oxides 230 and the wirings WL are provided such that an angle formed between the long side of the oxide 230 and the extending direction of the wirings WL is greater than or equal to 20° and less than or equal to 70°, preferably greater than or equal to 30° and less than or equal to 60°.

In this manner, the oxides 230 are positioned so as to be inclined with respect to the extending direction of the wirings WL, whereby the memory cells can be densely arranged in some cases. Thus, the area occupied by the memory cell array can be reduced, leading to high integration of the semiconductor device, in some cases.

As illustrated in FIG. 12(A), part of the capacitor 100*a* is formed so as to overlap with the transistor 200*a*, and part of the capacitor 100*b* is formed so as to overlap with the transistor 200*b*. Accordingly, the total projected area of the transistor 200*a*, the transistor 200*b*, the capacitor 100*a*, and the capacitor 100*b* can be reduced, so that the area occupied by the memory cell 600*a* and the memory cell 600*b* can be reduced. Thus, the semiconductor device can be easily miniaturized and highly integrated. Furthermore, the transistor 200*a*, the transistor 200*b*, the capacitor 100*a*, and the capacitor 100*b* can be formed in the same process, which can shorten the process and improve productivity.

The one of the source and the drain of the transistor 200*a* and the one of the source and the drain of the transistor 200*b* are electrically connected to the conductor 240*b* through the layer 242*b*. Accordingly, a contact portion with the wiring BL is shared by the transistor 200*a* and the transistor 200*b*, resulting in a reduction in the number of plugs and contact holes for connecting the transistor 200*a* and the transistor 200*b* to the wiring BL. Thus sharing a wiring electrically connected to one of the source and the drain of each of the transistors can further reduce the area occupied by the memory cell array.

Although the transistor 200*a*, the transistor 200*b*, the capacitor 100*a*, and the capacitor 100*b* are provided such that the channel length direction of the transistor 200*a* and the channel length direction of the transistor 200*b* are parallel to each other in the memory cell 600*a* and the memory cell 600*b*, the semiconductor device described in this embodiment is not limited thereto. The memory cell 600*a* and the memory cell 600*b* illustrated in FIG. 1 and the like are a configuration example of the semiconductor device, and the transistors having appropriate structures are positioned as appropriate depending on a circuit configuration or a driving method.

Next, the details of the oxide 230 functioning as semiconductor layers of the transistor 200*a* and the transistor 200*b* will be described. In the following description, for the oxide 730 of the transistor 700, the description of the oxide 230 is referred to, unless otherwise specified. In the transistor 200*a* and the transistor 200*b*, a metal oxide functioning as an oxide semiconductor (hereinafter also referred to as an oxide semiconductor) is preferably used as the oxide 230 (the oxide 230*a*, the oxide 230*b*, the oxide 230*ca*, and the oxide 230*cb*), which includes a region where a channel is formed (hereinafter also referred to as a channel formation region).

The transistor 200 using an oxide semiconductor in its channel formation region has an extremely low leakage current in an off state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 230, an In—Ga oxide or an In—Zn oxide may be used.

Besides the constituent element of the oxide semiconductor, a metal element such as aluminum, ruthenium, titanium, tantalum, chromium, or tungsten is added to the oxide semiconductor, whereby the oxide semiconductor forms a metal compound to have reduced resistance. Note that aluminum, titanium, tantalum, tungsten, or the like is preferably used.

To add a metal element to the oxide semiconductor, for example, a metal film containing the metal element, a nitride film containing the metal element, or an oxide film containing the metal element is provided over the oxide semiconductor. By providing the film, some oxygen at the interface of the film and the oxide semiconductor or in the oxide semiconductor in the vicinity of the interface may be absorbed into the film or the like and an oxygen vacancy may be formed, so that the resistance in the vicinity of the interface may be reduced.

After the metal film, the nitride film containing the metal element, or the oxide film containing the metal element is provided over the oxide semiconductor, heat treatment is preferably performed in an atmosphere containing nitrogen. By the heat treatment in an atmosphere containing nitrogen, the metal element contained in the metal film, the nitride film containing the metal element, or the oxide film containing the metal element diffuses into the oxide semiconductor, or the metal element contained in the oxide semiconductor diffuses into the film, whereby the oxide semiconductor forms a metal compound with the film to have reduced resistance. The metal element added to the oxide semiconductor is brought into a relatively stable state when the oxide semiconductor and the metal element form a metal compound; thus, a highly reliable semiconductor device can be provided.

At the interface between the oxide semiconductor and the metal film, the nitride film containing the metal element, or the oxide film containing the metal element, a compound layer (also referred to as another layer) may be formed. Note that the compound layer (another layer) is a layer containing a metal compound containing a component of the metal film, the nitride film containing the metal element, or the oxide film containing the metal element and a component of the oxide semiconductor. For example, as the compound layer, a layer where the metal element of the oxide semiconductor and the metal element added are alloyed may be formed. The alloyed layer is in a relatively stable state; therefore, a highly reliable semiconductor device can be provided.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor or a region where the metal compound is formed tends to be further reduced, and the oxide semiconductor whose resistance is not reduced tends to be highly purified (reduction of impurities such as water or hydrogen) to have increased resistance.

The oxide semiconductor has an increased carrier density when an impurity element such as hydrogen or nitrogen exists therein. Hydrogen in the oxide semiconductor reacts with oxygen bonded to a metal atom, to be water, and thus, forms an oxygen vacancy in some cases. Entry of hydrogen into the oxygen vacancy increases carrier density. Furthermore, in some cases, part of hydrogen is bonded to oxygen bonded to a metal atom, whereby an electron serving as a carrier is generated. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be provided in the oxide semiconductor. In other words, when the resistance of the oxide 230 is selectively reduced, a region functioning as a semiconductor having a low carrier density and low-resistance region functioning as the source region or the drain region can be provided in the oxide 230 obtained by processing into an island shape.

Figure 15:
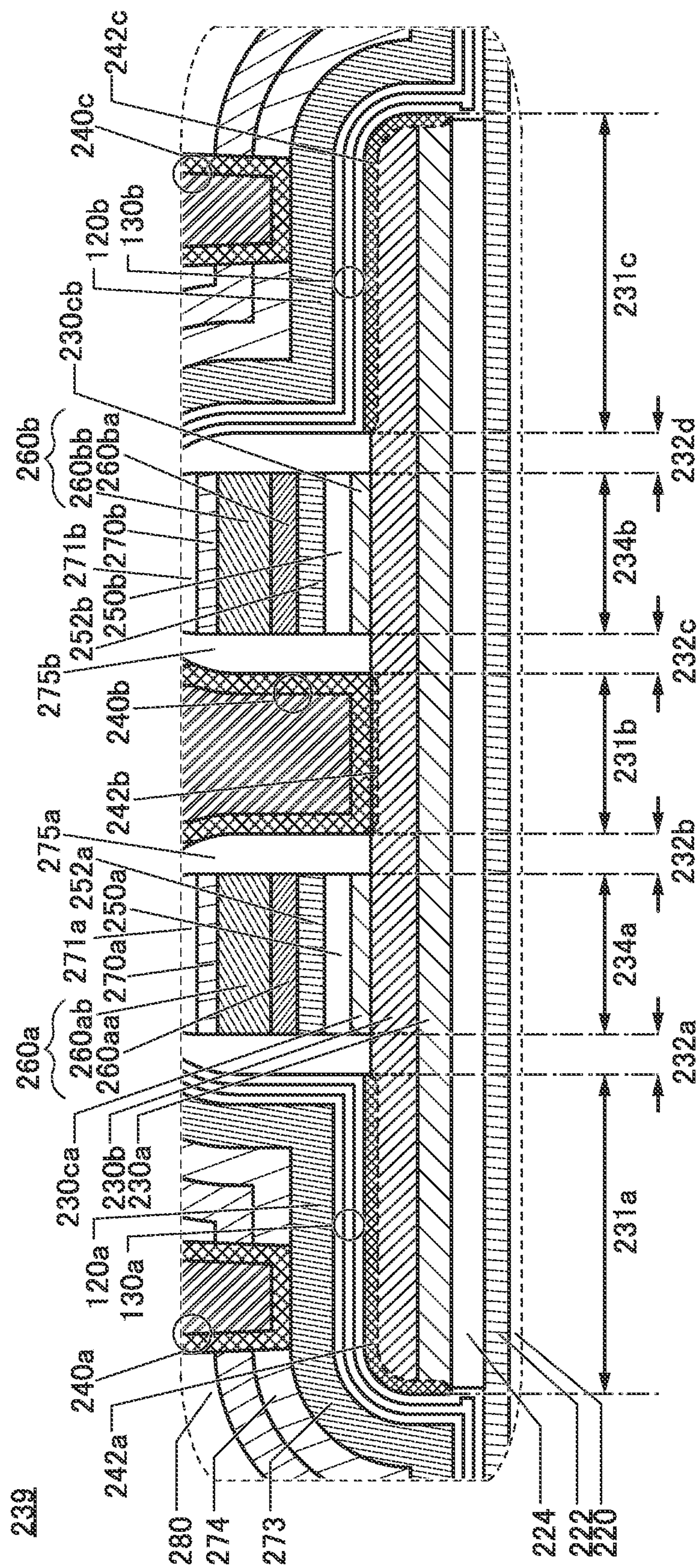
FIG. 15 A cross-sectional view illustrating a structure example of a semiconductor device.

Here, FIG. 15 illustrates an enlarged view of a region 239 surrounded by a dashed line in FIG. 12(B). As illustrated in FIG. 15, the region 239 includes the oxide 230*b* whose resistance is selectively reduced.

As illustrated in FIG. 15, the oxide 230 includes a region 234*a*, a region 234*b*, a region 231*a*, a region 231*b*, a region 231*c*, a region 232*a*, a region 232*b*, a region 232*c*, and a region 232*d*. Here, the region 234*a* functions as a channel formation region of the transistor 200*a*, and the region 234*b* functions as a channel formation region of the transistor 200*b*. The region 231*a* functions as one of a source region and a drain region of the transistor 200*a*, the region 231*b* functions as the other of the source region and the drain region of the transistor 200*a* and one of a source region and a drain region of the transistor 200*b*, and the region 231*c* functions as the other of the source region and the drain region of the transistor 200*b*. The region 232*a* is positioned between the region 234*a* and the region 231*a*, the region 232*b* is positioned between the region 234*a* and the region 231*b*, the region 232*c* is positioned between the region 234*b* and the region 231*b*, and the region 232*d* is positioned between the region 234*b* and the region 231*c*. The region 234*a* and the region 234*b* may be hereinafter collectively referred to as a region 234. The region 231*a*, the region 231*b*, and the region 231*c* may be hereinafter collectively referred to as a region 231. The region 232*a*, the region 232*b*, the region 232*c*, and the region 232*d* may be collectively referred to as a region 232.

The insulator 130*a* and the conductor 120*a* are provided over the region 231*a*, and the region 231*a* functions as the one electrode of the capacitor 100*a*. An insulator 130*b* and a conductor 120*b* are provided over the region 231*c*, and the region 231*c* functions as the one electrode of the capacitor 100*b*. The region 231 of the oxide 230 has reduced resistance and is a conductive oxide. Thus, the region 231 of the oxide 230 can function as the one electrode of the capacitor 100.

The region 231 functioning as the source region or the drain region is a region with a low oxygen concentration and reduced resistance. The region 234 functioning as the channel formation region is a high-resistance region having a higher oxygen concentration and a lower carrier density than the region 231 functioning as the source region or the drain region. The region 232 has a higher oxygen concentration and a lower carrier density than the region 231 functioning as the source region or the drain region and has a lower oxygen concentration and a higher carrier density than the region 234 functioning as the channel formation region.

The concentration of at least one of a metal element and an impurity element such as hydrogen and nitrogen in the region 231 is preferably higher than those in the region 232 and the region 234.

For example, in addition to the oxide 230, the region 231 preferably contains one or more metal elements selected from aluminum, ruthenium, titanium, tantalum, tungsten, chromium, and the like.

In order to form the region 231, for example, a film containing the metal element is formed in contact with the region 231 of the oxide 230. The film containing the metal element is removed by etching treatment or the like after the region 231 is formed. Note that as the film containing the metal element, a metal film, an oxide film containing a metal element, or a nitride film containing a metal element can be used. In that case, the layer 242 is preferably formed between the oxide 230 and the film containing the metal element. For example, the layer 242 may be formed on the top surface and the side surface of the oxide 230. Note that the layer 242 is a layer containing a metal compound containing a component of the film containing the metal element and a component of the oxide 230, and can also be referred to as a compound layer. For example, as the layer 242, a layer in which the metal element of the oxide 230 and the metal element added are alloyed may be formed.

Addition of the metal element to the oxide 230 can form a metal compound in the oxide 230, and the resistance of the region 231 can be reduced. Note that the metal compound does not have to be formed in the oxide 230. For example, the layer 242 may be formed on a surface of the oxide 230 or may be formed between the oxide 230 and the insulator 130.

Thus, the region 231 includes a low-resistance region of the layer 242 in some cases. For this reason, at least part of the layer 242 can function as the source region or the drain region of the transistor 200*a* or the transistor 200*b*. Here, the layer 242 is formed in the region 231*a*, the region 231*b*, and the region 231*c* to be the layer 242*a*, the layer 242*b*, and the layer 242*c*.

The region 232 includes a region overlapping with the insulator 275. The concentration of at least one of metal elements such as aluminum, ruthenium, titanium, tantalum, tungsten, and chromium and impurity elements such as hydrogen and nitrogen in the region 232 is preferably higher than that in the region 234. For example, when the film containing the metal element is provided in contact with the region 231 of the oxide 230, a component of the film containing the metal element and a component of the oxide semiconductor form a metal compound in some cases. The metal compound attracts hydrogen contained in the oxide 230 in some cases. Thus, the hydrogen concentration of the region 232 in the vicinity of the region 231 may be increased.

One or both of the region 232*a* and the region 232*b* may have a structure including a region overlapping with the conductor 260*a*. With such a structure, the conductor 260*a* can overlap with the region 232*a* and the region 232*b*. Similarly, one or both of the region 232*c* and the region 232*d* may have a structure including a region overlapping with the conductor 260*b*. With such a structure, the conductor 260*b* can overlap with the region 232*c* and the region 232*d*.

Although the region 234, the region 231, and the region 232 are formed in the oxide 230*b* in FIG. 15, they are not necessarily formed in the oxide 230*b*. Alternatively, these regions may also be formed in the layer 242, the oxide 230*a*, and the oxide 230*c*, for example. Furthermore, although the boundaries between the regions are shown substantially perpendicular to the top surface of the oxide 230 in FIG. 15, this embodiment is not limited thereto. For example, the region 232 may project to the conductor 260 side in the vicinity of the surface of the oxide 230*b*, and the region 232 may recede to the conductor 240*a* side or the conductor 240*b* side in the vicinity of the bottom surface of the oxide 230*b*.

In the oxide 230, the boundaries between the regions are difficult to be clearly observed in some cases. The concentration of a metal element and impurity elements such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

In order to selectively reduce the resistance of the oxide 230, at least one of an impurity and metal elements that increase conductivity, such as aluminum, ruthenium, titanium, tantalum, tungsten, and chromium, is added to a desired region. As the impurity, an element that forms an oxygen vacancy, an element trapped by an oxygen vacancy, or the like is used. Examples of the element include hydrogen, boron, carbon, nitrogen, fluorine, phosphorus, sulfur, chlorine, and a rare gas. Typical examples of the rare gas element are helium, neon, argon, krypton, and xenon.

When the content of the metal element that increases conductivity, the element that forms an oxygen vacancy, and the element trapped by an oxygen vacancy in the region 231 is increased, the carrier density is increased and the resistance can be reduced.

In order to reduce the resistance of the region 231, for example, the film containing the metal element is preferably formed in contact with the region 231 of the oxide 230. As the film containing the metal element, a metal film, an oxide film containing a metal element, a nitride film containing a metal element, or the like can be used. The film containing the metal element is preferably provided over the oxide 230 with at least the insulator 250, the metal oxide 252, the conductor 260, the insulator 270, the insulator 271, and the insulator 275 therebetween.

When the oxide 230 and the film containing the metal element are in contact with each other, a component of the film containing the metal element and a component of the oxide 230 form a metal compound, whereby the region 231 is formed to have low resistance. Oxygen in the oxide 230 positioned at or in the vicinity of the interface between the oxide 230 and the film containing the metal element is partly absorbed in the layer 242; thus, oxygen vacancies are formed in the oxide 230 and the region 231 with reduced resistance is formed, in some cases.

Heat treatment is preferably performed in an atmosphere containing nitrogen in the state where the oxide 230 is in contact with the film containing the metal element. By the heat treatment, the metal element which is a component of the film containing the metal element is diffused from the film containing the metal element into the oxide 230, or the metal element which is a component of the oxide 230 is diffused into the film containing the metal element, and the oxide 230 and the film containing the metal element form a metal compound to have low resistance. In this manner, the layer 242 is formed between the oxide 230 and the film containing the metal element. Here, the film containing the metal element is provided over the oxide 230 with the insulator 250, the metal oxide 252, the conductor 260, the insulator 270, the insulator 271, and the insulator 275 therebetween; thus, the layer 242 is formed in a region of the oxide 230 that does not overlap with the conductor 260*a*, the conductor 260*b*, the insulator 275*a*, and the insulator 275*b*. At this time, the metal element of the oxide 230 may be alloyed with the metal element of the film containing the metal element. Thus, the layer 242 may contain an alloy. The alloy is in a relatively stable state, so that a highly reliable semiconductor device can be provided.

The heat treatment is performed, for example, at higher than or equal to 250° C. and lower than or equal to 650° C., preferably higher than or equal to 300° C. and lower than or equal to 500° C., more preferably higher than or equal to 320° C. and lower than or equal to 450° C. The heat treatment is performed in a nitrogen or inert gas atmosphere. Alternatively, the heat treatment may be performed under a reduced pressure. Alternatively, heat treatment may be performed in a nitrogen or inert gas atmosphere, and then, heat treatment may be performed in an atmosphere containing an oxidizing gas.

In the case where hydrogen in the oxide 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the resistance of the region 231 is further reduced, and the region 234 is highly purified (reduction of impurities such as water or hydrogen) and the resistance of the region 234 is further increased.

In contrast, since regions (the region 234 and the region 232) of the oxide 230 overlapping with the conductor 260 and the insulator 275 are covered by the conductor 260 and the insulator 275, addition of a metal element to the regions is inhibited. Furthermore, oxygen atoms in the oxide 230 are inhibited from being absorbed into the film containing the metal element in the region 234 and the region 232 of the oxide 230.

An oxygen vacancy is sometimes formed in the region 231 and the region 232 due to absorption of oxygen in the region 231 of the oxide 230 and the region 232 of the oxide 230 adjacent to the region 231 into the film containing the metal element. Entry of hydrogen in the oxide 230 into the oxygen vacancy increases the carrier density of the region 231 and the region 232. Therefore, the resistance of the region 231 and the region 232 of the oxide 230 becomes low.

In the case where the film containing the metal element has a property of absorbing hydrogen, hydrogen in the oxide 230 is absorbed into the layer. Thus, hydrogen, which is an impurity in the oxide 230, can be reduced. The film containing the metal element may be removed with hydrogen absorbed from the oxide 230 in a later step.

Note that the film containing the metal element does not have to be removed. For example, in the case where the film containing the metal element is insulated and the resistance thereof is increased, the film containing the metal element may be left. For example, the film containing the metal element is oxidized to be an insulator and have increased resistance by oxygen absorbed from the oxide 230, in some cases. In that case, the film containing the metal element may function as an interlayer film.

For example, in the case where a region having conductivity remains in the film containing the metal element, heat treatment is performed to oxidize the region having conductivity, whereby the film containing the metal element becomes a high-resistance insulator. The heat treatment is preferably performed in an oxidizing atmosphere, for example. In the case where a structure body containing oxygen is provided in the vicinity of the film containing the metal element, performing heat treatment may cause a reaction between the film containing the metal element and oxygen contained in the structure body, oxidizing the film containing the metal element.

When the film containing the metal element is left as an insulator, the film containing the metal element can function as an interlayer film and a dielectric of the capacitor 100. In the case where such a structure is employed, the film containing the metal element is formed to have a thickness that allows the film to become an insulator in a later step. For example, the film containing the metal element is formed to have a thickness greater than or equal to 0.5 nm and less than or equal to 5 nm, preferably greater than or equal to 1 nm and less than or equal to 2 nm. Note that in the case where heat treatment is performed in the above oxidizing atmosphere, it is preferable that the heat treatment be performed after heat treatment is performed once in an atmosphere containing nitrogen in the state where the oxide 230 and the film containing the metal element are in contact with each other. By performing heat treatment once in an atmosphere containing nitrogen, oxygen in the oxide 230 is easily diffused into the film containing the metal element.

In the case where the film containing the metal element has sufficient conductivity after the layer 242 is formed, part of the film containing the metal element may be removed and a conductor functioning as the source electrode or the drain electrode of the transistor 200 may be formed. When the thickness of the film containing the metal element is sufficiently large, for example, approximately greater than or equal to 10 nm and less than or equal to 200 nm, sufficient conductivity can be given to the conductor functioning as the source electrode or the drain electrode. The conductor functioning as the source electrode or the drain electrode may be an oxide film containing a metal element or a nitride film containing a metal element.

Although a method where the layer 242 is formed by providing the film containing the metal element in contact with the region 231 of the oxide 230 is described above as a method for forming the region 231 and the region 232, this embodiment is not limited thereto. For example, the layer 242 may be formed by adding as a dopant an element that can increase the carrier density of the oxide 230 and reduce the resistance thereof.

As the dopant, an element that forms an oxygen vacancy, an element that is bonded to an oxygen vacancy, or the like is used. Typical examples of the element include boron and phosphorus. Moreover, hydrogen, carbon, nitrogen, fluorine, sulfur, chlorine, titanium, a rare gas, or the like may be used. Typical examples of a rare gas element include helium, neon, argon, krypton, and xenon. Furthermore, any one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as a dopant. In the case where boron or phosphorus is used as a dopant, manufacturing line apparatuses for amorphous silicon or low-temperature polysilicon can be used; thus, capital investment can be reduced. The concentration of the above element is measured by secondary ion mass spectrometry (SIMS) or the like.

In particular, an element that easily forms an oxide is preferably used as an element to be added to the layer 242. Typical examples of the element include boron, phosphorus, aluminum, and magnesium. The element added to the layer 242 can deprive oxygen in the oxide 230 to form an oxide. As a result, many oxygen vacancies are generated in the layer 242. When the oxygen vacancies and hydrogen in the oxide 230 are bonded to each other, carriers are generated, and accordingly, a region with extremely low resistance is formed. The element added to the layer 242 is present in the state of a stable oxide in the layer 242; thus, even when it is subjected to treatment that requires a high temperature in a later step, the element is not easily released from the layer 242. That is, the use of an element that easily form an oxide as an element to be added to the layer 242 enables formation of a region whose resistance is not easily increased even through a high-temperature process, in the oxide 230.

In the case where the layer 242 is formed by addition of a dopant, the dopant is added using the insulator 271, the insulator 270, the conductor 260, the metal oxide 252, the insulator 250, the oxide 230*c*, and the insulator 275 as masks. In that case, the layer 242 containing the element can be formed in a region of the oxide 230 that does not overlap with the masks. Instead of using the insulator 271, the insulator 270, the conductor 260, the metal oxide 252, the insulator 250, the oxide 230*c*, and the insulator 275 as masks, dummy gates may be formed to serve as masks. In that case, after the addition of the dopant, the insulator 271, the insulator 270, the conductor 260, the metal oxide 252, the insulator 250, the oxide 230*c*, and the insulator 275 are formed.

As a method for adding a dopant, an ion implantation method in which an ionized source gas is subjected to mass separation and then added, an ion doping method in which an ionized source gas is added without mass separation, a plasma immersion ion implantation method, or the like can be used. In the case of performing mass separation, ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, a donor, an acceptor, an impurity, an element, or the like.

By adding an element that forms an oxygen vacancy to the layer 242 and performing heat treatment, hydrogen contained in the region 234 functioning as a channel formation region can be trapped by an oxygen vacancy included in the layer 242, in some cases. Thus, the transistor 200 can have stable electrical characteristics and increased reliability.

A transistor using an oxide semiconductor is likely to have its electrical characteristics changed by impurities and oxygen vacancies in a channel formation region of the oxide semiconductor, which may affect the reliability. Moreover, when the channel formation region of the oxide semiconductor includes oxygen vacancies, the transistor tends to have normally-on characteristics. Thus, oxygen vacancies in the region 234 where a channel is formed are preferably reduced as much as possible.

As illustrated in FIG. 15, the insulator 275 whose oxygen content is higher than that in the stoichiometric composition (also referred to as excess oxygen) is preferably provided in contact with the insulator 250, the region 232 of the oxide 230*b*, and the oxide 230*c*. That is, excess oxygen contained in the insulator 275 is diffused into the region 234 of the oxide 230, whereby the amount of oxygen vacancies in the region 234 of the oxide 230 can be reduced.

In order to provide an excess oxygen region in the insulator 275, an oxide is preferably formed by a sputtering method as the insulator 273 in contact with the insulator 275. The oxide formed by a sputtering method can be an insulator containing few impurities such as water or hydrogen. Deposition by a sputtering method is preferably performed with use of a facing-target sputtering apparatus, for example. The facing-target sputtering apparatus is preferred because deposition can be performed without exposing a deposition surface to a high electric field region between facing targets; the film-formation surface is less likely to be damaged due to plasma; thus, deposition damage to the oxide 230 during the deposition of the insulator to be the insulator 273 can be small. A deposition method using the facing-target sputtering apparatus can be referred to as VDSP (Vapor Deposition SP, a registered trademark).

During deposition by a sputtering method, ions and sputtered particles exist between a target and a substrate. For example, a potential $E_0$ is supplied to the target, to which a power source is connected. A potential $E_1$ such as aground potential is supplied to the substrate. Note that the substrate may be electrically floating. In addition, there is a region at a potential $E_2$ between the target and the substrate. The potential relationship is $E_2>E_1>E_0$.

The ions in plasma are accelerated by a potential difference $E_2-E_0$ and collide with the target, whereby the sputtered particles are ejected from the target. These sputtered particles are attached on a deposition surface and deposited thereon; as a result, a film is formed. Some ions recoil from the target and might pass through the formed film as recoil ions, and be taken into the insulator 275 in contact with the deposition surface. The ions in the plasma are accelerated by a potential difference $E_2-E_1$ and collide with the deposition surface. At this time, some ions reach the inside of the insulator 275. The ions are taken into the insulator 275 so that a region into which the ions are taken is formed in the insulator 275. That is, an excess oxygen region is formed in the insulator 275 in the case where the ions contain oxygen.

Introduction of oxygen into the insulator 275 can form an excess oxygen region in the insulator 275. The excess oxygen in the insulator 275 is supplied to the region 234 of the oxide 230 and can compensate for oxygen vacancies in the oxide 230.

As the insulator 275, silicon oxide, silicon oxynitride, silicon nitride oxide, or porous silicon oxide is preferably used. An excess oxygen region is likely to be formed in a material such as silicon oxynitride. In contrast, an excess oxygen region is less likely to be formed in the oxide 230 than in the aforementioned material such as silicon oxynitride even when an oxide film formed by a sputtering method is formed over the oxide 230. Therefore, providing the insulator 275 including an excess oxygen region in the periphery of the region 234 of the oxide 230 makes it possible to effectively supply excess oxygen in the insulator 275 to the region 234 of the oxide 230.

As the insulator 273, aluminum oxide is preferably used. When heat treatment is performed in the state where aluminum oxide is close to the oxide 230, the aluminum oxide may extract hydrogen in the oxide 230. When the layer 242 is provided between the oxide 230 and the aluminum oxide, hydrogen in the layer 242 is absorbed by the aluminum oxide and the layer 242 with reduced hydrogen may absorb hydrogen in the oxide 230. In the structure illustrated in FIG. 15, the aluminum oxide can absorb hydrogen from the layer 242*b* before the conductor 240*b* is formed. Thus, the hydrogen concentration in the oxide 230 can be lowered. When heat treatment is performed in the state where the insulator 273 and the oxide 230 are close to each other, oxygen can be supplied from the insulator 273 to the oxide 230, the insulator 224, or the insulator 222, in some cases.

When the above structures or the above steps are combined, the resistance of the oxide 230 can be selectively reduced.

In formation of a low-resistance region in the oxide 230, the resistance of the oxide 230 is lowered in a self-aligned manner with use of the conductor 260 functioning as a gate electrode and the insulator 275 as masks. Therefore, when the plurality of transistors 200 are formed simultaneously, variations in electrical characteristics of the transistors can be reduced. The channel length of the transistor 200 depends on the width of the conductor 260 or the deposition thickness of the insulator 275; the transistor 200 can be miniaturized when the conductor 260 has the minimum feature width.

Thus, by appropriately selecting the areas of the regions, a transistor having electrical characteristics that satisfy requirement for the circuit design can be easily provided.

An oxide semiconductor can be formed by a sputtering method or the like and thus can be used for a transistor included in a highly integrated semiconductor device. A transistor using an oxide semiconductor in a channel formation region has an extremely low leakage current (off-state current) in an off state; thus, a semiconductor device with low power consumption can be provided. Since the off-state current of the transistor 200 is low, a semiconductor device using the transistor 200 can retain the stored content for a long time. In other words, since refresh operation is not required or the frequency of refresh operation is extremely low, the power consumption of the semiconductor device can be sufficiently reduced.

Accordingly, a semiconductor device including a transistor with a high on-state current can be provided. A semiconductor device including a transistor with a low off-state current can be provided. A semiconductor device that has reduced variation in electrical characteristics, stable electrical characteristics, and high reliability can be provided.

A detailed structure of a layer corresponding to the layer 20 of the semiconductor device described in this embodiment will be described below. In the following description, for the detailed structure of the transistor 700, the description of the detailed structure of the transistor 200 is referred to, unless otherwise specified.

The conductor 203 extends in the channel width direction as illustrated in FIG. 12(A) and FIG. 13(A) and functions as a wiring that applies a potential to the conductor 205. The conductor 203 is preferably provided so as to be embedded in the insulator 212.

The conductor 205*a* is positioned so as to overlap with the oxide 230 and the conductor 260*a*, and the conductor 205*b* is positioned so as to overlap with the oxide 230 and the conductor 260*b*. The conductor 205*a* and the conductor 205*b* are preferably provided over and in contact with the conductor 203*a* and the conductor 203*b*, respectively. Furthermore, the conductor 205 is preferably provided so as to be embedded in the insulator 214 and the insulator 216.

The conductor 260 may function as a first gate (also referred to as a front gate) electrode. The conductor 205 may function as a second gate (also referred to as a back gate) electrode. In that case, the threshold voltage of the transistor 200 can be controlled by changing a potential applied to the conductor 205 independently of a potential applied to the conductor 260. In particular, the threshold voltage of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

When the conductor 205 is provided over the conductor 203, the distance between the conductor 203 and the conductor 260 having functions of the first gate electrode and the wiring can be set as appropriate. That is, the insulator 214 and the insulator 216 and the like are provided between the conductor 203 and the conductor 260, whereby parasitic capacitance between the conductor 203 and the conductor 260 can be reduced, and the withstand voltage between the conductor 203 and the conductor 260 can be increased.

The reduction in the parasitic capacitance between the conductor 203 and the conductor 260 can improve the switching speed of the transistor 200, so that the transistor 200 can have high frequency characteristics. The increase in the withstand voltage between the conductor 203 and the conductor 260 can improve the reliability of the transistor 200. Therefore, the insulator 214 and the insulator 216 are preferably thick. Note that the extending direction of the conductor 203 is not limited thereto; for example, the conductor 203 may extend in the channel length direction of the transistor 200.

The conductor 205 is positioned so as to overlap with the oxide 230 and the conductor 260 as illustrated in FIG. 12(A). The conductor 205 is preferably provided larger than the region 234 of the oxide 230. In particular, as illustrated in FIG. 13(A), it is preferable that the conductor 205*a* extend beyond the end portion of the region 234*a* of the oxide 230 in the channel width direction. That is, the conductor 205*a* and the conductor 260*a* preferably overlap with each other with the insulator therebetween in the side surface of the oxide 230 in the channel width direction. Note that FIG. 13(A) illustrates the transistor 200*a*, and the same applies to the transistor 200*b*.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

In the conductor 205, a first conductor is formed in contact with an inner wall of an opening in the insulator 214 and the insulator 216 and a second conductor is formed more inward than the first conductor. The top surfaces of the first conductor and the second conductor can be substantially level with the top surface of the insulator 216. Although the first conductor of the conductor 205 and the second conductor of the conductor 205 are stacked in the transistor 200, the present invention is not limited thereto. For example, the conductor 205 may have a single-layer structure or a stacked-layer structure of three or more layers.

For the first conductor of the conductor 205 or the conductor 203, a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductive material through which the above impurities are less likely to pass) is preferably used. Alternatively, a conductive material having a function of inhibiting diffusion of oxygen (e.g., at least one of oxygen atoms, oxygen molecules, and the like) (a conductive material through which the above oxygen is less likely to pass) is preferably used. Note that in this specification, a function of inhibiting diffusion of impurities or oxygen means a function of inhibiting diffusion of any one or all of the above impurities and the above oxygen.

When the first conductor of the conductor 205 or the conductor 203 has a function of inhibiting diffusion of oxygen, the conductivity of the second conductor of the conductor 205 or the conductor 203 can be inhibited from being lowered because of oxidization. As a conductive material having a function of inhibiting diffusion of oxygen, for example, tantalum, tantalum nitride, ruthenium, ruthenium oxide is preferably used. Thus, the first conductor of the conductor 205 or the conductor 203 may be a single layer or a stack of the above conductive materials. Thus, impurities such as water and hydrogen can be inhibited from being diffused into the transistor 200 side through the conductor 203 and the conductor 205.

A conductive material containing tungsten, copper, or aluminum as its main component is preferably used for the second conductor of the conductor 205. Note that the second conductor of the conductor 205 is a single layer in the drawing but may have a stacked-layer structure; for example, the second conductor of the conductor 205 may be a stack of the above conductive material and titanium or titanium nitride.

The second conductor of the conductor 203 functions as a wiring, and thus, a conductor having higher conductivity than the second conductor of the conductor 205 is preferably used. For example, a conductive material containing copper or aluminum as its main component can be used. The second conductor of the conductor 203 may have a stacked-layer structure; for example, the second conductor of the conductor 203 may be a stack of the above conductive material and titanium or titanium nitride.

It is preferable to use copper for the conductor 203. Copper is preferably used for the wiring and the like because of its low resistance. However, copper is easily diffused; copper may reduce the electrical characteristics of the transistor 200 when diffused into the oxide 230. In view of the above, for example, a material such as aluminum oxide or hafnium oxide through which copper is hardly allowed to pass is used for the insulator 214, whereby diffusion of copper can be inhibited.

Figure 21A:
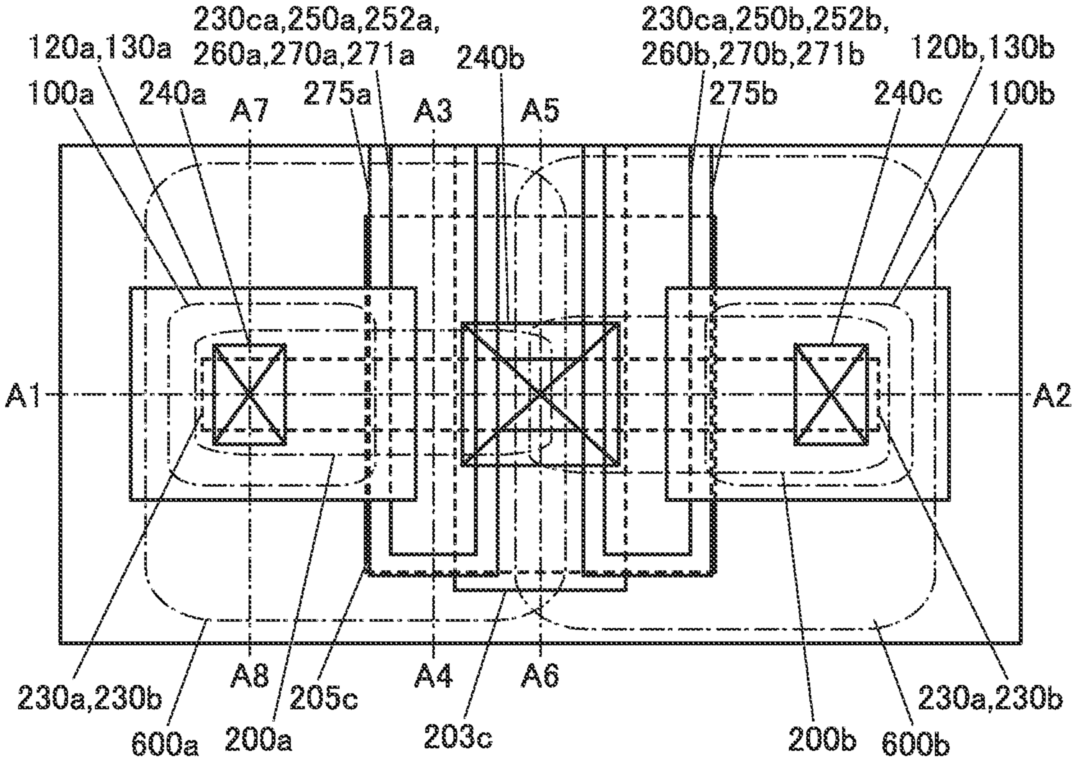
FIGS. 21A-21B A top view and a cross-sectional view illustrating a structure example of a semiconductor device.
Figure 21B:
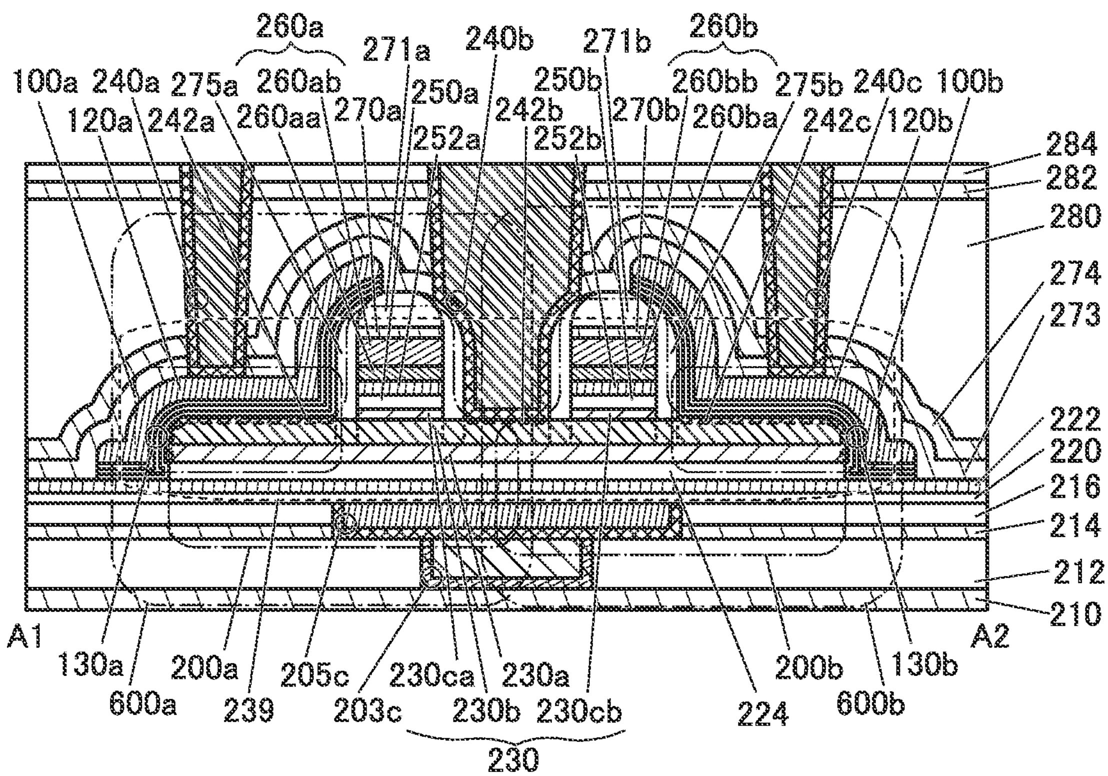

In FIG. 12 and the like, the conductor 205*a* and the conductor 205*b* that function as back gates are provided in the transistor 200*a* and the transistor 200*b*, respectively; however, the semiconductor device of this embodiment is not limited thereto. In the case where the back gates of the transistor 200*a* and the transistor 200*b* do not need to be controlled individually, the same conductive layer can double as the back gate of the transistor 200*a* and the back gate of the transistor 200*b*. For example, as illustrated in FIG. 21, a structure is employed in which the conductor 205*c* is provided instead of the conductor 205*a* and the conductor 205*b*. The conductor 205*c* functions as the back gate of the transistor 200*a* and the back gate of the transistor 200*b*. In the case where the back gates of the transistor 200*a* and the transistor 200*b* are provided separately, a space needs to be provided between the back gates so that the back gates are patterned; however, when the back gates of the transistor 200*a* and the transistor 200*b* are provided using the same conductive layer, the space does not need to be provided. Accordingly, the area occupied by the memory cell 600*a* and the memory cell 600*b* can be reduced, leading to higher integration of the semiconductor device of this embodiment. A conductor 203*c* functioning as the wiring BGL may be provided under the conductor 205*c*. The conductor 205*c* has the same structure as the conductor 205, and thus, the description of the conductor 205 can be referred to. The conductor 203*c* has the same structure as the conductor 203, and thus, the description of the conductor 203 can be referred to.

Figure 22A:
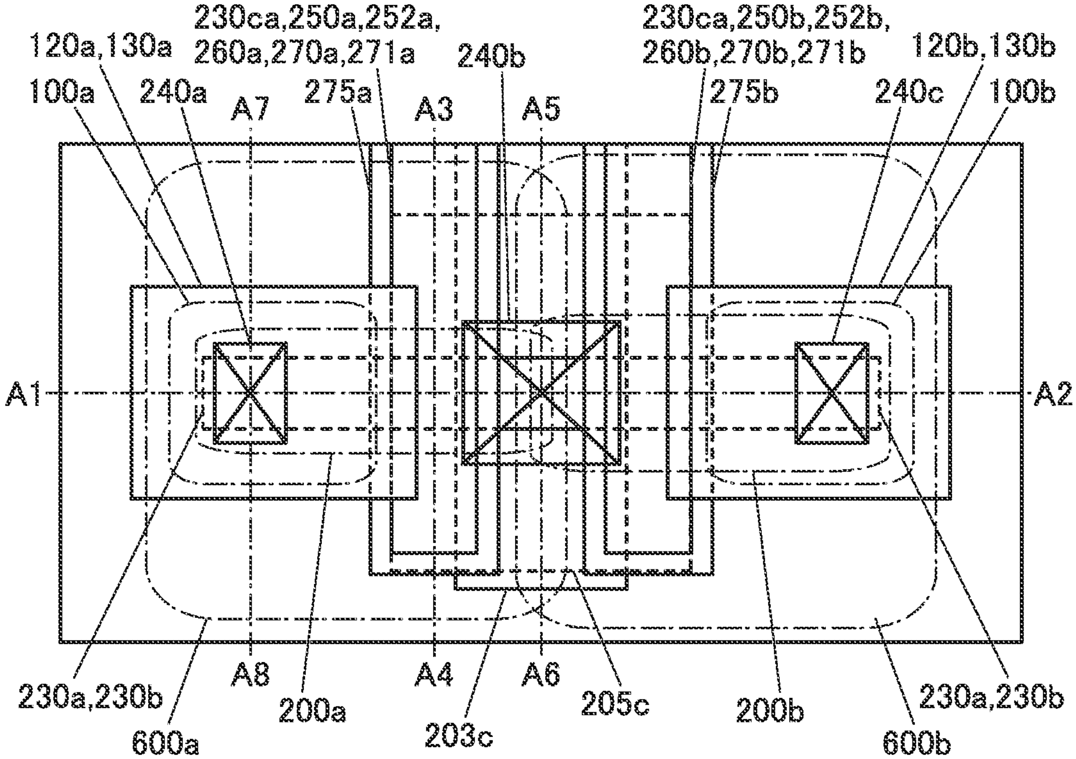
FIGS. 22A-22B A top view and a cross-sectional view illustrating a structure example of a semiconductor device.
Figure 22B:
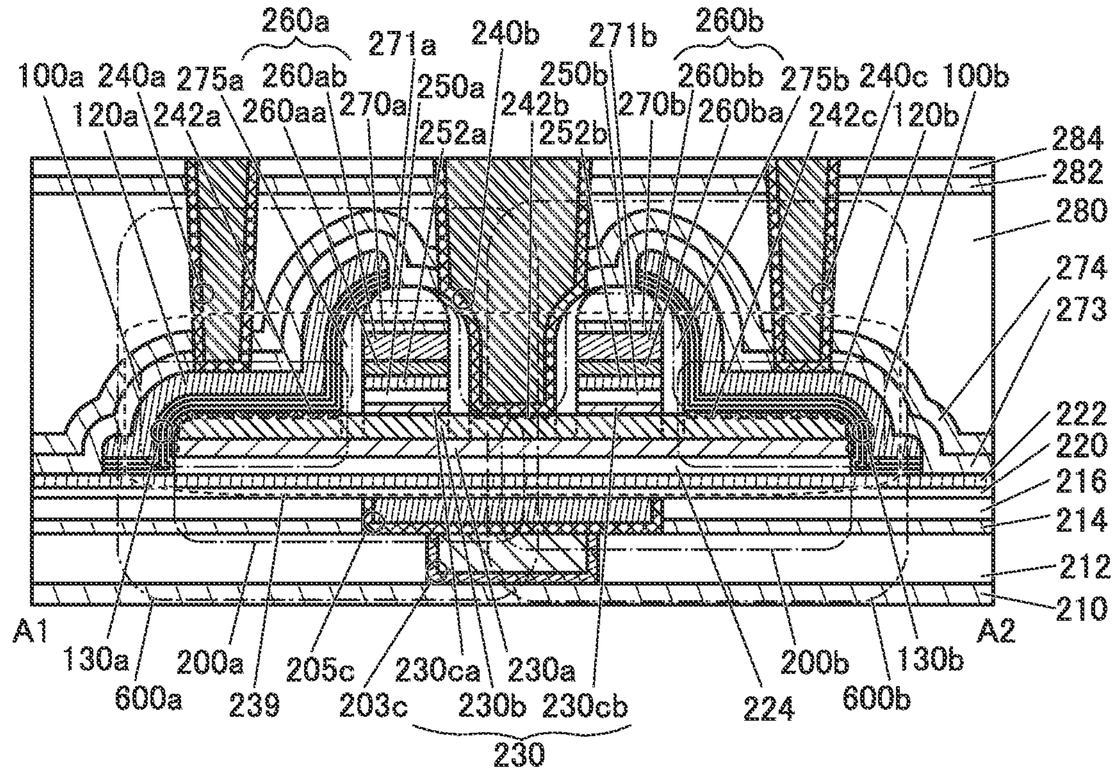

In the semiconductor device illustrated in FIG. 21, one side surface of the conductor 205*c* is positioned so as to be substantially aligned with one side surface of the insulator 275*a*, and one side surface of the conductor 205*c* is positioned so as to be substantially aligned with one side surface of the insulator 275*b*; however, the semiconductor device of this embodiment is not limited thereto. For example, as illustrated in FIG. 22, one side surface of the conductor 205*c* may be positioned so as to substantially aligned with one side surface of the conductor 260*a* and one side surface of the conductor 205*c* may be positioned so as to substantially aligned with one side surface of the conductor 260*b*. In other words, in FIG. 22, the length of the conductor 205*c* in the channel length direction of the transistor 200 is smaller than that of the conductor 205*c* illustrated in FIG. 21. As illustrated in FIG. 22, by providing the conductor 205*c*, the distance between one side surface of the conductor 205*c* and the region 231*a* and the distance between one side surface of the conductor 205*c* and the region 231*c* can be increased and thus parasitic capacitance and a leakage current generated therebetween can be reduced compared with the transistor 200*a* and the transistor 200*b* illustrated in FIG. 21.

The conductor 205, the insulator 214, and the insulator 216 are not necessarily provided. In this case, part of the conductor 203 can function as the second gate electrode.

The insulator 210, the insulator 214, and the insulator 282 preferably function as barrier insulating films for inhibiting impurities such as water or hydrogen from entering the transistor 200 from the substrate side or the insulator 284 side. Thus, for the insulator 210, the insulator 214, and the insulator 282, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass) is preferably used. Alternatively, an insulating material having a function of inhibiting diffusion of oxygen (e.g., at least one of oxygen atoms, oxygen molecules, and the like) (an insulating material through which the above oxygen is less likely to pass) is preferably used.

For example, it is preferable that aluminum oxide or the like be used for the insulator 210 and the insulator 282 and silicon nitride or the like be used for the insulator 214. This can inhibit impurities such as hydrogen and water from diffusing to the transistor 200 side from the substrate side of the insulator 210 and the insulator 214. Oxygen contained in the insulator 224 and the like can be inhibited from diffusing to the substrate side of the insulator 210 and the insulator 214. Impurities such as hydrogen and water can be inhibited from diffusing to the transistor 200 side from the substrate 284 side of the insulator 282.

Furthermore, with the structure in which the conductor 205 is stacked over the conductor 203, the insulator 214 can be provided between the conductor 203 and the conductor 205. Here, even when a metal that is easily diffused, such as copper, is used as the second conductor of the conductor 203, silicon nitride or the like provided as the insulator 214 can inhibit diffusion of the metal to a layer above the insulator 214.

The dielectric constants of the insulator 212, the insulator 216, the insulator 280, and the insulator 284 functioning as interlayer films are preferably lower than that of the insulator 210 or the insulator 214. When a material with a low dielectric constant is used for an interlayer film, the parasitic capacitance generated between wirings can be reduced.

For example, for the insulator 212, the insulator 216, the insulator 280, and the insulator 284, a single layer or a stack of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST) can be used. In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 220, the insulator 222, and the insulator 224 have a function of a gate insulator. The insulator 724 provided in the transistor 700 also has a function of a gate insulator, like the insulator 224. Although the insulator 224 and the insulator 724 are separated from each other in this embodiment, the insulator 224 and the insulator 724 may be continuous.

For the insulator 224 in contact with the oxide 230, an insulator whose oxygen content is higher than that in the stoichiometric composition is preferably used. That is, an excess oxygen region is preferably formed in the insulator 224. When such an insulator containing excess oxygen is provided in contact with the oxide 230, the amount of oxygen vacancies in the oxide 230 can be reduced, whereby the reliability of the transistor 200 can be improved.

As the insulator including an excess oxygen region, specifically, an oxide material from which part of oxygen is released by heating is preferably used. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, more preferably $2.0\times10^{19}$ atoms/$cm^3$ or greater than or equal to $3.0\times10^{20}$ atoms/$cm^3$ in thermal desorption spectroscopy (TDS) analysis. Note that the temperature range of the film surface in the TDS analysis is preferably higher than or equal to 100° C. and lower than or equal to 700° C. or higher than or equal to 100° C. and lower than or equal to 400° C.

In the case where the insulator 224 includes an excess oxygen region, it is preferable that the insulator 222 have a function of inhibiting diffusion of oxygen (e.g., at least one of oxygen atoms, oxygen molecules, and the like) (the oxygen be less likely to pass through the insulator 222).

When the insulator 222 has a function of inhibiting diffusion of oxygen, oxygen in the excess oxygen region of the insulator 224 is not diffused into the insulator 220 side and thus can be supplied to the oxide 230 efficiently. Moreover, the conductor 205 can be inhibited from reacting with oxygen in the excess oxygen region of the insulator 224.

For the insulator 222, a single layer or a stack of an insulator containing a so-called high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST) is preferably used, for example. As miniaturization and high integration of a transistor proceed, a problem such as leakage current may arise because of a reduction in the thickness of the gate insulator. When a high-k material is used for an insulator functioning as the gate insulator, a gate potential at the time of operating the transistor can be reduced while the physical thickness of the gate insulator is kept.

In particular, an insulator containing an oxide of one or both of aluminum and hafnium, which is an insulating material having a function of inhibiting diffusion of impurities, oxygen, and the like (an insulator through which the oxygen is less likely to pass) is preferably used. For the insulator containing an oxide of one or both of aluminum and hafnium, aluminum oxide, hafnium oxide, an oxide containing aluminum and hafnium (hafnium aluminate), or the like is preferably used. When the insulator 222 formed using such a material, the insulator 222 functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

It is preferable that the insulator 220 be thermally stable. For example, as silicon oxide and silicon oxynitride have thermal stability, combination of an insulator with a high-k material and the insulator 220 allows the stacked-layer structure to be thermally stable and have a high dielectric constant.

Note that the insulator 220, the insulator 222, and the insulator 224 may each have a stacked-layer structure of two or more layers. In that case, the stacked layers are not necessarily formed from the same material and may be formed from different materials.

The oxide 230 includes the oxide 230*a*, the oxide 230*b* over the oxide 230*a*, and the oxide 230*c* over the oxide 230*b*. When the oxide 230*a* is provided below the oxide 230*b*, impurities can be inhibited from being diffused into the oxide 230*b* from the structures formed below the oxide 230*a*. When the oxide 230*c* is provided over the oxide 230*b*, impurities can be inhibited from being diffused into the oxide 230*b* from the structures formed above the oxide 230*c*.

The oxide 230 preferably has a stacked-layer structure of oxides whose atomic ratio of metal elements is different. Specifically, the atomic ratio of the element M to constituent elements in the metal oxide used as the oxide 230*a* is preferably greater than that in the metal oxide used as the oxide 230*b*. Moreover, the atomic ratio of the element M to In in the metal oxide used as the oxide 230*a* is preferably greater than that in the metal oxide used as the oxide 230*b*. Moreover, the atomic ratio of In to the element M in the metal oxide used as the oxide 230*b* is preferably greater than that in the metal oxide used as the oxide 230*a*. As the oxide 230*c*, a metal oxide which can be used as the oxide 230*a* or the oxide 230*b* can be used.

The energy of the conduction band minimum of the oxide 230*a* and the oxide 230*c* is preferably higher than that of the oxide 230*b*. In other words, the electron affinity of the oxide 230*a* and the oxide 230*c* is preferably lower than that of the oxide 230*b*.

The conduction band minimum gradually changes at a junction portion of the oxide 230*a*, the oxide 230*b*, and the oxide 230*c*. In other words, the conduction band minimum at a junction portion of the oxide 230*a*, the oxide 230*b*, and the oxide 230*c* continuously changes or is continuously connected. To obtain this, the density of defect states in a mixed layer formed at an interface between the oxide 230*a* and the oxide 230*b*, and an interface between the oxide 230*b* and the oxide 230*c* is preferably made low.

Specifically, when the oxide 230*a* and the oxide 230*b* or the oxide 230*b* and the oxide 230*c* contain the same element (as a main component) in addition to oxygen, a mixed layer with a low density of defect states can be formed. For example, when the oxide 230*b* is an In—Ga—Zn oxide, it is preferable to use an In—Ga—Zn oxide, a Ga—Zn oxide, gallium oxide, or the like as the oxide 230*a* and the oxide 230*c*.

At this time, the oxide 230*b* serves as a main carrier path. When the oxide 230*a* and the oxide 230*c* have the above structure, the density of defect states at the interface between the oxide 230*a* and the oxide 230*b* and the interface between the oxide 230*b* and the oxide 230*c* can be made low. Thus, the influence of interface scattering on carrier conduction is small, and the transistor 200 can have a high on-state current The oxide 230 includes the region 231, the region 232, and the region 234. At least part of the region 231 includes a region close to the insulator 273. The region 232 includes at least a region overlapping with the insulator 275.

When the transistor 200 is brought to be an on state, the region 231*a* or the region 231*b* functions as the source region or the drain region. On the other hand, at least part of the region 234 functions as a channel formation region. When the region 232 is provided between the region 231 and the region 234, the transistor 200 can have a high on-state current and a low leakage current (off-state current) in an off state.

When the region 232 is provided in the transistor 200, high-resistance regions are not formed between the region 231 functioning as the source region and the drain region and the region 234 where a channel is formed, so that the on-state current and the mobility of the transistor can be increased. The first gate electrode (the conductor 260) does not overlap with the source region and the drain region in the channel length direction owing to the region 232; thus, formation of unnecessary capacitance between them can be suppressed. Leakage current in an off state can be reduced owing to the region 232.

Thus, through appropriate selection of the areas of the regions, a transistor having electrical characteristics necessary for a circuit design can be easily provided. For example, the transistor 200 can have a structure with a small off-state current and the transistor 700 can have a structure with a large on-state current.

As the oxide 230, a metal oxide functioning as an oxide semiconductor (hereinafter also referred to as an oxide semiconductor) is preferably used. For example, as a metal oxide to be the region 234, a metal oxide having a band gap of 2 eV or more, preferably 2.5 eV or more, is preferably used. With the use of a metal oxide having such a wide band gap, the off-state current of the transistor can be reduced.

A transistor using an oxide semiconductor has an extremely low leakage current in an off state; thus, a semiconductor device with low power consumption can be provided. An oxide semiconductor can be formed by a sputtering method or the like, and thus can be used for a transistor included in a highly integrated semiconductor device.

The insulator 250 functions as agate insulator. The insulator 250*a* is preferably positioned in contact with the top surface of the oxide 230*ca*, and the insulator 250*b* is preferably positioned in contact with the top surface of the oxide 230*cb*. The insulator 250 is preferably formed using an insulator from which oxygen is released by heating. The insulator 250 is an oxide film of which the amount of released oxygen converted into oxygen molecules is greater than or equal to $1.0\times10^{18}$ atoms/cm$^3$, preferably greater than or equal to $1.0\times10^{19}$ atoms/cm$^3$, more preferably $2.0\times10^{19}$ atoms/cm$^3$ or $3.0\times10^{20}$ atoms/cm$^3$ in thermal desorption spectroscopy (TDS analysis), for example. Note that the temperature of the film surface in the TDS analysis is preferably higher than or equal to 100° C. and lower than or equal to 700° C.

Specifically, as the insulator 250, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided, as the insulator 250, in contact with the top surface of the oxide 230*c*, oxygen can be effectively supplied from the insulator 250 to the region 234 of the oxide 230*b*. As in the insulator 224, the concentration of impurities such as water and hydrogen in the insulator 250 is preferably lowered. The thickness of the insulator 250 is preferably greater than or equal to 1 nm and less than or equal to 20 nm.

Furthermore, in order to supply excess oxygen of the insulator 250 to the oxide 230 efficiently, the metal oxide 252 may be provided. Therefore, the metal oxide 252 preferably inhibits diffusion of oxygen from the insulator 250. Provision of the metal oxide 252 that inhibits diffusion of oxygen inhibits diffusion of excess oxygen from the insulator 250 to the conductor 260. That is, reduction in the amount of excess oxygen that is supplied to the oxide 230 can be inhibited. Moreover, oxidization of the conductor 260 due to excess oxygen can be suppressed.

Note that the metal oxide 252 may function as part of the first gate. For example, an oxide semiconductor that can be used as the oxide 230 can be used as the metal oxide 252. In this case, when the conductor 260 is formed by a sputtering method, the metal oxide 252 can have a reduced electric resistance to be a conductor. Such a conductor can be referred to as an OC (Oxide Conductor) electrode.

Note that the metal oxide 252 has a function of a part of the gate insulator in some cases. Therefore, when silicon oxide, silicon oxynitride, or the like is used for the insulator 250, a metal oxide that is a high-k material with a high dielectric constant is preferably used as the metal oxide 252. Such a stacked-layer structure can be thermally stable and can have a high dielectric constant. Thus, a gate potential that is applied during operation of the transistor can be reduced while the physical thickness is kept. In addition, the equivalent oxide thickness (EOT) of an insulator functioning as the gate insulator can be reduced.

Although the metal oxide 252 in the transistor 200 is shown as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200 can be increased without a reduction in the influence of the electric field generated from the conductor 260. With the metal oxide 252 functioning as a gate insulator, the distance between the conductor 260 and the oxide 230 is kept by the physical thicknesses of the insulator 250 and the metal oxide 252, so that leakage current between the conductor 260 and the oxide 230 can be reduced. Thus, with the stacked-layer structure of the insulator 250 and the metal oxide 252, the physical distance between the conductor 260 and the oxide 230 and the intensity of electric field applied from the conductor 260 to the oxide 230 can be easily adjusted as appropriate.

Specifically, the oxide semiconductor that can be used for the oxide 230 can also be used for the metal oxide 252 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Thus, it is preferable as it is less likely to be crystallized by a thermal budget in a later step. Note that the metal oxide 252 is not an essential structure. Design is appropriately set in consideration of required transistor characteristics.

The conductor 260*a* functioning as the first gate electrode includes the conductor 260*aa* and the conductor 260*ab* over the conductor 260*aa*. The conductor 260*b* functioning as the first gate electrode includes the conductor 260*ba* and the conductor 260*bb* over the conductor 260*ba*. A conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom is preferably used for the conductor 260*a*, like the first conductor of the conductor 205. Alternatively, a conductive material having a function of inhibiting diffusion of oxygen (e.g., at least one of oxygen atoms, oxygen molecules, and the like) is preferably used.

When the conductor 260*a* has a function of inhibiting diffusion of oxygen, the conductivity of the conductor 260*b* can be inhibited from being lowered because of oxidization due to excess oxygen contained in the insulator 250 and the metal oxide 252. As a conductive material having a function of inhibiting diffusion of oxygen, for example, tantalum, tantalum nitride, ruthenium, ruthenium oxide, or the like is preferably used.

Furthermore, for the conductor 260*b*, a conductive material including tungsten, copper, or aluminum as its main component is preferably used. The conductor 260 functions as a wiring, and thus, a conductor having high conductivity is preferably used. For example, a conductive material containing tungsten, copper, or aluminum as its main component can be used. The conductor 260*b* may have a stacked-layer structure; for example, a stack of the above conductive material and titanium or titanium nitride may be employed.

In the case where the conductor 205 extends beyond the end portions of the oxide 230 in the channel width direction as illustrated in FIG. 13(A), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 having a function of the first gate electrode and the electric field of the conductor 205 having a function of the second gate electrode.

Furthermore, the insulator 270*a* functioning as a barrier film may be positioned over the conductor 260*ab*, and the insulator 270*b* functioning as a barrier film may be positioned over the conductor 260*bb*. For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen diffused from above the insulator 270 can be inhibited. Moreover, entry of impurities such as water or hydrogen diffused from above the insulator 270 into the oxide 230 through the conductor 260 and the insulator 250 can be inhibited.

The insulator 271*a* functioning as a hard mask is preferably positioned over the insulator 270*a*, and the insulator 271*b* functioning as a hard mask is preferably positioned over the insulator 270*b*. By providing the insulator 271, the conductor 260 can be processed to have the side surface that is substantially vertical; specifically, an angle formed by the side surface of the conductor 260 and a surface of the substrate can be greater than or equal to 75° and less than or equal to 100°, preferably greater than or equal to 80° and less than or equal to 95°. When the conductor 260 is processed into such a shape, the insulator 275 that is subsequently formed can be formed into a desired shape.

An insulating material having a function of inhibiting the passage of oxygen and impurities such as water or hydrogen may be used for the insulator 271 so that the insulator 271 also functions as a barrier film. In that case, the insulator 270 does not have to be provided.

The insulator 275*a* functioning as a buffer layer is provided in contact with the side surface of the oxide 230*ca*, the side surface of the insulator 250*a*, the side surface of the metal oxide 252*a*, the side surface of the conductor 260*a*, and the side surface of the insulator 270*a*. The insulator 275*b* functioning as a buffer layer is provided in contact with the side surface of the oxide 230*cb*, the side surface of the insulator 250*b*, the side surface of the metal oxide 252*b*, the side surface of the conductor 260*b*, and the side surface of the insulator 270*b*.

The insulator 275*a* can be formed by forming an insulating film to cover the oxide 230*ca*, the insulator 250*a*, the metal oxide 252*a*, the conductor 260*a*, the insulator 270*a*, and the insulator 271*a* and performing anisotropic etching (e.g., dry etching treatment) on the insulating film. The insulator 275*b* can be formed at the same time as the insulator 275*a*.

For example, as the insulator 275, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably included. In particular, silicon oxide and silicon oxynitride, which have thermal stability, are preferable. In particular, silicon oxide and porous silicon oxide, in which an excess oxygen region can be formed easily in a later step, are preferable.

The insulator 275 preferably includes an excess oxygen region. When an insulator from which oxygen is released by heating is provided as the insulator 275 in contact with the oxide 230*c* and the insulator 250, oxygen can be effectively supplied from the insulator 250 to the region 234 of the oxide 230*b*. The concentration of impurities such as water or hydrogen in the film of the insulator 275 is preferably lowered.

As the insulator 130, an insulator with a high dielectric constant is preferably used, and an insulator that can be used as the insulator 222 or the like is used. For example, an insulator containing an oxide of one or both of aluminum and hafnium can be used. Aluminum oxide, hafnium oxide, an oxide containing aluminum and hafnium (hafnium aluminate), or the like is preferably used for the insulator containing an oxide of one or both of aluminum and hafnium. The insulator 130 can have either a single-layer structure or a stacked-layer structure. The insulator 130 may have a stacked-layer structure of two or more layers selected from silicon oxide, silicon oxynitride, silicon nitride oxide, silicon nitride, aluminum oxide, hafnium oxide, an oxide containing aluminum and hafnium (hafnium aluminate), and the like. For example, hafnium oxide, aluminum oxide, and hafnium oxide are preferably deposited in this order by an ALD method to obtain a stacked-layer structure. The thickness of each of the hafnium oxide and the aluminum oxide is greater than or equal to 0.5 nm and less than or equal to 5 nm. With such a stacked-layer structure, the capacitor 100 can have a large capacitance value and a low leakage current.

As illustrated in FIGS. 12(A) and 12(B), the side surface of the insulator 130 is aligned with the side surface of the conductor 120 in the top view, which does not have to be employed. For example, a structure may be employed in which the insulator 130 covers the transistor 200*a*, the transistor 200*b*, and the transistor 700 without being patterned.

For the conductor 120, a conductive material containing tungsten, copper, or aluminum as its main component is preferably used. Although not illustrated, the conductor 120 may have a stacked-layer structure; for example, a stack of the above conductive material and titanium or titanium nitride may be used.

As illustrated in FIG. 14, the insulator 130*a* and the conductor 120*a* are preferably provided so as to also cover the side surface of the oxide 230. With such a structure, the capacitor 100*a* can be formed even in the side surface direction of the oxide 230, so that the electric capacity per unit area of the capacitor 100*a* can be increased. Although not illustrated, the insulator 130*b* and the conductor 120*b* of the capacitor 100*b* are preferably provided in a manner similar to that of the insulator 130*a* and the conductor 120*a* of the capacitor 100*a*.

Part of the insulator 130 and part of the conductor 120 are preferably provided so as to overlap with the insulator 271. In that case, the region 231*a* (region 231*c*) to the end portion on the insulator 275 side can function as an electrode of a capacitor. Since the insulator 275 is formed, the parasitic capacitance of the conductor 120 and the conductor 260 can be reduced.

The insulator 273 is preferably provided over the insulator 275*a*, the insulator 275*b*, the insulator 271*a*, the insulator 271*b*, the layer 742, the insulator 775, the insulator 771, the conductor 120*a*, and the conductor 120*b*. When the insulator 273 is formed by a sputtering method, excess oxygen regions can be provided in the insulator 275 and the insulator 775. Therefore, oxygen can be supplied from the excess oxygen regions to the oxide 230 and the oxide 730. When the insulator 273 is provided over the layer 242*c* of the oxide 230 and the layer 742 of the oxide 730, hydrogen in the oxide 230 and the oxide 730 can be extracted to the insulator 273.

For example, a metal oxide containing one kind or two or more kinds selected from hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen.

The insulator 274 is provided over the insulator 273. For the insulator 274, a film having a barrier property and a reduced hydrogen concentration is preferably used. For example, silicon nitride oxide, silicon nitride, silicon oxide to which fluorine is added, or the like is preferably used for the insulator 274. By providing the insulator 273 having a barrier property and the insulator 274 having a barrier property, impurities can be inhibited from diffusing into the transistor 200 from another structure body such as an interlayer film.

The insulator 280 functioning as an interlayer film is preferably provided over the insulator 274. As in the insulator 224 or the like, the concentration of impurities such as water or hydrogen in the film of the insulator 280 is preferably lowered. Note that the insulator 282 similar to the insulator 210 may be provided over the insulator 280. When the insulator 282 is formed by a sputtering method, impurities in the insulator 280 can be reduced. In the case where the insulator 282 is provided, a structure without one or both of the insulator 273 and the insulator 274 may be employed. Note that the insulator 284 similar to the insulator 280 may be provided over the insulator 282.

The conductor 240*a*, the conductor 240*b*, the conductor 240*c*, the conductor 740*a*, and the conductor 740*b* are positioned in openings formed in the insulator 284, the insulator 282, the insulator 280, the insulator 274, and the insulator 273. The conductor 240*a* and the conductor 240*b* are provided so as to face each other with the conductor 260*a* therebetween, and the conductor 240*b* and the conductor 240*c* are provided so as to face each other with the conductor 260*b* therebetween. The conductor 740*a* and the conductor 740*b* are provided so as to face each other with the conductor 760 therebetween. Note that the top surfaces of the conductor 240*a*, the conductor 240*b*, the conductor 240*c*, the conductor 740*a*, and the conductor 740*b* may be level with the top surface of the insulator 284.

Note that the conductor 240*b* is formed in contact with inner walls of the openings in the insulator 284, the insulator 282, the insulator 280, the insulator 274, the insulator 273, and the insulator 275. At least part of the region 231*b* of the oxide 230 is positioned at the bottom of the opening, and thus the conductor 240*b* is in contact with the region 231*b*. The same applies to the conductor 740*a* and the conductor 740*b*. The conductor 240*a* is in contact with the conductor 120*a*, and the conductor 240*c* is in contact with the conductor 120*b*.

As illustrated in FIG. 12(B) and FIG. 15, the conductor 240*b* is positioned between the conductor 260*a* and the conductor 260*b*. Here, the conductor 240*b* preferably includes a region in contact with one or both of the side surfaces of the insulator 275*a* and the insulator 275*b*. In that case, the insulator 273 preferably includes a region in contact with one or both of the side surfaces of the insulator 275*a* and the insulator 275*b*, in the opening in which the conductor 240*b* is embedded.

In order to form the opening in which the conductor 240*b* is embedded, the following opening condition is preferably employed: the etching rate of the insulator 275 is markedly lower than that of the insulator 273 at the time of forming an opening in the insulator 280, the insulator 274, and the insulator 273. When the etching rate of the insulator 275 is 1, the etching rate of the insulator 273 is preferably 5 or more, more preferably 10 or more. Here, an insulating material used for the insulator 275 is preferably selected as appropriate in accordance with etching conditions and an insulating material used for the insulator 273 such that the above etching rate is satisfied. For example, the insulating material used for the insulator 275 is not limited to the above insulating material, and the insulating material that can be used for the insulator 270 may be used.

In the case where the insulator 273 and the insulator 274 are not provided, an opening condition is preferably employed in which the etching rate of the insulator 275 is markedly lower than that of the insulator 280 at the time of forming the opening; when the etching rate of the insulator 275 is 1, the etching rate of the insulator 280 is preferably 5 or more, more preferably 10 or more.

Figure 23A:
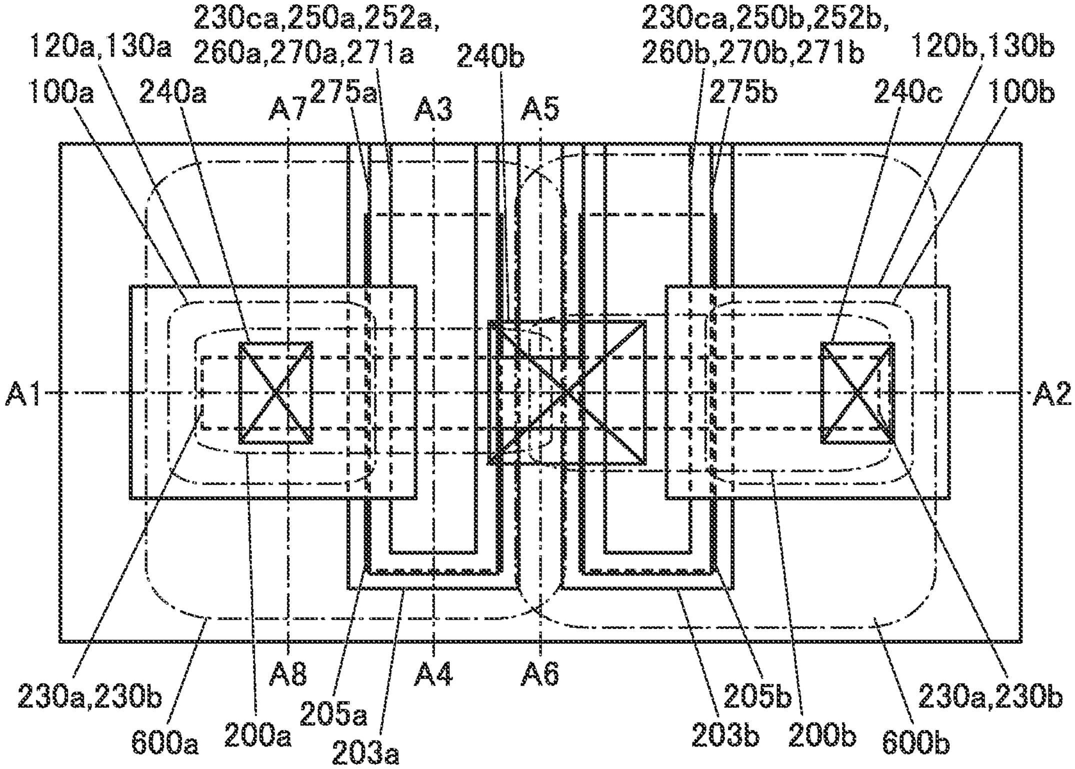
FIGS. 23A-23B A top view and a cross-sectional view illustrating a structure example of a semiconductor device.
Figure 23B:
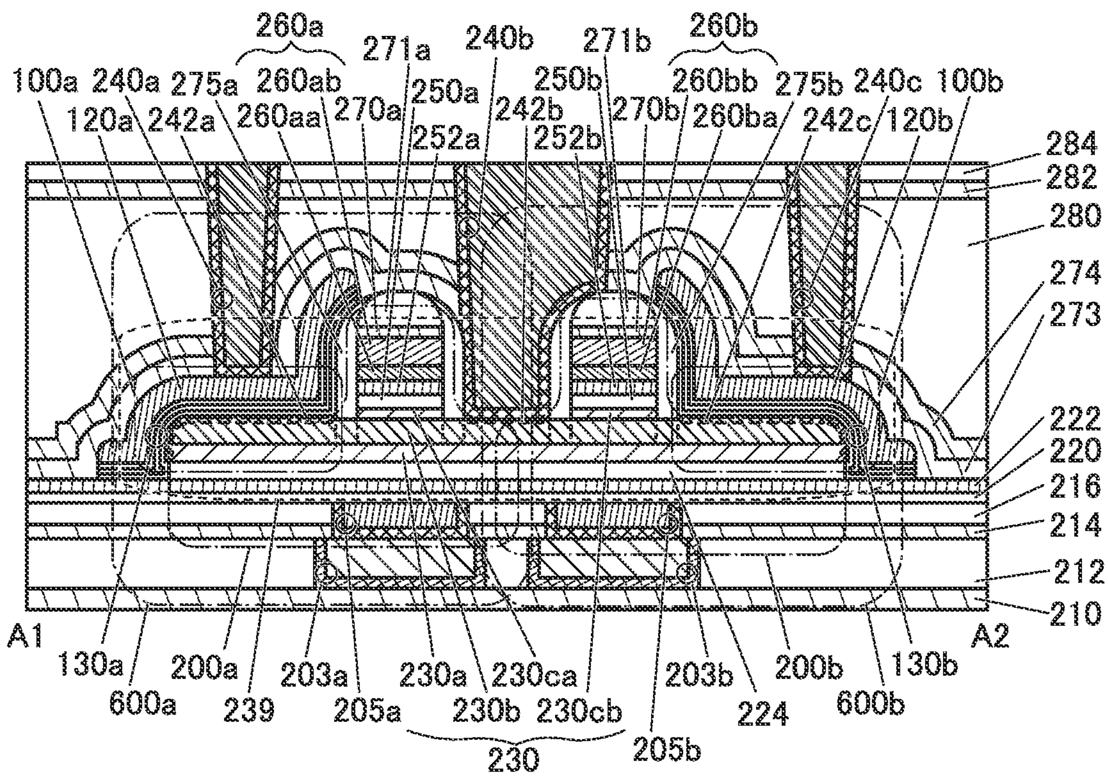

When the opening in which the conductor 240*b* is embedded is formed in such a manner, the insulator 275*a* and the insulator 275*b* function as etching stoppers, so that the opening can be prevented from reaching the conductor 260*a* and the conductor 260*b*. Thus, the conductor 240*b* and the opening in which the conductor 240*b* is embedded can be formed in a self-aligned manner. For example, as illustrated in FIG. 23, the conductor 240*b* and the conductor 260*b* do not come in contact with each other even when openings in which the conductor 240*a*, the conductor 240*b*, and the conductor 240*c* are formed to be displaced to the transistor 200*b* side. When the width in the channel length direction of the transistor 200 of the opening in which the conductor 240*b* is formed is set larger than the distance between the insulator 275*a* and the insulator 275*b*, the conductor 240*b* can be in good contact with the layer 242*b* even when the opening is formed to be displaced as illustrated in FIG. 23. Note that the same insulating material as that for the insulator 275 may also be used for the insulator 271*a* and the insulator 271*b* so that the insulator 271*a* and the insulator 271*b* also function as etching stoppers.

Thus, alignment margin for a contact portion (conductor 240*b*) between the transistor 200*a* and the transistor 200*b*, the gate of the transistor 200*a*, and the gate of the transistor 200*b* can be wide, and a space between these components can be designed to be small. In such a manner, the miniaturization and high integration of the semiconductor device can be achieved.

As illustrated in FIG. 13(B), the conductor 240*b* preferably overlaps with the side surface of the oxide 230 with the layer 242*b* therebetween. It is particularly preferable that the conductor 240*b* overlap with one or both of the side surface of the oxide 230 on the A5 side and the side surface of the oxide 230 on the A6 side, which intersect with the channel width direction of the oxide 230. Thus, with the structure in which the conductor 240*b* overlaps with the side surface of the oxide 230 in the region 231*b* to be the source region or the drain region, the contact area of a contact portion between the conductor 240*b* and the transistor 200 can be increased without increasing the projected area of the contact portion, so that the contact resistance between the conductor 240*b* and the transistor 200 can be reduced. Thus, miniaturization of the source electrode and the drain electrode of the transistor can be achieved and, in addition, the on-state current can be increased. Although the length of the conductor 240*b* in the channel width direction is larger than the length of the oxide 230 in the channel width direction in FIG. 13(B), the semiconductor device described in this embodiment is not limited thereto; for example, a structure may be employed in which the length of the conductor 240*b* in the channel width direction is substantially equal to the length of the oxide 230 in the channel width direction.

The conductor 740*a* and the conductor 740*b* can have structures similar to that of the above conductor 240*b*.

For the conductor 240 and the conductor 740, a conductive material containing tungsten, copper, or aluminum as its main component is preferably used. The conductor 240 and the conductor 740 may have a stacked-layer structure.

When openings are formed in the insulator 284, the insulator 282, the insulator 280, the insulator 274, and the insulator 273, for example, the low-resistance region in the region 231 of the oxide 230 is removed and the oxide 230 whose resistance is not lowered is exposed in some cases. In that case, as a conductor used as a conductor of the conductor 240 in contact with the oxide 230 (hereinafter also referred to as a first conductor of the conductor 240), a metal film, a nitride film containing a metal element, or an oxide film containing a metal element is preferably used. When the oxide 230 with the resistance not lowered is in contact with the first conductor of the conductor 240, oxygen vacancies are formed in the metal compound or the oxide 230, whereby the resistance of the region 231 of the oxide 230 is reduced. The reduction in the resistance of the oxide 230 that is in contact with the first conductor of the conductor 240 can reduce contact resistance between the oxide 230 and the conductor 240. Therefore, the first conductor of the conductor 240 preferably contains a metal element such as aluminum, ruthenium, titanium, tantalum, or tungsten. The conductor 740 may have a similar structure.

In the case where the conductor 240 and the conductor 740 each have a stacked-layer structure, a conductive material having a function of inhibiting the passage of impurities such as water or hydrogen is preferably used for a conductor in contact with the insulator 284, the insulator 282, the insulator 280, the insulator 274, and the insulator 273, like the first conductor of the conductor 205, for example. For example, tantalum, tantalum nitride, titanium, titanium nitride, ruthenium, ruthenium oxide, or the like is preferably used. The conductive material having a function of inhibiting the passage of impurities such as water or hydrogen may be used as a single layer or a stack. With use of the conductive material, impurities such as hydrogen or water can be inhibited from entering the oxide 230 and the oxide 730 through the conductor 240 and the conductor 740 from a layer above the insulator 284.

Note that a structure may be employed in which in the openings where the conductor 240 and the conductor 740 are provided, the inner walls of the openings are covered with an insulator having a barrier property with respect to oxygen and hydrogen. Here, as an insulator having a barrier property with respect to oxygen and hydrogen, an insulator similar to the insulator 214 is used; for example, aluminum oxide or the like is preferably used. Accordingly, impurities such as hydrogen and water can be inhibited from entering the oxide 230 and the oxide 730 through the conductor 240 and the conductor 740 from the insulator 280 or the like. Moreover, the insulator can be deposited with good coverage by an ALD method, a CVD method, or the like.

Although not illustrated, a conductor functioning as a wiring may be positioned in contact with the top surfaces of the conductor 240 and the conductor 740. For the conductor functioning as a wiring, a conductive material containing tungsten, copper, or aluminum as its main component is preferably used. The conductor may have a stacked-layer structure; for example, a stack of the above conductive materials and titanium or titanium nitride may be employed. Note that like the conductor 203 or the like, the conductor may be formed so as to be embedded in an opening provided in an insulator.

The insulator 150 may be provided over the insulator 284. The insulator 150 can be provided using a material similar to that for the insulator 280. Furthermore, the insulator 150 may function as a planarization film that covers an uneven shape thereunder.

The conductor 112 is preferably provided in an opening formed in the insulator 150. The conductor 112 functions as wirings of the transistor 200, the transistor 700, the capacitor 100, and the like.

For the conductor 112, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

As illustrated in FIG. 9, the conductor 112 has a stacked-layer structure of two or more layers. For example, between a conductor having a barrier property and a conductor having high conductivity, a conductor which is highly adhesive to the conductor having a barrier property and the conductor having high conductivity may be formed. Note that the conductor 112 is not limited thereto and may have a single-layer structure.

When the semiconductor device described in the above embodiment is formed with the above structure, the miniaturization and high integration of the semiconductor device can be achieved considering the process rule for 14-nm generation and later generations.

<Constituent Materials for Semiconductor Device>

Constituent materials that can be used for a semiconductor device will be described below. In the following description, constituent materials that can be used for the transistor 200 can be used for the transistor 700, unless otherwise specified.

The constituent materials described below can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma CVD (PECVD: Plasma Enhanced CVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, such plasma damage is not caused in the case of a thermal CVD method that does not use plasma, and thus the yield of a semiconductor device can be increased. In addition, a thermal CVD method does not cause plasma damage during deposition, so that a film with few defects can be obtained.

An ALD method is also a deposition method which enables less plasma damage to an object. Therefore, a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method has excellent step coverage and excellent thickness uniformity, and thus is suitable for the case of covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with a flow rate ratio of the source gases. For example, by a CVD method and an ALD method, a film with a desired composition can be formed with the flow rate ratio of the source gases. Moreover, for example, in a CVD method or an ALD method, by changing the flow rate ratio of the source gases during the deposition, a film whose composition is continuously changed can be formed. In the case of forming a film while changing the flow rate ratio of the source gases, as compared with the case of forming a film with the use of a plurality of deposition chambers, time taken for the film formation can be shortened because time taken for transfer and pressure adjustment is not required. Thus, productivity of semiconductor devices can be improved in some cases.

Note that the processing of the constituent materials can be processed by a lithography method. For the processing, a dry etching method or a wet etching method can be employed. The processing by a dry etching method is suitable for microfabrication.

In the lithography method, first, a resist is exposed to light through a mask. Next, a region exposed to light is removed or left using a developing solution, so that a resist mask is formed. Then, etching treatment through the resist mask is performed, so that the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above light. Note that the above mask for the exposure of the resist to light is unnecessary in the case of using an electron beam or an ion beam, because direct drawing is performed on the resist. Note that for removal of the resist mask, dry etching treatment such as ashing can be performed, wet etching treatment can be performed, wet etching treatment can be performed after dry etching treatment, or dry etching treatment can be performed after wet etching treatment, for example.

A hard mask formed of an insulator or a conductor may be used instead of the resist mask. In the case where a hard mask is used, a hard mask with a desired shape can be formed in the following manner: an insulating film or a conductive film that is the hard mask material is formed over the constituent materials, a resist mask is formed thereover, and then the hard mask material is etched. The etching of the constituent materials may be performed after removal of the resist mask or while the resist mask remains. In the latter case, the resist mask disappears during the etching in some cases. The hard mask may be removed by etching after the etching of the above constituent materials. The hard mask does not need to be removed in the case where the hard mask material does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which high-frequency power is applied to one of the parallel plate type electrodes. Alternatively, a structure may be employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

<<Substrate>>

As a substrate over which the transistor 200 and the transistor 700 are formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is given. Examples of the conductor substrate include a graphite substrate, a metal substrate, an alloy substrate, and a conductive resin substrate. A substrate including a metal nitride, a substrate including a metal oxide, or the like is given. Moreover, an insulator substrate provided with a conductor or a semiconductor, a semiconductor substrate provided with a conductor or an insulator, a conductor substrate provided with a semiconductor or an insulator, and the like are given. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. Note that as the substrate, a sheet, a film, a foil or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (nylon, aramid, or the like), polyimide, polycarbonate, and acrylic. In particular, aramid is suitable for the flexible substrate because of its low coefficient of linear expansion.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, for example, a problem such as generation of leakage current may arise because of a reduction in the thickness of a gate insulator. When a high-k material is used for an insulator functioning as the gate insulator, the voltage of the transistor in operation can be reduced while the physical thickness of the gate insulator is kept. In contrast, when a material with a low dielectric constant is used for the insulator functioning as an interlayer film, the parasitic capacitance generated between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure which is thermally stable and has a low dielectric constant can be obtained by combination with a resin, for example. Examples of the resin include polyester, polyolefin, polyamide (e.g., nylon or aramid), polyimide, polycarbonate, and acrylic. Furthermore, combining silicon oxide with an insulator having a high dielectric constant and combining silicon oxynitride with an insulator having a high dielectric constant each enable a stacked-layer structure to have thermal stability and a high dielectric constant.

In addition, when a transistor using an oxide semiconductor is surrounded by an insulator having a function of inhibiting the passage of oxygen and impurities such as hydrogen, the transistor can have stable electrical characteristics.

As the insulator having a function of inhibiting the passage of oxygen and impurities such as hydrogen, a single layer or a stack of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one kind or two or more kinds selected from hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has a lower barrier property than aluminum oxide, the barrier property can be increased with an increase in the film thickness. Therefore, the appropriate addition amount of hydrogen and nitrogen can be adjusted by adjustment of the film thickness of hafnium oxide.

For example, the insulator 224 and the insulator 250 functioning as part of the gate insulator are preferably an insulator including an excess-oxygen region. When a structure is employed in which silicon oxide or silicon oxynitride including an excess-oxygen region is in contact with the oxide 230, oxygen vacancies included in the oxide 230 can be compensated for.

For example, an insulator containing an oxide of one or more kinds of aluminum, hafnium, and gallium can be used for the insulator 222, which functions as part of the gate insulator. In particular, it is preferable to use aluminum oxide, hafnium oxide, an oxide containing aluminum and hafnium (hafnium aluminate), or the like as an insulator containing an oxide of one or both of aluminum and hafnium.

For example, silicon oxide or silicon oxynitride, which is thermally stable, is preferably used for the insulator 220. When the gate insulator has a stacked-layer structure of a thermally stable film and a film with a high dielectric constant, the equivalent oxide thickness (EOT) of the gate insulator can be reduced while the physical thickness thereof is kept.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited.

The insulator 212, the insulator 216, the insulator 271, the insulator 275, and the insulator 280, and the insulator 284 preferably include an insulator with a low dielectric constant. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic.

As the insulator 210, the insulator 214, the insulator 270, the insulator 273, and the insulator 282, an insulator having a function of inhibiting the passage of oxygen and impurities such as hydrogen is used. For the insulator 270 and the insulator 273, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like is used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where a channel is formed can be trapped in some cases. Alternatively, hydrogen entering from an external insulator or the like can be trapped in some cases.

For the conductor 260, the conductor 203, the conductor 205, and the conductor 240, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

<<Metal Oxide>>

As the oxide 230, a metal oxide functioning as an oxide semiconductor (hereinafter also referred to as an oxide semiconductor) is preferably used. A metal oxide that can be used as the oxide 230 of one embodiment of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Any one or more of the above metals can be used as a main component of the metal oxide. As a metal that is contained in the aforementioned layer 242, a metal different from the metal used as a main component of the metal oxide can be selected.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above elements may be combined as the element M.

Note that in this specification and the like, a metal oxide containing nitrogen is also referred to as a metal oxide in some cases. A metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above conducting function, and the insulating regions have the above insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into single-crystal oxide semiconductors and non-single-crystal oxide semiconductors. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is anon-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a grain boundary is inhibited due to the distortion of lattice arrangement. This is because the CAAC-OS can tolerate distortion owing to non-dense arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium of the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is a metal oxide having a structure between those of the nc-OS and the amorphous oxide semiconductor. The a-like OS contains avoid or a low-density region. That is, the a-like OS has low crystallinity as compared with the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used for a channel formation region of a transistor will be described.

Note that when the above metal oxide is used for a channel formation region of a transistor, the transistor having high field-effect mobility can be achieved. In addition, the transistor having high reliability can be achieved.

Here, an example of a hypothesis of the electrical conduction of a metal oxide will be described.

Electrical conduction in a solid is inhibited by a scattering source called a scattering center. For example, in the case of single crystal silicon, lattice scattering and ionized impurity scattering are known as main scattering centers. In other words, in an intrinsic state with less lattice defects and impurities, the carrier mobility is high because there is no factor of inhibiting electric conduction in the solid.

It is presumed that the above also applies to a metal oxide. For example, many oxygen vacancies Vo probably exist in a metal oxide whose oxygen content is lower than that in the stoichiometric composition. Atoms existing around the oxygen vacancies are located in a place distorted from an intrinsic state. This distortion due to the oxygen vacancies might serve as a scattering center.

Moreover, a metal compound whose oxygen content is higher than that in the stoichiometric composition contains excess oxygen. Excess oxygen existing in an isolated state in the metal compound becomes $O^-$ or $O^{2-}$ when receiving electrons. Excess oxygen that has become $O^-$ or $O^{2-}$ might serve as a scattering center.

In light of the above, carrier mobility is probably high in the case where the metal oxide is in an intrinsic state with oxygen in the stoichiometric composition.

In particular, in an indium-gallium-zinc oxide (hereinafter, IGZO), which is a kind of metal oxides containing indium, gallium, and zinc, crystal growth hardly occurs in the air; thus, IGZO is more structurally stable with small crystals (e.g., the above nanocrystals) than with large crystals (here, several-mm crystals or several-cm crystals), in some cases. This is presumably because distortion energy is more relieved when small crystals are connected than when large crystals are formed.

Note that in a region where small crystals are connected, defects might be formed to reduce distortion energy of the region. Thus, when distortion energy is reduced without forming defects in the region, carrier mobility can be increased.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, more preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and moreover, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, approximately 1-nm crystalline IGZO was observed even before the electron beam irradiation. Thus, it has been reported that the existence of a completely amorphous structure was not observed in IGZO. In addition, it has been shown that the thin film of CAAC-IGZO and the thin film of nc-IGZO have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU utilizing a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard to be recognized by human eyes is considered as a cause of eyestrain. Thus, it has been proposed that the refresh rate of the display device be lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of low leakage current of the transistor have been studied.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration obtained by SIMS) is set to lower than or equal to $2\times10^{18}$ atoms/$cm^3$, preferably lower than or equal to $2\times10^{17}$ atoms/$cm^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/$cm^3$, preferably lower than or equal to $2\times10^{16}$ atoms/$cm^3$.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the metal oxide is preferably reduced as much as possible; for example, the nitrogen concentration in the metal oxide is set lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, and still more preferably lower than or equal to $5\times10^{17}$ atoms/$cm^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen is likely to have normally-on characteristics. Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

When a metal oxide in which impurities are sufficiently reduced is used for a channel formation region in a transistor, stable electrical characteristics can be given.

<Modification Example of Semiconductor Device>

An example of a semiconductor device of one embodiment of the present invention will be described below with reference to FIG. 24 to FIG. 27.

Figure 24A:
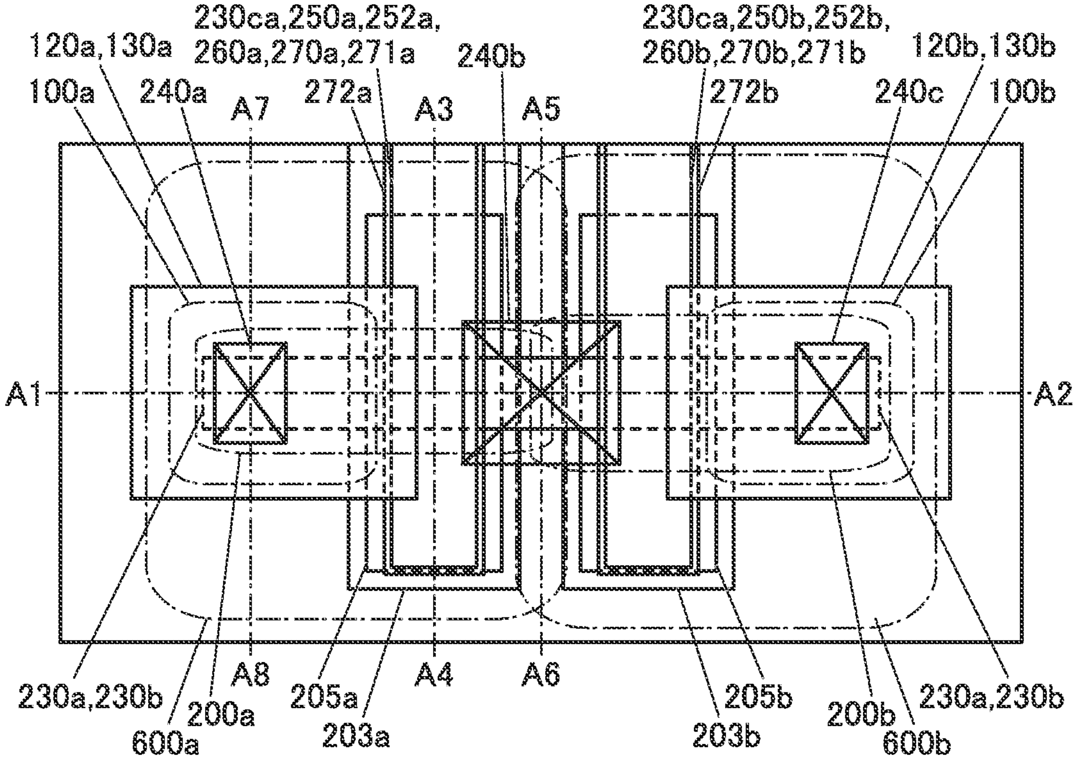
FIGS. 24A-24B A top view and a cross-sectional view illustrating a structure example of a semiconductor device.
Figure 24B:
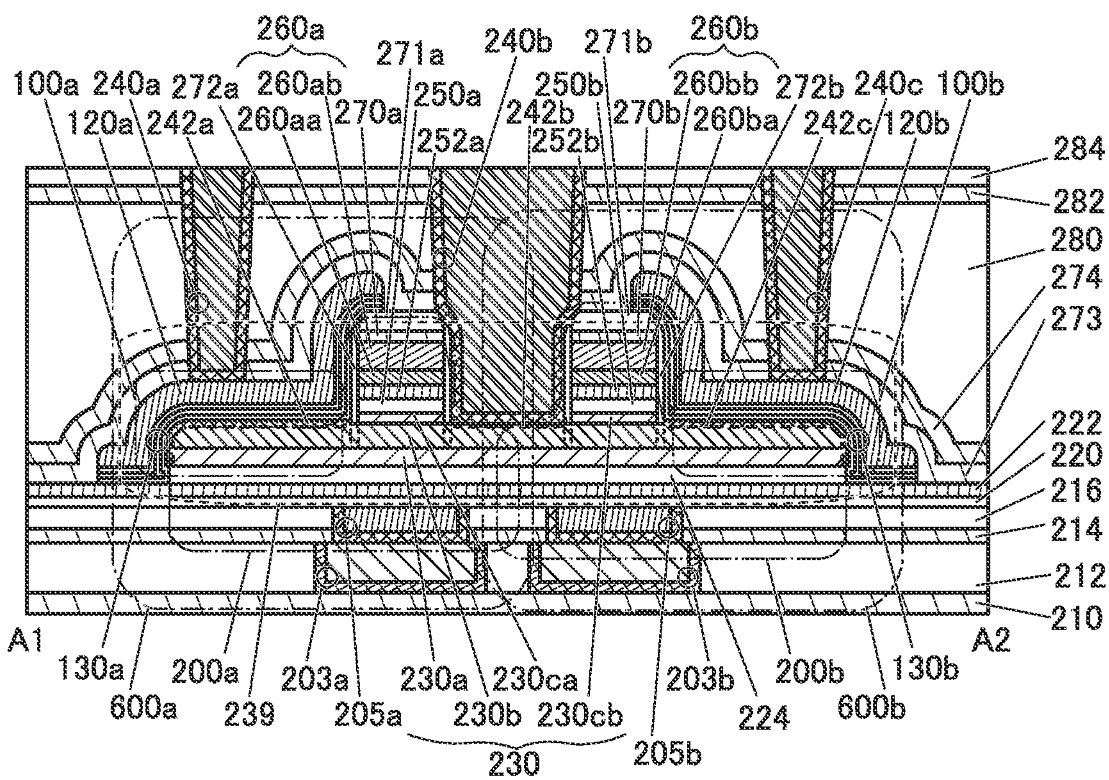
Figure 25:
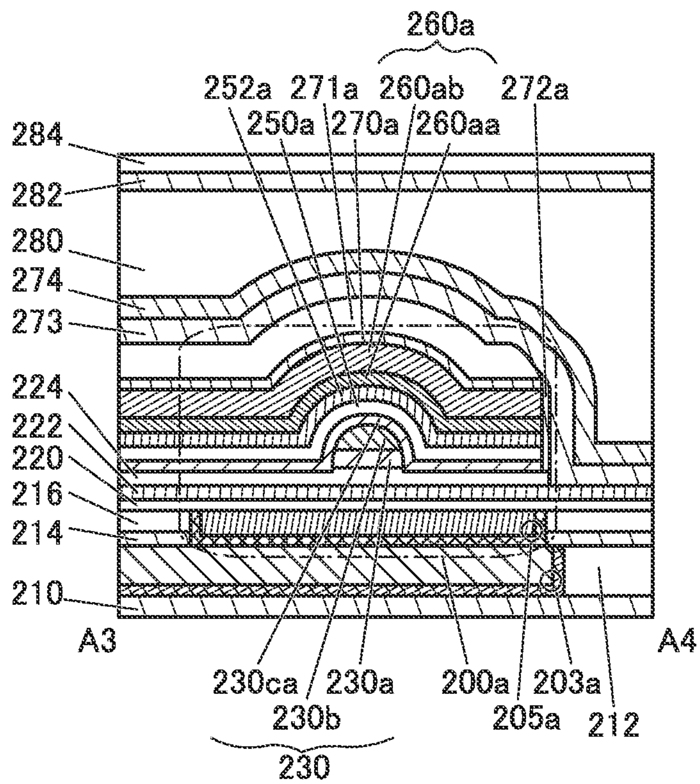
FIG. 25 A cross-sectional view illustrating a structure example of a semiconductor device.
Figure 26:
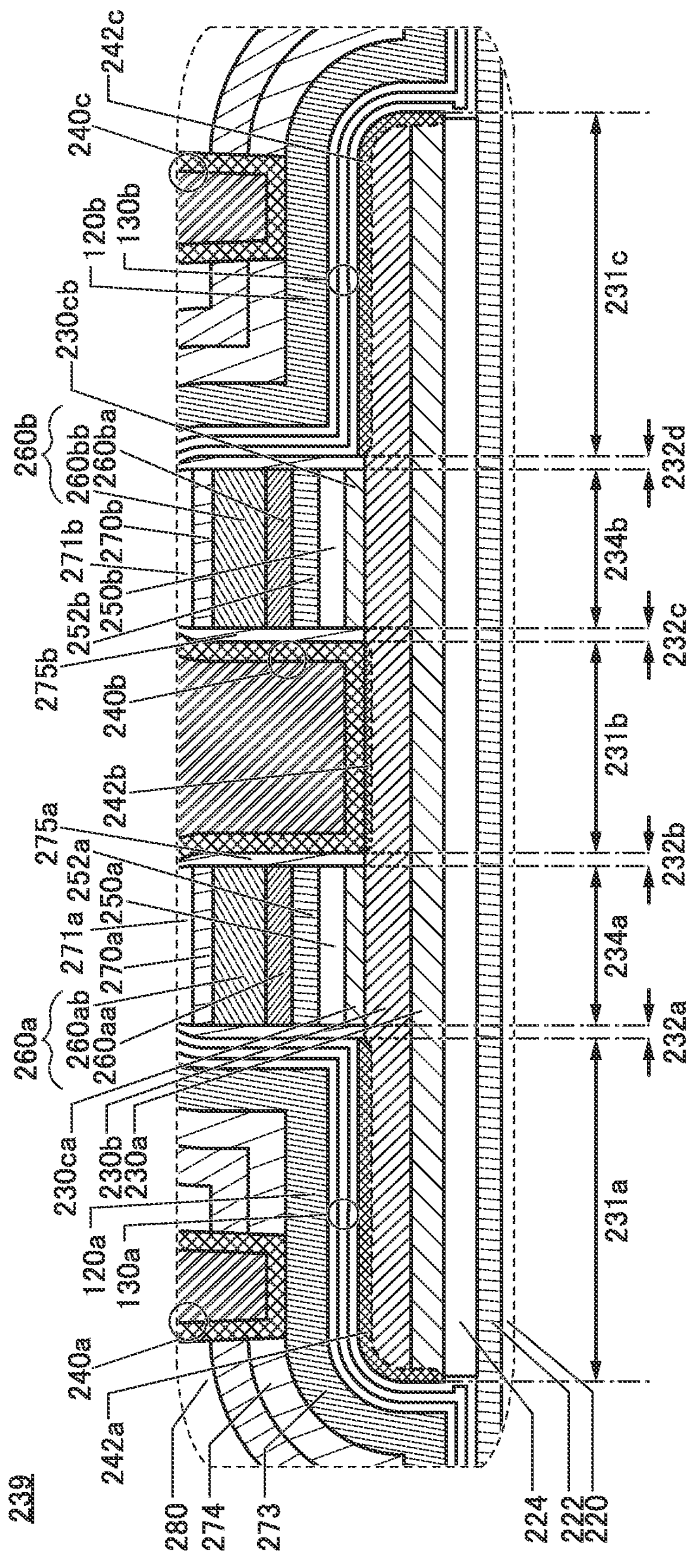
FIG. 26 A cross-sectional view illustrating a structure example of a semiconductor device.

The semiconductor device illustrated in FIG. 24, FIG. 25, and FIG. 26 is different from the semiconductor device illustrated in FIG. 12 to FIG. 15 in that the transistor 200 is provided with the insulator 272 instead of the insulator 275. Note that the description of the semiconductor device illustrated in FIG. 12 to FIG. 15 can be referred to for the descriptions of the other components. Although not illustrated, similarly, the transistor 700 is provided with an insulator that corresponds to the insulator 272 instead of the insulator 775.

FIG. 24(A) is a top view of a semiconductor device including the memory cell 600. FIG. 24(B) and FIG. 25 are cross-sectional views of the semiconductor device. FIG. 24(B) is a cross-sectional view of a portion indicated by a dashed-dotted line A1-A2 in FIG. 24(A) and also is a cross-sectional view of the transistor 200*a* and the transistor 200*b* in the channel length direction. FIG. 25 is a cross-sectional view of a portion indicated by a dashed-dotted line A3-A4 in FIG. 24(A) and also is a cross-sectional view of the transistor 200*a* in the channel width direction. Note that for simplification of the drawing, some components are not illustrated in the top view in FIG. 24(A). A cross section of a portion indicated by the dashed-dotted line A5-A6 in FIG. 24(A) is the same as the structure illustrated in FIG. 13(B). FIG. 26 shows an enlarged view of the region 239 surrounded by a dashed line in FIG. 24(B).

The insulator 272 is provided in contact with the side surface of the oxide 230*c*, the side surface of the insulator 250, the side surface of the metal oxide 252, the side surface of the conductor 260, and the side surface of the insulator 270. The insulator 272 has a function of a buffer layer. For the insulator 272, an insulating material that has a function of inhibiting passage of oxygen and impurities such as water or hydrogen may be used. In that case, the insulator 272 also has a function of a barrier layer.

The insulator 272 is preferably formed by an ALD method, for example. The use of an ALD method allows formation of a dense thin film. For the insulator 272, aluminum oxide or hafnium oxide is preferably used, for example. In the case where aluminum oxide is provided as the insulator 272 by an ALD method, the thickness of the insulator 272 is preferably greater than or equal to 0.5 nm and less than or equal to 3.0 nm.

When the insulator 272 is provided, the side surfaces of the insulator 250, the metal oxide 252, and the conductor 260 can be covered with the insulator having a function of inhibiting passage of oxygen and impurities such as water or hydrogen. Therefore, it is possible to inhibit entry of impurities such as hydrogen or water into the oxide 230 through the end portions of the insulator 250 and the metal oxide 252, and the like. Thus, the formation of oxygen vacancies at the interface between the oxide 230 and the insulator 250 is inhibited, leading to an improvement in the reliability of the transistor 200. That is, the insulator 272 has a function of a side barrier for protecting the side surfaces of the gate electrode and the gate insulator.

When the above material is used for the insulator 272, the conductor 240*b*, the conductor 740*a*, or the conductor 740*b* can be relatively easily formed in a self-aligned manner without a short circuit with the gate of the transistor 200*a*, the transistor 200*b*, or the transistor 700. Accordingly, the area occupied by the transistor 200*a*, the transistor 200*b*, or the transistor 700 can be reduced, so that further miniaturization and higher integration of a memory cell array can be achieved.

Figure 27:
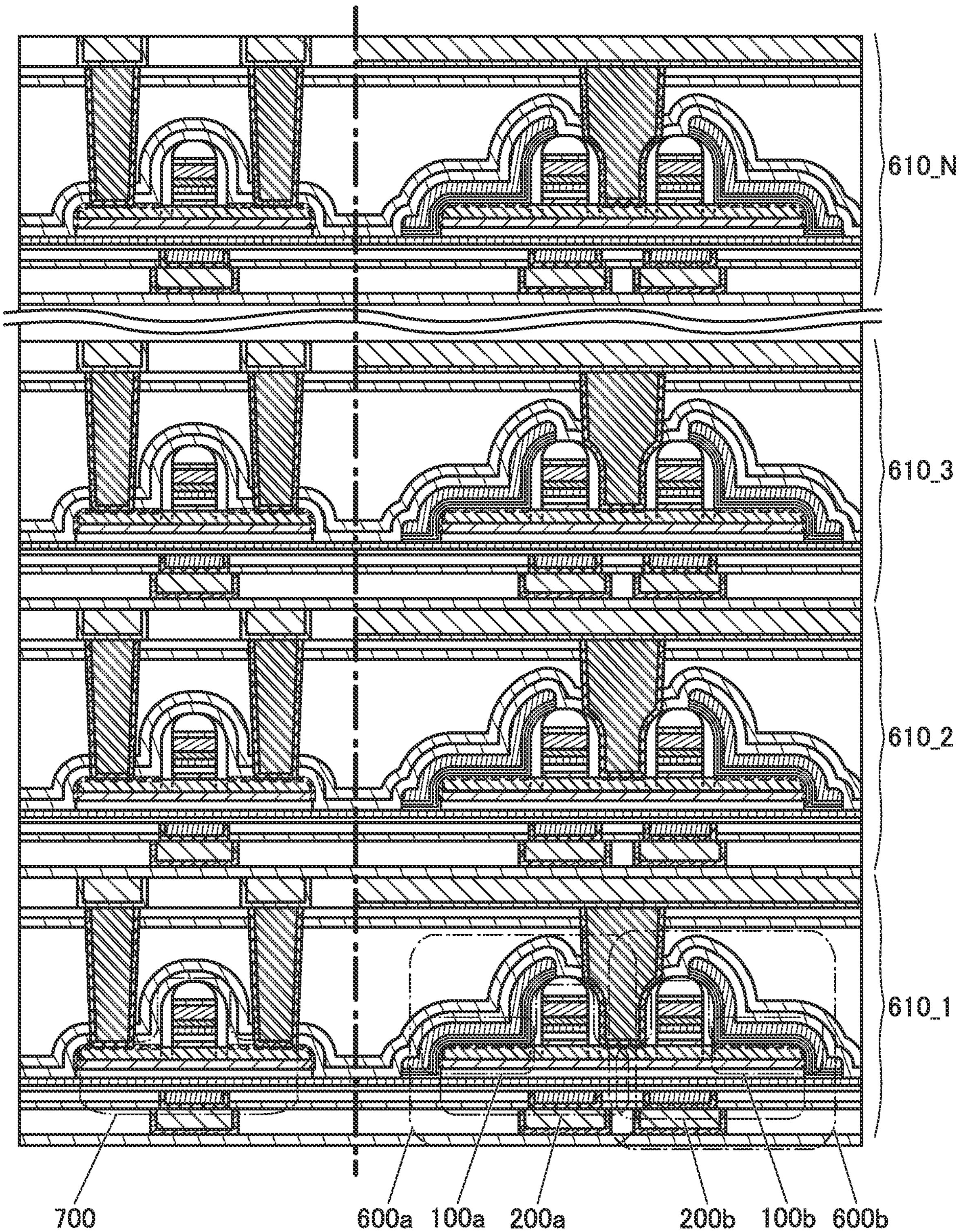
FIG. 27 A cross-sectional view illustrating a structure example of a semiconductor device.

In the above embodiment, in the case where the plurality of layers 20 including the memory cell array are stacked as illustrated in FIG. 4, layers 610 including the transistor 700, the memory cell 600*a*, and the memory cell 600*b* may be stacked as illustrated in FIG. 27. In FIG. 27, the first to N-th layers 610 are stacked. When a plurality of cell arrays are stacked as illustrated in FIG. 27, cells can be integrally positioned without increasing the area occupied by the cell arrays. That is, a 3D cell array can be formed.

According to one embodiment of the present invention, a semiconductor device having favorable electrical characteristics can be provided. According to another embodiment of the present invention, a semiconductor device with low off-state current can be provided. According to another embodiment of the present invention, a semiconductor device with high on-state current can be provided. According to another embodiment of the present invention, a highly reliable semiconductor device can be provided. According to another embodiment of the present invention, a semiconductor device that can be miniaturized or highly integrated can be provided. According to another embodiment the present invention, a semiconductor device with reduced power consumption can be provided. According to another embodiment of the present invention, a semiconductor device with high productivity can be provided.

This embodiment can be combined with the descriptions of the other embodiments as appropriate.

Embodiment 4

In this embodiment, an example of using the semiconductor device 10 of one embodiment of the present invention as an electronic component will be described. Note that the electronic component is also referred to as a semiconductor package or an IC package. As a semiconductor package, an MCM (Multi Chip Module), obtained by mounting a plurality of semiconductor chips (integrated circuits) on a package, is known.

Figure 28A:
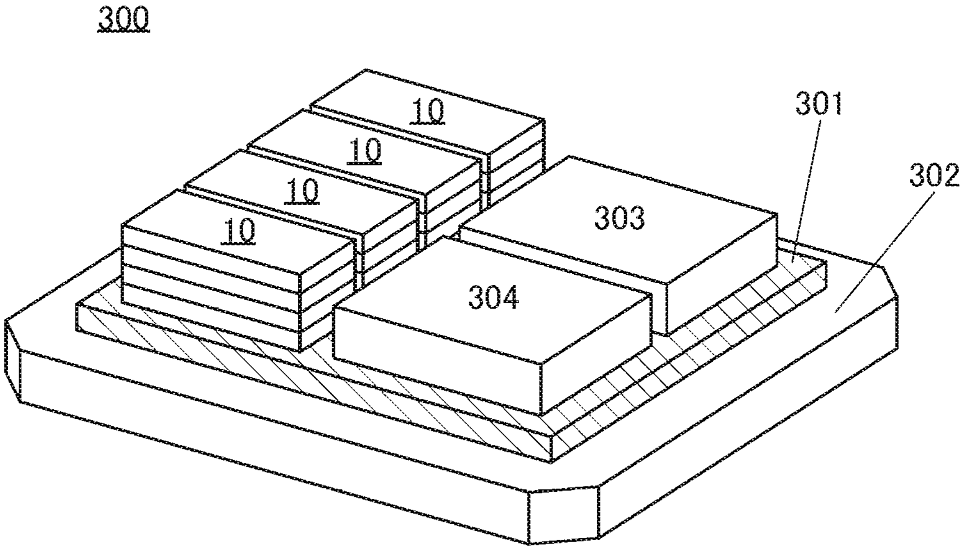
FIGS. 28A-28B A perspective view and a top view illustrating a structure example of a semiconductor device.
Figure 28B:
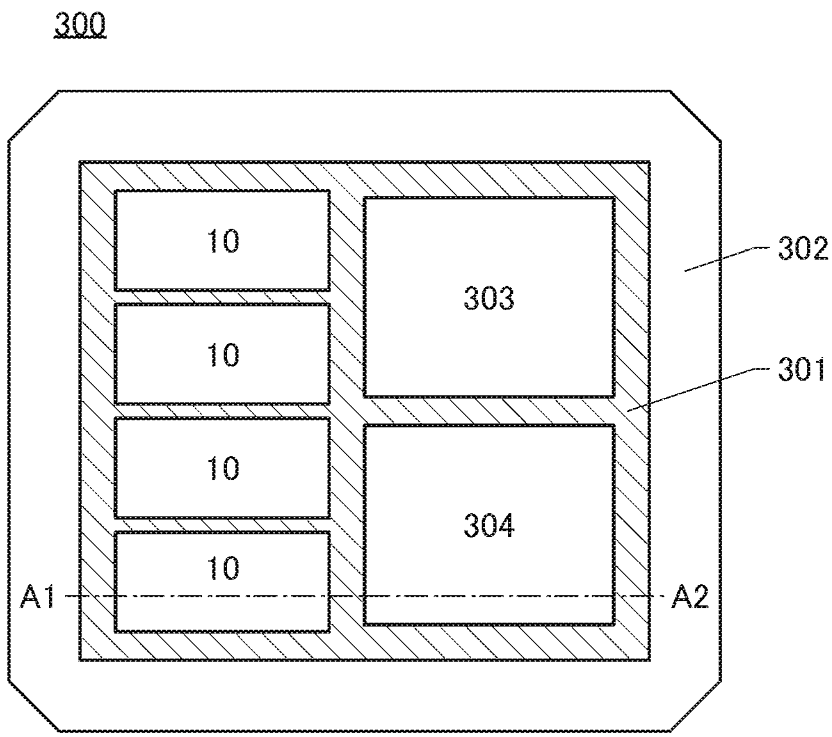

FIG. 28(A) illustrates a perspective view of a semiconductor device 300. FIG. 28(B) is atop view of the semiconductor device 300. The semiconductor device 300 is an electronic component and is also an MCM. The semiconductor device 300 is provided with an interposer 301 on a package substrate 302 (printed circuit board), and a CPU 303, a GPU 304, and a plurality of semiconductor devices 10 are provided over the interposer 301. In this embodiment, a high bandwidth memory (HBM) in which a plurality of cell arrays are stacked is illustrated as an example of the semiconductor device 10.

Although the CPU, the GPU, and the memory (memory device) are illustrated as integrated circuits (semiconductor chips) provided over the interposer 301 in this embodiment, another integrated circuit may be used.

As the package substrate 302, a ceramic substrate, a plastic substrate, a glass epoxy substrate, or the like can be used. As the interposer 301, a silicon interposer, a resin interposer, or the like can be used.

The interposer 301 includes a plurality of wirings and has a function of electrically connecting the plurality of integrated circuits with different terminal pitches. The plurality of wirings are provided in a single layer or multiple layers. The interposer 301 has a function of electrically connecting an integrated circuit provided over the interposer 301 to an electrode provided on the package substrate 302. Accordingly, the interposer is referred to as a "rewiring substrate" or an "intermediate substrate" in some cases. A through electrode may be provided in the interposer 301 and used for electrically connecting the integrated circuit and the package substrate 302. For a silicon interposer, a TSV (Through Silicon Via) can also be used as the through electrode.

A silicon interposer is preferably used as the interposer 301. The silicon interposer can be manufactured at lower cost than an integrated circuit because the silicon interposer does not need to be provided with an active element. Since the wirings of the silicon interposer can be formed through a semiconductor process, formation of minute wirings that is difficult on a resin interposer is easy.

In order to achieve a wide memory bandwidth, many wirings need to be connected to an HBM. Therefore, minute wirings are required to be formed densely on an interposer on which an HBM is mounted. For this reason, it is preferable that a silicon interposer be used as the interposer on which an HBM is mounted.

In an MCM using a silicon interposer, decrease in reliability due to a difference in expansion coefficient between an integrated circuit and the interposer does not easily occur. Furthermore, the surface of a silicon interposer has high planarity, so that a poor connection between the silicon interposer and an integrated circuit provided thereon does not easily occur. It is particularly preferable to use a silicon interposer for a 2.5D package (2.5D mounting) in which a plurality of integrated circuits are arranged side by side on an interposer.

Figure 29A:
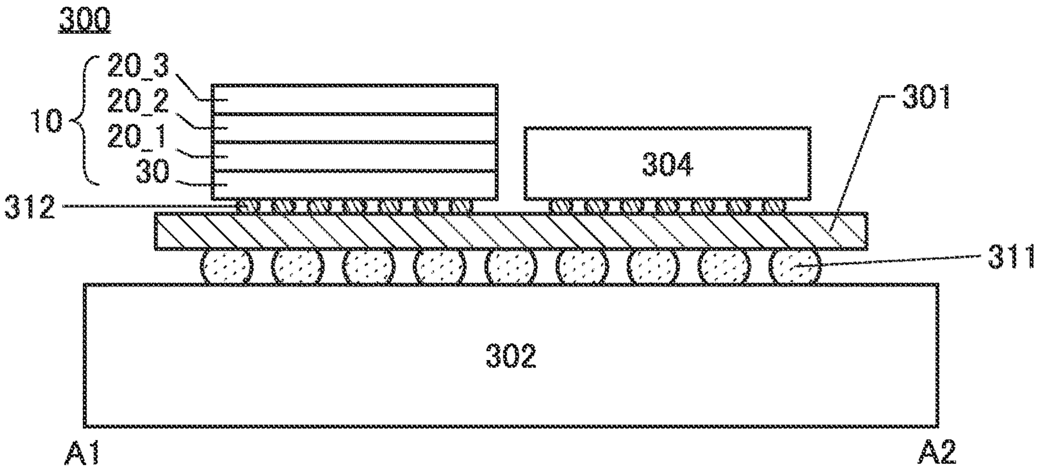
FIGS. 29A-29C Cross-sectional views each illustrating a structure example of a semiconductor device.
Figure 29B:
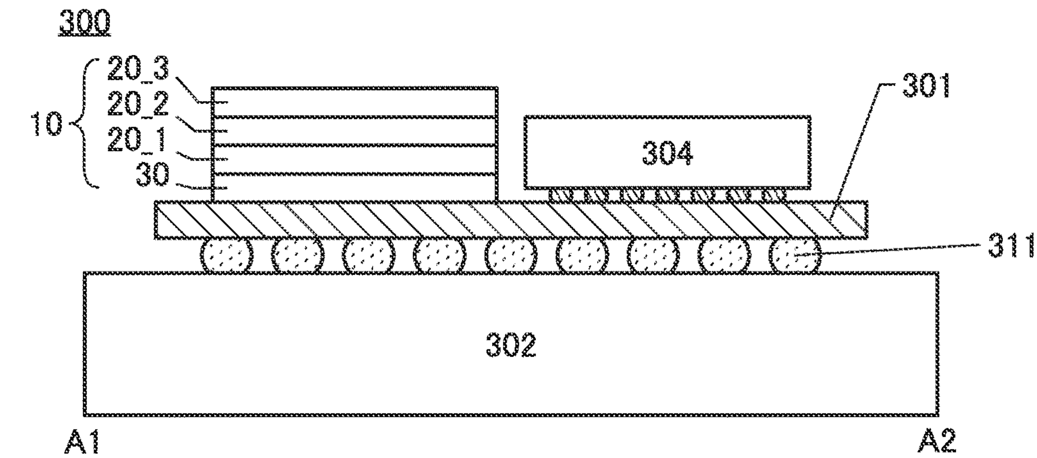
Figure 29C:
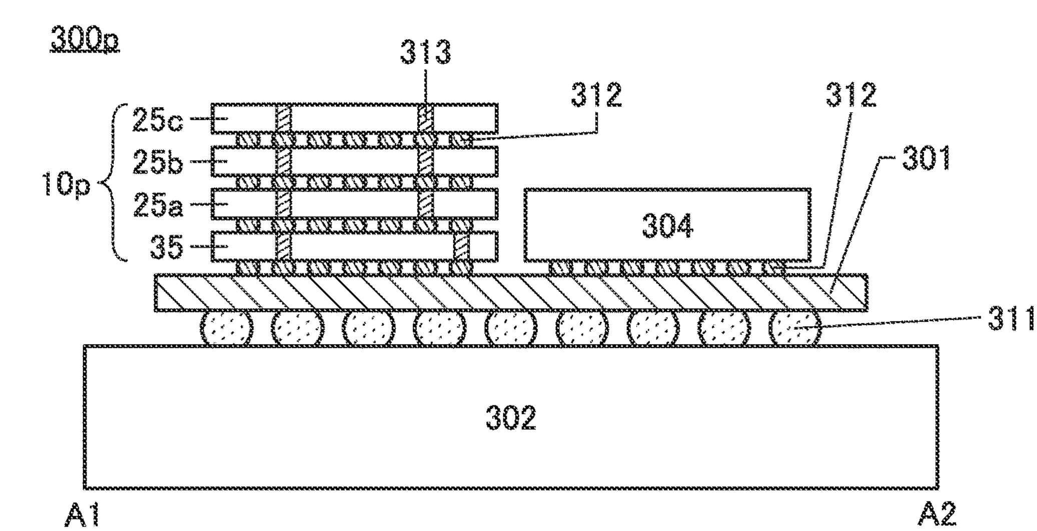

FIGS. 29(A) to 29(C) are cross-sectional views along the dashed-dotted line A1-A2 shown in FIG. 28(B). FIGS. 29(A) and 29(B) are cross-sectional views of the semiconductor device 300 using the semiconductor device 10 of one embodiment of the present invention.

First, a semiconductor device 300*p* of a conventional example will be described. FIG. 29(C) is a cross-sectional view for illustrating the semiconductor device 300*p* of the conventional example. The semiconductor device 300*p* includes the CPU 303 (not illustrated in FIG. 29(C)), the GPU 304, and a semiconductor device 10*p*. The semiconductor device 10*p* corresponds to the semiconductor device 10.

In FIG. 29(C), the interposer 301 is provided over the package substrate 302 with a plurality of bumps 311 therebetween. The CPU 303 (not illustrated in FIG. 29(C)), the GPU 304, and the semiconductor device 10*p* are provided over the interposer 301 with different bumps 312 therebetween. Note that the bump 312 is smaller than the bump 311. The bump 311 and the bump 312 are formed using a conductive material containing gold (Au), nickel (Ni), indium (In), tin (Sn), or the like. For example, solder may be used for the bumps.

The semiconductor device 10*p* includes a semiconductor device 25*a*, a semiconductor device 25*b*, a semiconductor device 25*c*, and a semiconductor device 35. The semiconductor device 25*a*, the semiconductor device 25*b*, and the semiconductor device 25*c* each include a cell array, and the semiconductor device 35 includes a logic circuit or the like for controlling the semiconductor device 25*a*, the semiconductor device 25*b*, and the semiconductor device 25*c*. The semiconductor device 25*a*, the semiconductor device 25*b*, the semiconductor device 25*c*, and the semiconductor device 35 are each formed using a silicon substrate.

The semiconductor device 25*a* is provided so as to overlap with the semiconductor device 35 with a plurality of bumps therebetween. The semiconductor device 25*b* is provided so as to overlap with the semiconductor device 25*a* with a plurality of bumps therebetween. The semiconductor device 25*c* is provided so as to overlap with the semiconductor device 25*b* with a plurality of bumps therebetween. The semiconductor device 25*a*, the semiconductor device 25*b*, the semiconductor device 25*c*, and the semiconductor device 35 are each provided with TSVs 313. The semiconductor device 25*a*, the semiconductor device 25*b*, and the semiconductor device 25*c* are electrically connected to the semiconductor device 35 through the TSVs 313 and the bumps 312. The semiconductor device 35 is electrically connected to the interposer 301 through the TSVs 313 and the bumps 312.

The semiconductor device 10*p* easily has a large thickness because the semiconductor device 25*a*, the semiconductor device 25*b*, the semiconductor device 25*c*, and the semiconductor device 35 are stacked and separated by the bumps 312. That is, the semiconductor device 300*p* is difficult to be reduced in thickness. Since many TSVs 313 need to be used, an increase in manufacturing cost and a decrease in yield, and the like are easily caused.

Next, the semiconductor device 300 using the semiconductor device 10 of one embodiment of the present invention will be described. The semiconductor device 300 is different from the semiconductor device 300*p* in that the semiconductor device 10 is used instead of the semiconductor device 10*p*. The semiconductor device 10 includes a layer 201, a layer 202, a layer 203, and the layer 30. The layer 201, the layer 20_2, and the layer 203 each include a cell array, and the layer 30 includes a logic circuit or the like for controlling the layer 201, the layer 20_2, and the layer 203. As the layer 30, the semiconductor substrate described in the above embodiment can be used. Note that the semiconductor device 10 is described in the above embodiment; thus, a detailed description thereof is omitted in this embodiment.

FIG. 29(A) illustrates an example of the semiconductor device 10 in which the layer 30 is formed using a silicon substrate. The layer 20_1 is provided over the layer 30, the layer 20_2 is provided over the layer 201, and the layer 20_3 is provided over the layer 20_2. The layer 201, the layer 202, and the layer 20_3 are each formed using a thin film process. Therefore, no space is formed between the layer 30 and the layer 20_1, between the layer 20_1 and the layer 20_2, and between the layer 20_2 and the layer 203, resulting in a reduction in the thickness of the semiconductor device 10. That is, the semiconductor device 300 can be made thin easily. As to the layer 20_1, the layer 20_2, and the layer 203, the TSVs 313 and the bump 312 do not need to be provided, which can reduce manufacturing cost and increase a manufacturing yield. Furthermore, in contrast to the semiconductor device 10*p*, the semiconductor device 10 can eliminate or reduce the use of a silicon substrate; thus, the semiconductor device 10 can be manufactured at lower cost than the semiconductor device 10*p*.

FIG. 29(B) illustrates an example of the semiconductor device 10 in which the layer 30 is also formed using a thin film process like the layer 201, the layer 20_2, and the layer 20_3. In the semiconductor device 10 illustrated in FIG. 29(B), the layer 30 is directly formed on the insulator 301; thus, it is possible to omit the bumps 312 that are provided between the layer 30 and the interposer 301 in FIG. 29(A). Thus, the thickness can be further reduced compared with the semiconductor device 300 illustrated in FIG. 29(A), and a reduction in manufacturing cost and an increase in manufacturing yield can be achieved.

Figure 30A:
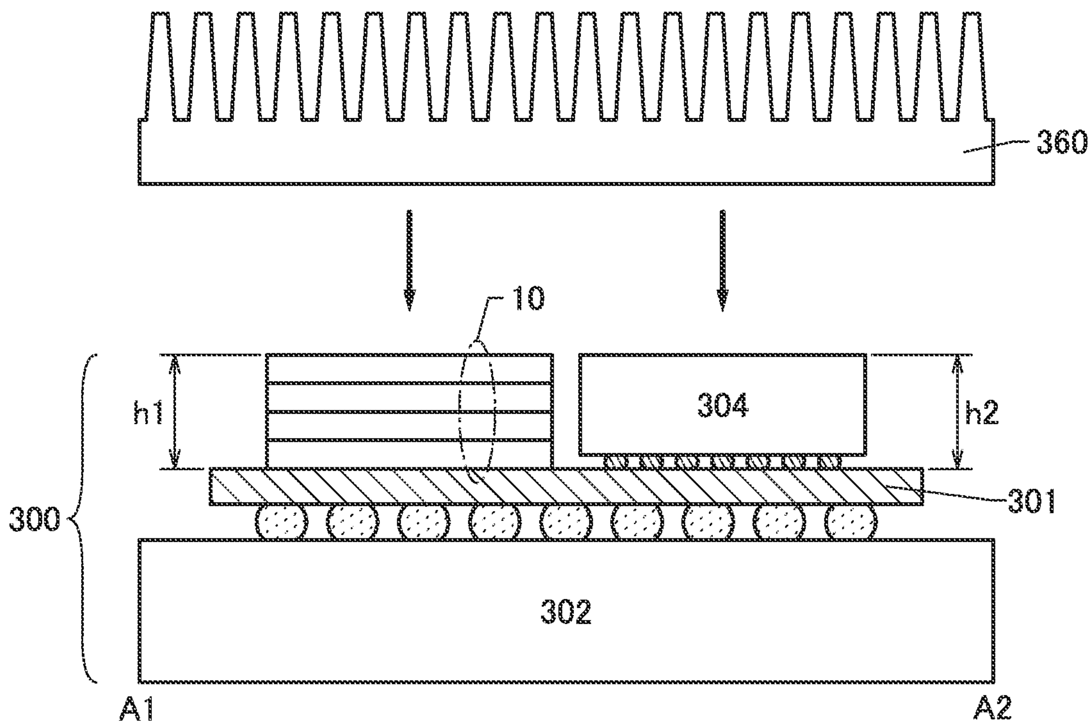
FIGS. 30A-30B Cross-sectional views each illustrating a structure example of a semiconductor device.
Figure 30B:
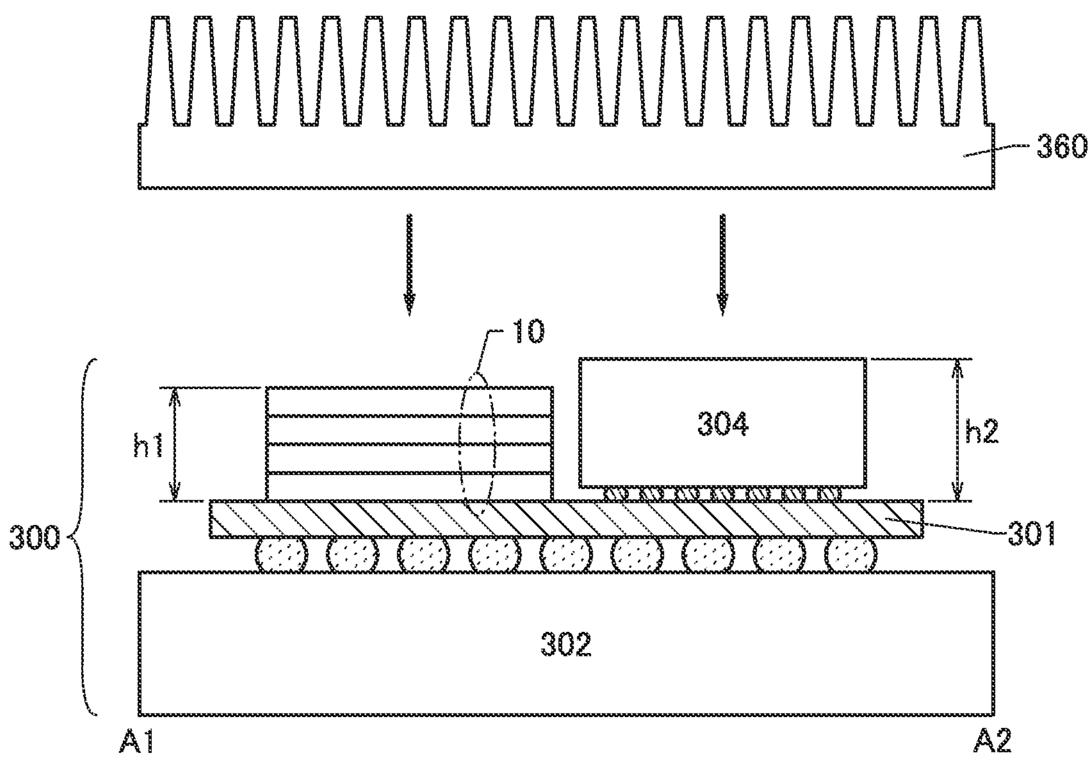

FIGS. 30(A) and 30(B) are cross-sectional views along the dashed-dotted line A1-A2 shown in FIG. 28(B).

In the case where a heat sink 360 is provided over the semiconductor device 300, the integrated circuits provided over the interposer are preferably level with one another as illustrated in FIG. 30(A). Specifically, it is preferable that height h1 of the semiconductor device 10 over the interposer and height h2 of the GPU 304 and the CPU 303 (not illustrated in FIG. 30(A)) over the interposer be substantially equal to each other. When the integrated circuits provided over the interposer are level with each other, all the integrated circuits can be reliably in contact with the heat sink 360.

A transistor using an oxide semiconductor, which is a kind of metal oxide, for a semiconductor layer where a channel is formed (also referred to as an “OS transistor”) can operate stably because an increase in operating temperature is unlikely to increase an off-state current. Thus, in the case where the semiconductor device 10 is formed with OS transistors, the height of the semiconductor device 10 may be smaller than that of the GPU 304 (and the CPU 303, not illustrated in FIG. 30(B)). Specifically, the h1 may be smaller than the h2. The use of OS transistors can increase the design flexibility of the semiconductor device 300. When the integrated circuit is formed with an OS transistor, the heat sink 360 can be omitted.

Figure 31A:
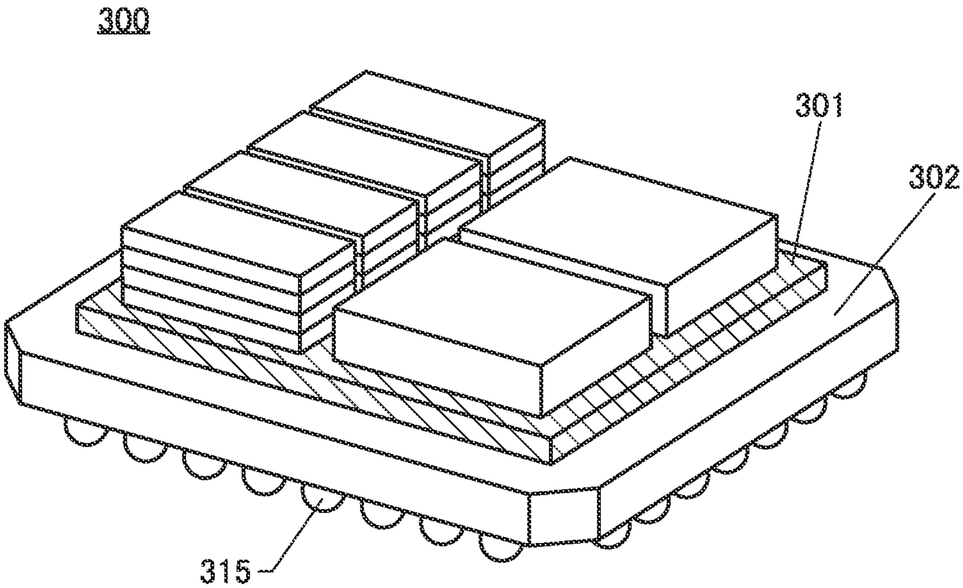
FIGS. 31A-31B Perspective views each illustrating a structure example of a semiconductor device.
Figure 31B:
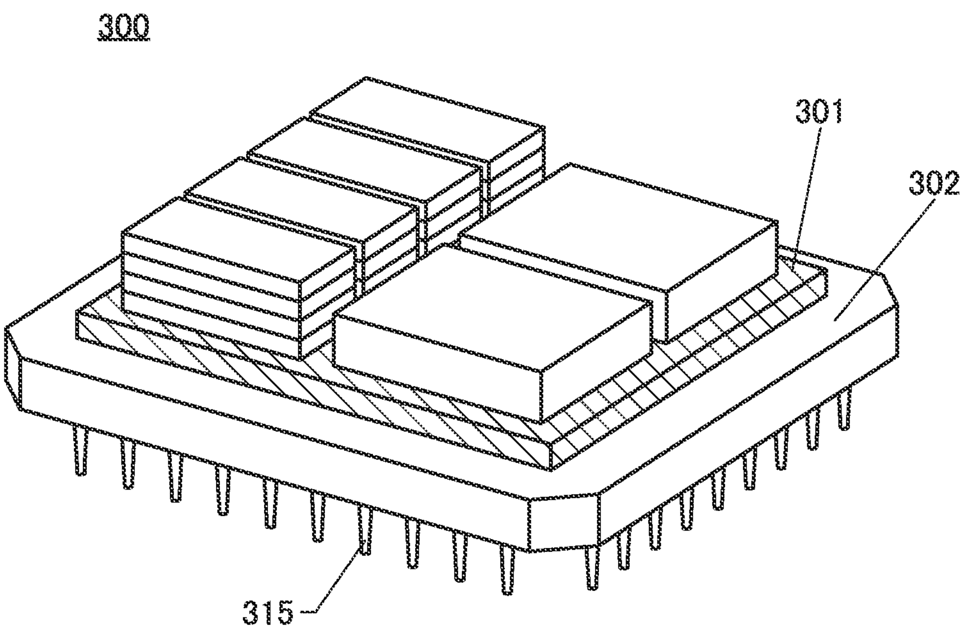

To mount the semiconductor device 300 on another substrate, an electrode 315 may be provided on the bottom portion of the package substrate 302. FIG. 31(A) illustrates an example in which the electrode 315 is formed of a solder ball. Solder balls are provided in a matrix on the bottom portion of the package substrate 302, whereby BGA (Ball Grid Array) mounting can be achieved. FIG. 31(B) illustrates an example in which the electrode 315 is formed of a conductive pin. Conductive pins are provided in a matrix on the bottom portion of the package substrate 302, whereby PGA (Pin Grid Array) mounting can be achieved.

The semiconductor device 300 can be mounted on another substrate by various mounting methods not limited to BGA and PGA. For example, mounting methods such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined with the descriptions of the other embodiments as appropriate.

Embodiment 5

In this embodiment, examples of electronic devices including the semiconductor device and/or the electronic component described in the above embodiment will be described.

The semiconductor device and the electronic component of one embodiment of the present invention can be included in a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine.

The electronic device of one embodiment of the present invention may include an antenna. When a signal is received by the antenna, the electronic device can display video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 32 and FIG. 33 illustrate examples of electronic devices.

Figure 32A:
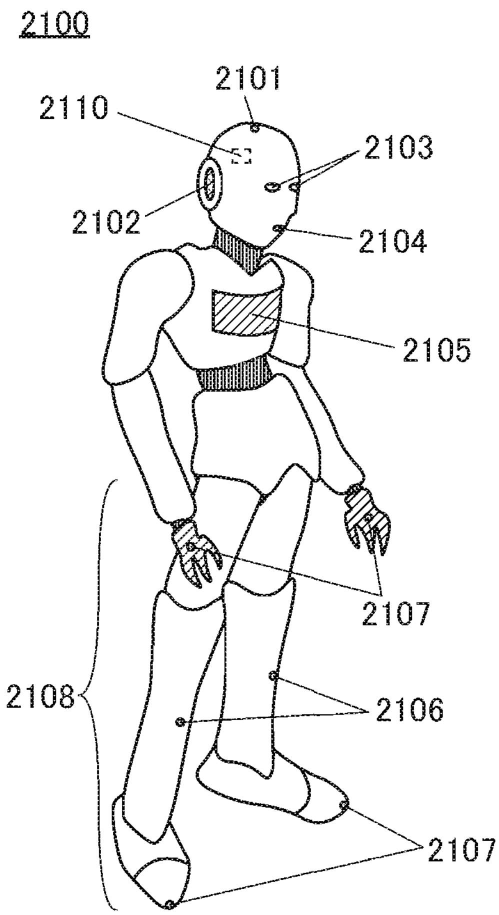
FIGS. 32A-32C Diagrams each illustrating a structure example of an electronic device.

A robot 2100 illustrated in FIG. 32(A) includes an arithmetic device 2110, an illuminance sensor 2101, a microphone 2102, an upper camera 2103, a speaker 2104, a display 2105, a lower camera 2106, an obstacle sensor 2107, and a moving mechanism 2108. Here, a humanoid robot is illustrated as an example.

In the robot 2100, the above semiconductor device and/or the above electronic component can be used for the arithmetic device 2110, the illuminance sensor 2101, the upper camera 2103, the lower camera 2106, the obstacle sensor 2107, and the like.

The microphone 2102 has a function of detecting a speaking voice of a user, an environmental sound, and the like. The speaker 2104 has a function of outputting sound. The robot 2100 can interact with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of capturing an image of the surroundings of the robot 2100. The obstacle sensor 2107 can detect an obstacle in the direction where the robot 2100 walks forward with two legs. The robot 2100 can move safely by recognizing an ambient environment with the upper camera 2103, the lower camera 2106, and the obstacle sensor 2107.

Figure 32B:
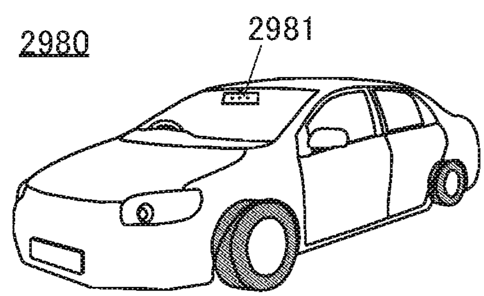

FIG. 32(B) is an external view illustrating an example of an automobile. An automobile 2980 includes a camera 2981 and the like. The automobile 2980 also includes various sensors and the like such as an infrared radar, a millimeter wave radar, and a laser radar. The automobile 2980 can analyze an image shot by the camera 2981 to determine traffic condition therearound, such as the presence of a pedestrian, and thus can perform automatic driving.

In the automobile 2980, the above semiconductor device and/or the above electronic component can be used for the camera 2981.

Figure 32C:
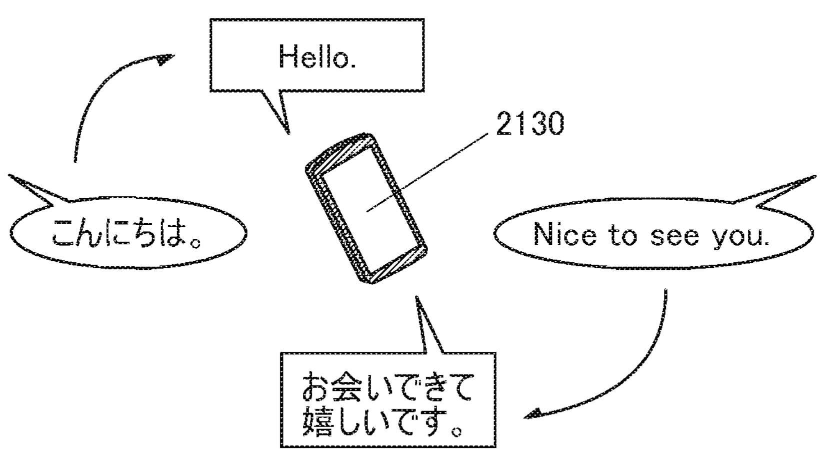

FIG. 32(C) illustrates a situation where a portable electronic device 2130 performs simultaneous interpretation in communication between people who speak different languages.

The portable electronic device 2130 includes a microphone, a speaker, and the like and has a function of recognizing user's speaking voice and translating it into a language spoken by a collocutor. The above semiconductor device and/or the above electronic component can be used for an arithmetic device of the portable electronic device 2130.

Figure 33A:
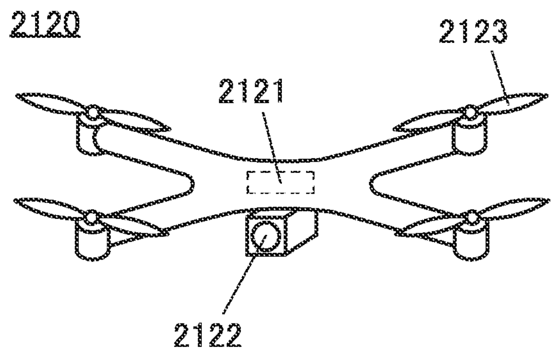
Figure 33A:
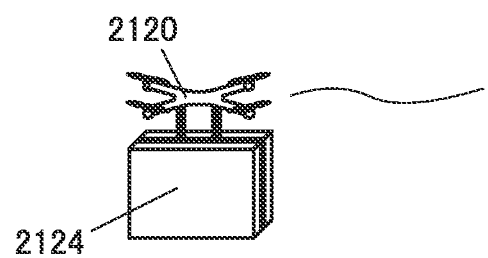
Figure 33A:
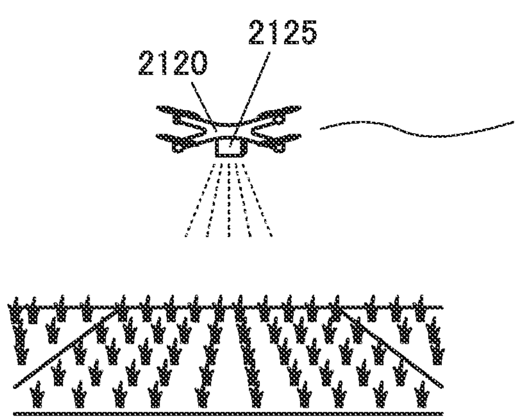

FIG. 33(A) is an external view illustrating a flying object 2120. The flying object 2120 includes an arithmetic device 2121, a propeller 2123, and a camera 2122 and has a function of flying autonomously.

In the flying object 2120, the above semiconductor device and/or the above electronic component can be used for the arithmetic device 2121 and the camera 2122.

FIGS. 33(B-1) and 33(B-2) illustrate usage examples of the flying object 2120. As illustrated in FIG. 33(B-1), the flying object 2120 can be used for transportation of a load 2124. As illustrated in FIG. 33(B-2), a container 2125 filled with agricultural chemicals is loaded onto the flying object 2120 so that the flying object 2120 can be used for spraying of the agricultural chemicals.

This embodiment can be combined with descriptions of the other embodiments as appropriate.

REFERENCE NUMERALS

10: semiconductor device, 20: layer, 21: control circuit, 25*a*: semiconductor device, 25*b*: semiconductor device, 25*c*: semiconductor device, 30: layer, 35: semiconductor device, 40: layer, 41: light-receiving portion, 42: light, 43: driver circuit, 100: capacitor, 100*a*: capacitor, 100*b*: capacitor, 112: conductor, 120: conductor, 120*a*: conductor, 120*b*: conductor, 130: insulator, 130*a*: insulator, 130*b*: insulator, 150: insulator, 200: transistor, 200*a*: transistor, 200*b*: transistor, 203: conductor, 203*a*: conductor, 203*b*: conductor, 203*c*: conductor, 205: conductor, 205*a*: conductor, 205*b*: conductor, 205*c*: conductor, 210: insulator, 212: insulator, 214: insulator, 216: insulator, 220: insulator, 222: insulator, 224: insulator, 230: oxide, 230*a*: oxide, 230*b*: oxide, 230*c*: oxide, 230*ca*: oxide, 230*cb*: oxide, 231: region, 231*a*: region, 231*b*: region, 231*c*: region, 232: region, 232*a*: region, 232*b*: region, 232*c*: region, 232*d*: region, 234: region, 234*a*: region, 234*b*: region, 239: region, 240: conductor, 240*a*: conductor, 240*b*: conductor, 240*c*: conductor, 242: layer, 242*a*: layer, 242*b*: layer, 242*c*: layer, 250: insulator, 250*a*: insulator, 250*b*: insulator, 252: metal oxide, 252*a*: metal oxide, 252*b*: metal oxide, 260: conductor, 260*a*: conductor, 260*aa*: conductor, 260*ab*: conductor, 260*b*: conductor, 260*ba*: conductor, 260*bb*: conductor, 270: insulator, 270*a*: insulator, 270*b*: insulator, 271: insulator, 271*a*: insulator, 271*b*: insulator, 272: insulator, 273: insulator, 274: insulator, 275: insulator, 275*a*: insulator, 275*b*: insulator, 280: insulator, 282: insulator, 284: insulator

The invention claimed is:

1. A semiconductor device comprising:

a cell array comprising a first memory cell and a second memory cell;

a first driver circuit configured to supply a selection signal; and a second driver circuit configured to write or read out data, wherein the first memory cell comprises a first transistor and a first capacitor, wherein the second memory cell comprises a second transistor and a second capacitor, wherein one of a source and a drain of the first transistor is electrically connected to the first capacitor, wherein one of a source and a drain of the second transistor is electrically connected to the second capacitor, wherein each of the first transistor and the second transistor includes a first oxide semiconductor layer and a second oxide semiconductor layer over the first oxide semiconductor layer, wherein the first transistor includes at least a first channel formation region formed in the second oxide semiconductor layer, a third oxide semiconductor layer over the first channel formation region, a first gate electrode over the third oxide semiconductor layer, and a second gate electrode under the first channel formation region, and wherein the second transistor includes at least a second channel formation region formed in the second oxide semiconductor layer, a fourth oxide semiconductor layer over the second channel formation region, a third gate electrode over the fourth oxide semiconductor layer, and a fourth gate electrode under the second channel formation region.

2. The semiconductor device according to claim 1, wherein the second gate electrode includes a first conductor and a second conductor, wherein the second conductor is in contact with an inner wall of the first conductor, wherein the fourth gate electrode includes a third conductor and a fourth conductor, and wherein the fourth conductor is in contact with an inner wall of the third conductor.

3. The semiconductor device according to claim 1, further comprising a first wiring layer under the second gate electrode, and a second wiring layer under the fourth gate electrode, wherein the first wiring layer includes a fifth conductor and a sixth conductor, wherein the sixth conductor is in contact with an inner wall of the fifth conductor, wherein the second wiring layer includes a seventh conductor and an eighth conductor, and wherein the eighth conductor is in contact with an inner wall of the seventh conductor.

4. The semiconductor device according to claim 1, wherein the first driver circuit comprises a third transistor, and the second driver circuit comprises a fourth transistor, and wherein each of the third transistor and the fourth transistor includes a channel formation region formed of an oxide semiconductor layer.

5. The semiconductor device according to claim 1, wherein each of the first capacitor and the second capacitor includes an electrode, and wherein the electrode includes the second oxide semiconductor layer.

* * * * *